(12) United States Patent
Mueller et al.

(10) Patent No.: US 9,583,713 B2
(45) Date of Patent: Feb. 28, 2017

(54) INTERLAYER FOR ELECTRONIC DEVICES

(75) Inventors: David Christoph Mueller, Frankfurt am Main (DE); Pawel Miskiewicz, Cambridge, MA (US); Toby Cull, Newbury (GB); Piotr Wierzchowiec, Southampton (GB); Andrew Bell, Lakewood, OH (US); Edmund Elce, Lakewood, OH (US); Larry F. Rhodes, Silver Lake, OH (US); Kazuyoshi Fujita, Tokyo (JP); Hendra Ng, Highland Heights, OH (US); Pramod Kandanarachchi, Brecksville, OH (US); Steven Smith, Perrysburg, OH (US)

(73) Assignees: Merck Patent GmbH (DE); Promerus LLC, Brecksville, OH (US)

( * ) Notice: Subject to any disclaimer, the term of this patent is extended or adjusted under 35 U.S.C. 154(b) by 169 days.

(21) Appl. No.: 13/223,784

(22) Filed: Sep. 1, 2011

(65) Prior Publication Data

US 2012/0056249 A1 Mar. 8, 2012

Related U.S. Application Data

(60) Provisional application No. 61/379,795, filed on Sep. 3, 2010.

(30) Foreign Application Priority Data

Sep. 2, 2010 (EP) .................................... 10009119

(51) Int. Cl.
*B32B 27/32* (2006.01)
*C08F 132/08* (2006.01)
(Continued)

(52) U.S. Cl.
CPC ........ *H01L 51/0043* (2013.01); *C08F 232/00* (2013.01); *C08L 65/00* (2013.01);
(Continued)

(58) Field of Classification Search
USPC .................................. 257/288; 526/266, 268
See application file for complete search history.

(56) References Cited

U.S. PATENT DOCUMENTS 3,622,321 A 11/1971 Smets et al.
4,565,873 A 1/1986 Lohmann et al.
(Continued)

FOREIGN PATENT DOCUMENTS

CN 101044185 9/2007
CN 101044185 A 9/2007
(Continued)

OTHER PUBLICATIONS

Alloway, D.M., et al., "Tuning the Effective Work Function of Gold and Silver Using ω-Functionalized Alkanethiols: Varying Surface Composition through Dilution and Choice of Terminal Groups," J. Phys. Chem. C (2009), vol. 113, pp. 20328-20334.
(Continued)

*Primary Examiner* — Peter D Mulcahy
*Assistant Examiner* — Henry Hu
(74) *Attorney, Agent, or Firm* — Drinker Biddle & Reath LLP

(57) ABSTRACT

Embodiments in accordance with the present invention provide for the use of polycycloolefins in electronic devices and more specifically to the use of such polycycloolefins as interlayers applied to fluoropolymer layers used in the fabrication of electronic devices, the electronic devices that encompass such polycycloolefin interlayers and processes for preparing such polycycloolefin interlayers and electronic devices.

32 Claims, 4 Drawing Sheets

(51) Int. Cl.
*H01L 51/00* (2006.01)
*C08L 65/00* (2006.01)
*C08F 232/00* (2006.01)
*H01L 51/05* (2006.01)

(52) U.S. Cl.
CPC ...... *H01L 51/0035* (2013.01); *C08L 2203/20* (2013.01); *H01L 51/0529* (2013.01); *H01L 51/0541* (2013.01); *H01L 51/0545* (2013.01); *Y10T 428/31938* (2015.04)

(56) References Cited

U.S. PATENT DOCUMENTS

| | | | |
|---|---|---|---|
| 5,468,819 | A | 11/1995 | Goodall et al. |
| 5,789,757 | A | 8/1998 | Husson, Jr. et al. |
| 5,861,235 | A | 1/1999 | Harkness et al. |
| 6,538,087 | B2 | 3/2003 | Zhao et al. |
| 6,690,029 | B1 | 2/2004 | Anthony et al. |
| 6,890,847 | B1 | 5/2005 | Farrar |
| 6,946,676 | B2 * | 9/2005 | Kelley ............... H01L 51/0545 257/40 |
| 7,029,945 | B2 | 4/2006 | Veres et al. |
| 7,385,221 | B1 | 6/2008 | Anthony et al. |
| 8,637,343 | B2 * | 1/2014 | Mueller ............ H01L 51/0021 257/40 |
| 2005/0186502 | A1 * | 8/2005 | Elce et al. ................. 430/270.1 |
| 2005/0192409 | A1 * | 9/2005 | Rhodes et al. ............ 525/326.7 |
| 2006/0020068 | A1 * | 1/2006 | Elce et al. .................... 524/356 |
| 2007/0066775 | A1 | 3/2007 | Rhodes et al. |
| 2008/0090176 | A1 * | 4/2008 | Kusunoki ......... C08G 59/3218 430/280.1 |
| 2008/0160405 | A1 | 7/2008 | Yang et al. |
| 2008/0194740 | A1 * | 8/2008 | Elce et al. ..................... 524/82 |
| 2008/0237583 | A1 | 10/2008 | Masuda |
| 2009/0057656 | A1 | 3/2009 | Matsubara et al. |
| 2010/0108999 | A1 * | 5/2010 | Mueller et al. ................. 257/40 |
| 2011/0018061 | A1 | 1/2011 | Noh et al. |
| 2012/0056183 | A1 | 3/2012 | Mueller et al. |

FOREIGN PATENT DOCUMENTS

| | | |
|---|---|---|
| CN | 101622289 | 1/2010 |
| CN | 101669225 A | 3/2010 |
| EP | 1687830 | 8/2006 |
| JP | 2005-509298 A | 4/2005 |
| WO | WO-03/052841 A1 | 6/2003 |
| WO | WO-2005/055248 A2 * | 6/2005 |
| WO | WO-2005/055248 A2 | 6/2005 |
| WO | WO-2005/076076 A2 | 8/2005 |
| WO | WO-2005/081306 A1 | 9/2005 |
| WO | 2006/043617 A1 | 4/2006 |

OTHER PUBLICATIONS

Marmont, P., et al., "Improving charge injection in organic thin-film transistors with thiol-based self-assembled monolayers," Organic Electronics (2008), vol. 9, pp. 419-424.

Wu, K., et al., "Continuous Modulation of Electrode Work Function with Mixed Self-Assembled Monolayers and Its Effect in Charge Injection," Langmuir (2009), vol. 25, No. 11, pp. 6232-6238.

European Search Report for EP 13004589, dated Oct. 21, 2013.

Grove, N. R. et al., "Funtionalized Polynorbornene Dieelectric Polymers: Adhesion and Mechanical Properties", Journal of Polymer Science Part B: Polymer Physics, vol. 37, (1999), pp. 3003-3010.

International Search Report of corresponding PCT Application No. PCT/EP2011/004281 dated Dec. 21, 2011.

Chinese Examination Procedure from corresponding foreign application No. 201180042209.9 dated Aug. 27, 2014.

English Translation of Chinese Office Action for application No. 201510255678.9, dated Aug. 1, 2016.

* cited by examiner

US 9,583,713 B2

INTERLAYER FOR ELECTRONIC DEVICES

CROSS-REFERENCE TO RELATED APPLICATIONS

This application claims benefit (under 35 USC 119(e)) of European Application No. 10009119.8, filed Sep. 2, 2010 and U.S. Provisional Application 61/379,795, filed Sep. 3, 2010 which is incorporated by reference.

TECHNICAL FIELD

The invention relates generally to the use of polycycloolefins in electronic devices and more specifically to the use of norbornene-type polymers as interlayers applied to fluoropolymer layers used in the fabrication of electronic devices, the electronic devices that encompass norbornene-type polymer interlayers and processes for preparing such interlayers and electronic devices made encompassing such interlayers.

BACKGROUND

Electronic devices, for example field effect transistors (FETs) are used in display devices and logic capable circuits. A conventional FET typically includes source, drain and gate electrodes, a semiconducting layer made of a semiconductor (SC) material, and an insulator layer (also referred to as "dielectric" or "gate dielectric"), made of a dielectric material and positioned between the SC layer and the gate electrode. The semiconductor is for example an organic semiconductor (OSC), and the electronic device is for example an organic electronic (OE) device.

U.S. Pat. No. 7,029,945 B2 discloses embodiments of an organic field effect transistor (OFET) wherein the gate insulator layer is made of a dielectric material having a permittivity (∈) (also known as relative permittivity or dielectric constant (k)) of less than 3.0. Such materials, generally referred as "low k materials", are reported to provide good mobility regardless of whether or not the organic semiconductor layer is disordered or semi-ordered. U.S. Pat. No. 7,029,945 B2 further reports that commercially available fluoropolymers such as Cytop™ (from Asahi Glass) or Teflon AF™ (from DuPont) are exemplary low k materials.

In WO 05/055248 the use of Cytop as gate insulator materials is disclosed as being advantageous for solution processed OFET devices where the OSC material is selected from soluble, substituted oligoacenes, such as pentacene, tetracene or anthracene, or heterocyclic derivatives thereof. These OSC materials are soluble in most common organic solvents. Therefore, when preparing a top gate FET, the solvents for the gate dielectric formulation have to be carefully chosen to avoid dissolution of the OSC material by the solvent of the gate dielectric formulation when deposited in adjacent layers. Such a solvent is generally referred to as being orthogonal to the material of the OSC layer. Similarly, when preparing a bottom gate device, the solvent for carrying the OSC material onto a previously formed gate dielectric layer is selected to be orthogonal to the gate dielectric material.

However, the above-mentioned fluoropolymers have certain drawbacks with regard to the mass production of OFET devices, specifically poor integration into processing and limited structural integrity. Regarding processability, fluoropolymers often do not adhere well to other layers, for example the substrate and OSC layer, among others, and often exhibits poor wettability. Regarding structural integrity, many fluoropolymers, such as those of the Cytop™ series, have low glass transition temperatures $T_g$ (~100-130° C.) which can be problematic when applying a metallized gate electrode layer over such a layer by a physical deposition method such as sputtering. If the fluoropolymer is heated to or above its $T_g$ during such a sputtering process, cracking of the polymer due to built-in stress can occur and where such cracking is avoided, differential expansion between the fluoropolymer and any adjacent layer can result in wrinkling of the polymer. On the other hand, fluoropolymers with higher $T_g$, like those of the Teflon AF™ series (e.g. Teflon AF 2400 with $T_g$=240° C.), may overcome the wrinkling or cracking problems, but often do not coat substrates well and exhibit poor adhesion to additional layers.

BRIEF DESCRIPTION OF THE DRAWINGS

Embodiments of the invention are described below with reference to the following drawings.

DETAILED DESCRIPTION

Figure 1:
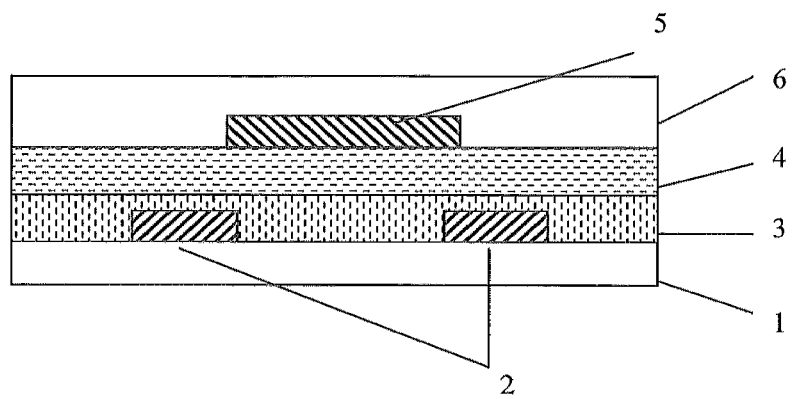
FIG. 1 is a schematic representation of a typical top gate FET device according to prior art.

Embodiments in accordance with the present invention are directed to the use of polycycloolefinic polymers such as norbornene-type polymers to form an interlayer that is in contact with a layer of an organic dielectric material, for example a fluoropolymer used as a gate dielectric layer in Field Effect Transistors (FETs), having an inorganic semiconductor material, and Organic Field Effect Transistors (OFETs), having an organic semiconductor layer. Advantageously, such norbornene-type polymers are tailorable to overcome the drawbacks, such as poor adhesion and wrinkling, that have been observed in previously known devices. Thus such embodiments can allow for time-, cost- and material-effective production of OFETs, employing organic semiconductor materials and organic dielectric materials, as well as FETs employing inorganic semiconductor materials and organic dielectric materials, on a large scale. Further, as will be discussed, such norbornene-type polymer embodiments can, in combination with the organic dielectric layer, provide improved surface energy, adhesion and structural integrity of such combined layers in comparison with organic dielectric layers, taken alone, that have been employed in such OFETs and FETs.

Advantageously, some embodiments in accordance with the present invention are directed to the methods of using such norbornene-type polymers in the fabrication of electronic devices and some embodiments are directed to electronic and optoelectronic constructs.

As used herein, the terms FETs and OFETs will be understood to be inclusive of the subclass of such devices known as Thin Film Transistors (TFTs) and Organic Thin Film Transistors (OTFTs) where a FET or TFT described herein is inclusive of an organic dielectric material and an OFET or OTFT is inclusive of both an organic semiconductor material and the aforementioned organic dielectric material.

As used herein, the term "interlayer" will be understood to mean a layer in an electronic or organic electronic device which is provided between two other layers or components of the device, for example between a dielectric layer such as the gate dielectric, and an electrode layer such as the gate electrode.

In addition, it will be understood that the terms "dielectric" and "insulating" are used interchangeably herein. Thus reference to an insulating layer is inclusive of a dielectric layer. Further, as used herein, the term "organic electronic device" will be understood to be inclusive of the term "organic semiconductor device" and the several specific implementations of such devices such as the FETs and OFETs as defined above.

As used herein, the phrase "photoreactive and/or crosslinkable", when used to describe certain pendent groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and terpolymer. Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means a polymer and one or more other materials that are added to the polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, adhesion promoters, leveling agents and adhesion promoters. Further, it will be understood that a polymer composition may, in addition to the aforementioned exemplary materials, also encompass a blend of two or more polymers.

As defined herein, the terms "polycycloolefin" and "norbornene-type" are used interchangeably and refer to addition polymerizable monomers, or the resulting repeating unit, encompassing at least one norbornene moiety such as shown by either Structure A1 or A2, below. The simplest norbornene-type or polycycloolefin monomer bicyclo[2.2.1]hept-2-ene (A1) is commonly referred to as norbornene.

A1

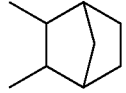

A2

However, the term norbornene-type monomer or repeating unit, as used herein, is understood to not only mean norbornene itself but also to refer to any substituted norbornene, or substituted and unsubstituted higher cyclic derivatives thereof, for example where m of Structures B1 and B2, shown below, where m is greater than zero.

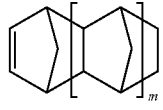

B1

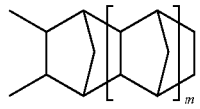

B2

By the substitution of the norbornene with a pendent group, the polymer properties can be tailored to fulfill the needs of individual applications. The procedures and methods that have been developed to polymerize functionalized norbornenes exhibit an outstanding flexibility and tolerance to various moieties and groups attached to the norbornene ring. In addition to polymerization of monomers with specific pendent groups, monomers possessing different functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, I). The term perhalocarbyl refers to a hydrocarbyl group where each hydrogen has been replaced by a halogen. Non-limiting examples of hydrocarbyls, include, but are not limited to, a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include, but are not limited to, vinyl, butenyl and hexenyl. Representative alkynyl groups include, but are not limited to, ethynyl, 1-propynyl, 2-propynyl, 1 butynyl, and 2-butynyl. Representative cycloalkyl groups include, but are not limited to, cyclopentyl, cyclohexyl, and cyclooctyl substituents. Representative aryl groups include, but are not limited to, phenyl, biphenyl, naphthyl, and anthracenyl. Representative aralkyl groups include but are not limited to benzyl, phenethyl and phenbutyl.

The term halohydrocarbyl as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_zX_{2z+1}$ wherein X is independently a halogen or a hydrogen and z is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms hydrocarbyl, halohydrocarbyl, and perhalohydrocarbyl, are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls" that include, among others, groups such as ethers, epoxies, glycidyl ethers, alcohols, carboxylic acids, esters, maleimides, amines, imines, amides, phenols, amidophenols, silanes, siloxanes, phosphines, phosphine oxides, phosphinites, phosphonites, phosphites, phosphonates, phosphinates and phosphates.

Further exemplary hydrocarbyls, halohydrocarbyls, and perhalocarbyls, inclusive of heteroatoms, include, but are not limited to, $-(CH_2)_n-C(CF_3)_2-OH$, $-(CH_2)_n-C(CF_3)(CH_3)-OH$, $-(CH_2)_n-C(O)NHR^*$, $-(CH_2)_n-C(O)Cl$, $-(CH_2)_n-C(O)OR^*$, $-(CH_2)_n-OR^*$, $-(CH_2)_n-OC(O)R^*$ and $-(CH_2)_n-C(O)R^*$, where n independently represents an integer from 0 to 10 and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perhalogenated alkyl groups include, but are not limited to, trifluoromethyl, trichloromethyl, $-C_2F_5$, $-C_3F_7$, $-C_4F_9$, $-C_7F_{15}$, and $-C_{11}F_{23}$. Exemplary halogenated or perhalogenated aryl and aralkyl groups include, but are not limited groups having the formula $-(CH_2)_x-C_6F_yH_{5-y}$, and $-(CH_2)_x-C_6F_yH_{4-y}-pC_zF_qH_{2z+1-q}$, where x, y, q and z are independently selected integers from 0 to 5, 0 to 5, 0 to 9 and 1 to 4, respectively. Specifically, such exemplary perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

In some embodiments in accordance with the present invention, a polymer incorporates two or more distinct types of repeating units, where at least one such type of repeating unit encompasses pendent crosslinkable groups or moieties that have some degree of latency. By latency, it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing a pendent crosslinkable group, such as a maleimide containing pendant group, to the polymerization reaction mixture and causing the polymerization thereof.

Embodiments of the present invention encompass polymer compositions that can be a blend of a first polymer having one or more types of repeating units of Formula I, and a second polymer having one or more types of repeating units of Formula II. Such compositions can also encompass only the first polymer or the second polymer described above, or one or more polymers having one or more repeating units in accordance with each of Formulae I and II, or any combination thereof:

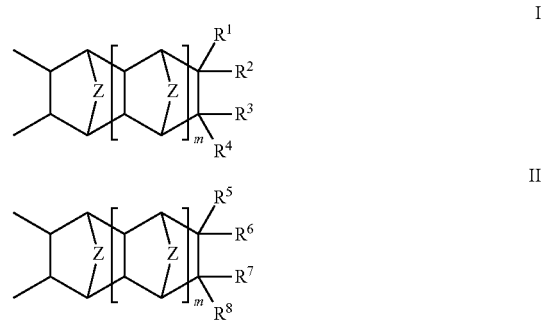

For each of the above formulae, Z is selected from $-CH_2-$, $-CH_2-CH_2-$ or $-O-$, m is an integer from 0 to 5, inclusive and each of $R^1$, $R^2$, $R^3$ and $R^4$ and $R^5$, $R^6$, $R^7$ and $R^8$ are independently selected from H, a $C_1$ to $C_{25}$ hydrocarbyl, a $C_1$ to $C_{25}$ halohydrocarbyl or a $C_1$ to $C_{25}$ perhalocarbyl group where such groups are as defined above and exemplified above and below, and with the proviso that the first polymer encompasses at least one type of repeating unit that is distinct from the one or more repeating units of the second polymer.

The repeating units of Formulae I and II are formed by corresponding norbornene-type monomers of Formula Ia and Ib, respectively, where Z, m, $R^{1-4}$, and $R^{5-8}$ are as defined above:

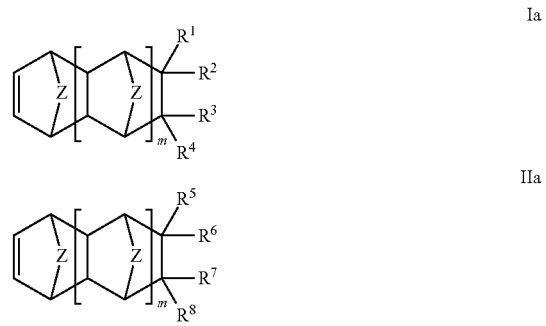

In some embodiments in accordance with the present invention, for the repeating units and monomers of Formula I, Ia, II and IIa, Z is $-CH_2-$ and m is 0, 1 or 2. In other embodiments, Z is $-CH_2-$ and m is 0 or 1 and in still other embodiments, Z is $-CH_2-$ and m is 0.

Further, for some embodiments only one of $R^{1-4}$ is different from H and only one of $R^{5-8}$ is different from H.

In order to produce the desired properties for specific applications, a combination of norbornene monomers with several different classes of pendent groups can be polymerized to obtain control over the flexibility, adhesion, interface and solubility of the resulting polymer(s). For example, varying the length of an alkyl group attached to the backbone can allow control of the polymer's modulus and glass transition temperature ($T_g$). Also, pendent groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy and influence the orthogonality of the solution with respect to other materials.

Thus, in some embodiments in accordance with the present invention, in particular for such embodiments where only one of $R^{1-4}$ is different from H and where only one of $R^{5-8}$ is different from H, one or more of $R^{1-4}$ or one or more of $R^{5-8}$ denote a halogenated or perhalogenated aryl or aralkyl group including, but not limited to those of the formula $-(CH_2)_x-C_6F_yH_{5-y}$, and $-(CH_2)_x-C_6F_yH_{4-y}-pC_zF_qH_{2z+1-q}$, where x, y, q, and z are independently selected integers from 0 to 5, 0 to 5, 0 to 9, and 1 to 4, respectively. Specifically such formulae include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

Further still, some embodiments in accordance with the present invention, in particular for such embodiments where only one of $R^{1-4}$ is different from H and where only one of $R^{5-8}$ is different from H, encompass a group that is different from H that is a polar group having a terminal hydroxy, carboxy or oligoethyleneoxy moiety, for example a terminal hydroxyalkyl, alkylcarbonyloxy (for example, acetyl), hydroxy-oligoethyleneoxy, alkyloxy-oligoethyleneoxy or alkylcarbonyloxy-oligoethyleneoxy moiety, where "oligoethyleneoxy" is understood to mean $-(CH_2CH_2O)_s-$ with s being 1, 2 or 3; for example 1-(bicyclo[2.2.1]hept-5-en-2-yl)-2,5,8,11-tetraoxadodecane (NBTODD) where s is 3 and 5-((2-(2-methoxyethoxy)ethoxy)methyl)bicyclo[2.2.1]hept-2-ene (NBTON) where s is 2.

Yet further still, for such embodiments where only one of $R^{1-4}$ is different from H and where only one of $R^{5-8}$ is different from H, such embodiments encompass a group that is either a photoreactive or a crosslinkable group. Further such groups encompass a linking portion L and a functional portion F. For example, L can appropriately encompass a $C_1-C_{12}$ alkyls, aralkyls, aryls or hetero atom analogs, while F can encompass one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

Exemplary repeating units of Formula I and II encompassing a pendant photoreactive or crosslinkable group such as described above are formed by one or more norbornene-type monomers that include, but not limited to, those selected from the following formulae:

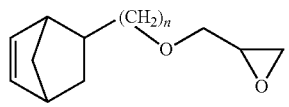

P1

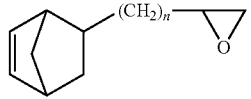

P2

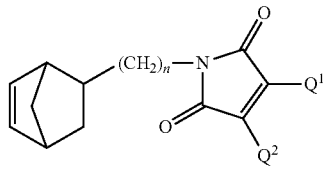

P3

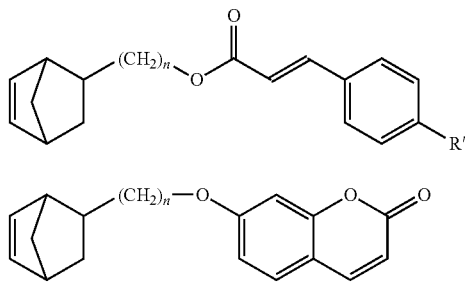

P4

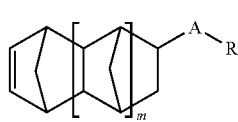

P5 where n is an integer from 1 to 8, $Q^1$ and $Q^2$ are each independently from one another —H or —CH$_3$, and R' is —H or —OCH$_3$.

Further exemplary repeating units of Formula I and II such as described above are derived from one or more norbornene-type monomers represented by the following structural formulae 1 through 9, below:

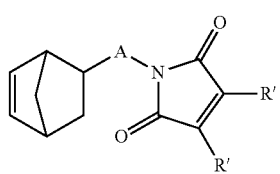

(1)

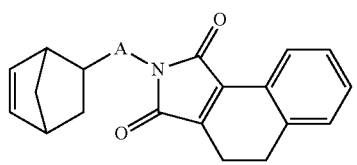

(2)

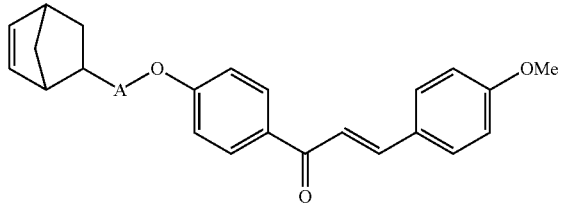

(3)

(4)

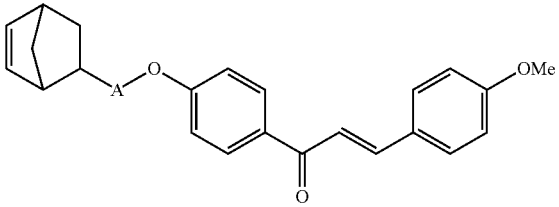

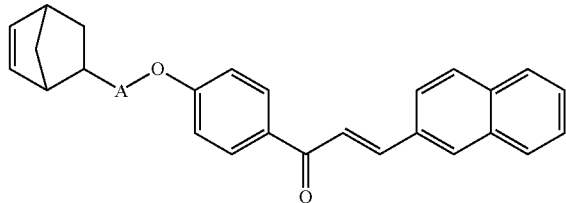
(5)

For structural formula 1 above, m is an integer from 0 to 3, -A-R is a pendent group having connecting, spacer or bridging group -A- selected from $(CZ_2)_n$, $(CH_2)_n$—(CH=CH)$_p$—$(CH_2)_n$, $(CH_2)_n$—O, $(CH_2)_n$—O—$(CH_2)_n$, $(CH_2)_n$—$C_6Q_4$-$(CH_2)_n$, and C(O)—O; and where the end group —R is selected from H, $CZ_3$, $(CZ_2)_nCZ_3$, OH, O—(O)$CCH_3$, $(CH_2CH_2O)_nCH_3$, $(CH_2)_n$—$C_6Q_5$, cinnamate or p-methoxy-cinnamate, coumarin, phenyl-3-indene, epoxide, CCSi$(C_2H_5)_3$ or CCSi$(i$-$C_3H_7)_3$, where each n is independently an integer from 0 to 12, p is an integer from 1-6, Q is independently H, F, $CH_3$, $CF_3$ or $OCH_3$, Z is independently H or F, and R' is independently H or $CH_3$. For structural formulae 2-5, -A- is as defined for formula 1.

The chemical names, and where available CAS numbers, of exemplary monomers in accordance with structural formulae 1-5 include, but are not limited to, 5-butylbicyclo[2.2.1]hept-2-ene (BuNB) CAS #22094-81-1, 5-hexylbicyclo[2.2.1]hept-2-ene (HexNB) CAS #22094-83-3, 5-octylbicyclo[2.2.1]hept-2-ene (OctNB) CAS#22094-84-4, 5-decylbicyclo[2.2.1]hept-2-ene (DecNB) CAS #22094-85-5, 5-(2-phenylethyl)bicyclo[2.2.1]hept-2-ene (PENB) CAS #29415-09-6, 1,2,3,4,4a,5,8,8a-octahydro-1,4:5,8-dimethanonaphthalene (TD) CAS #21635-90-5, bicyclo[2.2.1]hept-5-en-2-ylmethyl acetate (MeOAcNB) CAS #10471-24-6, 2-(bicyclo[2.2.1]hept-5-en-2-ylmethoxy)-ethylacetate (NBCH$_2$GlyOAc), 2-(bicyclo[2.2.1]hept-5-en-2-ylmethoxy)-ethanol (NBCH$_2$GlyOH) CAS #754231-21-5, 5-[[2-(2-methoxyethoxy)ethoxy]methyl]-bicyclo[2.2.1]hept-2-ene (NBTON) CAS #544716-19-0, 1-bicyclo[2.2.1]hept-5-en-2-yl-2,5,8,11-tetraoxadodecane (NBTODD) CAS #307923-40-6, 5-(perfluorobutyl)-bicyclo[2.2.1]hept-2-ene (NBC$_4$F$_9$) CAS #118777-97-2, 5-((perfluorophenyl)methyl)-bicyclo[2.2.1]hept-2-ene (NBMeC$_6$F$_5$) CAS #848781-71-5, 5-(perfluorophenyl)bicyclo[2.2.1]hept-2-ene (NBC$_6$F$_5$), 5-(3,4-difluorobenzyl)bicyclo[2.2.1]hept-2-ene (NBCH$_2$C$_6$H$_3$F$_2$), 5-(4-(trifluoromethyl)phenyl)bicyclo[2.2.1]hept-2-ene (NBCH$_2$C$_6$H$_4$CF$_3$), 2,2,3,3,3-pentafluoropropyl bicyclo[2.2.1]hept-5-ene-2-carboxylate (FPCNB) CAS #908372-02-1, 3,3,4,4,5,5,6,6,6-nonafluorohexyl bicyclo[2.2.1]hept-5-ene-2-carboxylate (FHCNB) CAS #944462-77-5,2,2,3,3,4,4,5,5.octa fluoropentyl-bicyclo[2.2.1]hept-5-ene-2-carboxylate (FOCHNB) CAS #99807-26-8, 2,2,3,3-tetrafluoropropyl-bicyclo[2.2.1]hept-5-ene-2-carboxylate (FPCHNB), bicyclo[2.2.1]hept-5-en-2-ylmethyl perfluorooctanoate (C$_8$PFAcNB) CAS #908372-04-3, 5-((1,1,2-trifluoro-2-(perfluoropropoxy)ethoxy)methyl)bicyclo[2.2.1]hept-2-ene (PPVENB), 2-(6-bicyclo[2.2.1]hept-5-en-2-ylhexyl)-oxirane (EONB) CAS #950896-95-4, 2-[(bicyclo[2.2.1]hept-5-en-2-ylmethoxy)methyl]-oxirane (MGENB) CAS #3188-75-8, (4-(bicyclo[2.2.1]hept-5-en-2-yl)but-1-yn-1-yl)triethylsilane (AkSiNB), ((4-(2-(bicyclo[2.2.1]hept-5-en-2-yl)ethyl)phenyl)ethynyl)triethylsilane (ArSiNB), (E)-1-(4-(bicyclo[2.2.1]hept-5-en-2-ylmethoxy)phenyl)-3-(4-methoxyphenyl)prop-2-en-1-one (MCHMNB), (E)-1-(4-(bicyclo[2.2.1]hept-5-en-2-ylmethoxy)phenyl)-3-(naphthalen-2-yl)prop-2-en-1-one (NPCHMMNB), 1-(bicyclo[2.2.1]hept-5-en-2-ylmethyl)-3,4-dimethyl-1H-pyrrole-2,5-dione (DMMIMeNB) CAS #1031898-89-1, 1-(2-(bicyclo[2.2.1]hept-5-en-2-yl)ethyl)-3,4-dimethyl-1H-pyrrole-2,5-dione (DMMIEtNB) CAS #1031898-91-5, 1-(4-(bicyclo[2.2.1]hept-5-en-2-yl)butyl)-3,4-dimethyl-1H-pyrrole-2,5-dione (DMMIBuNB), 1-(bicyclo[2.2.1]hept-5-en-2-ylmethyl)-3-methyl-1H-pyrrole-2,5-dione (MMIMeNB), 1-(bicyclo[2.2.1]hept-5-en-2-ylmethyl)-1H-pyrrole-2,5-dione (MIMeNB) CAS #442665-16-9, 1-(2-(bicyclo[2.2.1]hept-5-en-2-yl)ethyl)-1H-pyrrole-2,5-dione (MIEtNB), 1-(6-(bicyclo[2.2.1]hept-5-en-2-yl)hexyl)-3,4-dimethyl-1H-pyrrole-2,5-dione (DMMIHxNB), 1-(4-(2-(bicyclo[2.2.1]hept-5-en-2-yl)ethyl)phenyl)-3,4-dimethyl-1H-pyrrole-2,5-dione (EtPhDMMINB), 2-(bicyclo[2.2.1]hept-5-en-2-ylmethyl)-4,5-dihydro-1H-benzo[e]isoindole-1,3(2H)-dione (DHNMINB), (E)-bicyclo[2.2.1]hept-5-en-2-ylmethyl 3-(4-methoxyphenyl)acrylate (MeOCinnNB) CAS #1059706-16-8, bicyclo[2.2.1]hept-5-en-2-ylmethyl cinnamate (CinnNB) CAS #185827-76-3, (E)-2-(bicyclo[2.2.1]hept-5-en-2-yl)ethyl 3-(4-methoxyphenyl)acrylate (EtMeOCinnNB), 7-(bicyclo[2.2.1]hept-5-en-2-ylmethoxy)-2H-chromen-2-one (MeCoumNB) CAS #192633-28-6, 7-(2-(bicyclo[2.2.1]hept-5-en-2-yl)ethoxy)-2H-chromen-2-one (EtCoumNB), 7-(4-(bicyclo[2.2.1]hept-5-en-2-yl)butoxy)-2H-chromen-2-one (BuCoumNB), 2-(4-(2-(bicyclo[2.2.1]hept-5-en-2-yl)ethyl)phenyl)-1H-indene (EtPhIndNB), 2-(4-(bicyclo[2.2.1]hept-5-en-2-yl)phenyl)-1H-indene (PhIndNB). It will be noted that as an acronym has been provided for each of the above named chemicals, hereinafter where reference to any such chemicals is made, it will be made through use of a chemical's acronym.

Some of the chemical structures of norbornene-type monomers, from which exemplary repeating units of Formula I and II such as described above and below are derived, are shown in the following list:

NB 1

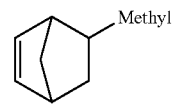

MeNB 2

-continued
| Structure | Name | Abbrev. | # |
|---|---|---|---|
| 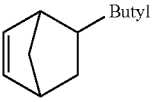 Butyl | BuNB | 3 |
| 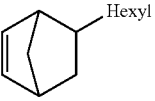 Hexyl | HexNB | 4 |
| 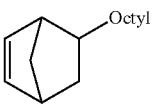 Octyl | OctNB | 5 |
| 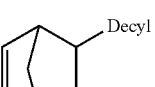 Decyl | DecNB | 6 |
| 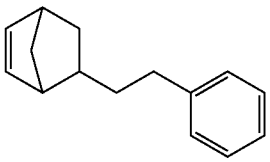 [SMILES: C1=CC2CC1CC2CCc1ccccc1] | PENB | 7 |
| 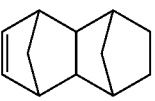 | TD | 8 |
| 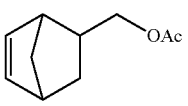 [SMILES: CC(=O)OCC1CC2C=CC1C2] OAc | MeOAcNB | 9 |
| 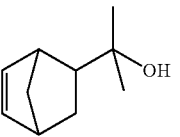 OH | NBXOH | 10 |
| 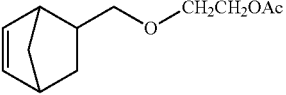 O—CH$_2$CH$_2$OAc | NBCH$_2$GlyOAc | 11 |
| 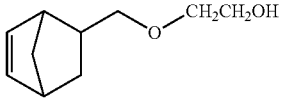 O—CH$_2$CH$_2$OH | NBCH$_2$GlyOH | 12 |
| 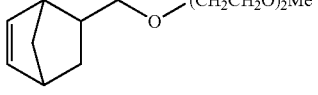 O—(CH$_2$CH$_2$O)$_2$Me | NBTON | 13 |
| 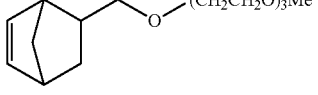 O—(CH$_2$CH$_2$O)$_3$Me | NBTODD | 14 |
| 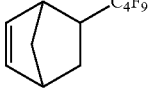 C$_4$F$_9$ | NBC$_4$F$_9$ | 15 |

-continued
| | | |
|---|---|---|
| 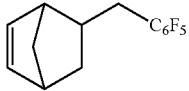 | NBCH₂C₆F₅ | 16 |
| 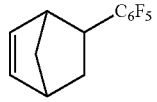 | NBC₆F₅ | 17 |
| 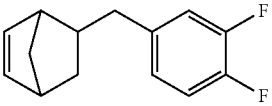 | NBCH₂C₆F₂ | 18 |
| 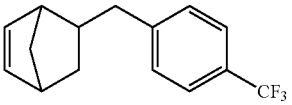 | NBCH₂C₆H₄CF₃ | 19 |
| 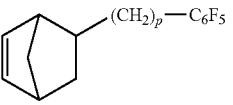 | NBalkylC₆F₅ | 20 |
| 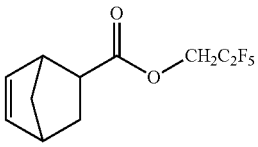 | FPCNB | 21 |
| 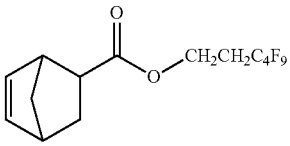 | FHCNB | 22 |
| 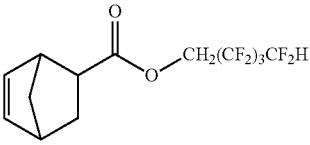 | FOCHNB | 23 |
| 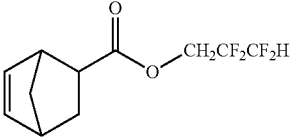 | FPCHNB | 24 |
| 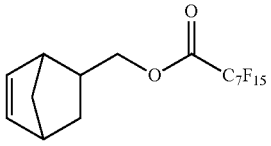 | C₈PFAcNB | 25 |
| 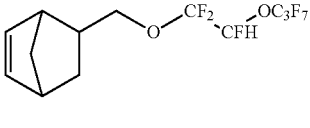 | PPVENB | 26 |
| 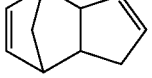 | DCPD | 27 |

-continued

| Structure | Name | # |
|---|---|---|
| norbornene-C₆H₁₂-epoxide | EONB | 28 |
| norbornene-CH₂-O-CH₂-epoxide | MGENB | 29 |
| norbornene-CH₂CH₂-C≡C-SiEt₃ | AkSiNB | 30 |
| norbornene-CH₂CH₂-C₆H₄-C≡C-SiEt₃ | ArSiNB | 31 |
| norbornene-CH₂-O-C₆H₄-C(O)-CH=CH-C₆H₄-OMe | MCHMNB | 32 |
| norbornene-CH₂-O-C₆H₄-C(O)-CH=CH-naphthyl | NPCHMNB | 33 |
| norbornene-CH₂-N(dimethylmaleimide) | DMMIMeNB | 34 |
| norbornene-CH₂CH₂-N(dimethylmaleimide) | DMMIEtNB | 35 |
| norbornene-CH₂CH₂CH₂-N(dimethylmaleimide) | DMMIPrNB | 36 |

-continued
| | | |
|---|---|---|
| 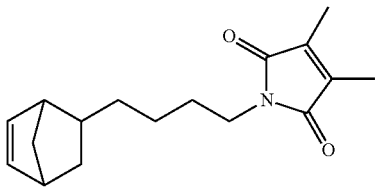 [SMILES: CC1=C(C)C(=O)N(CCCCC2CC3C=CC2C3)C1=O] | DMMIBuNB | 37 |
| 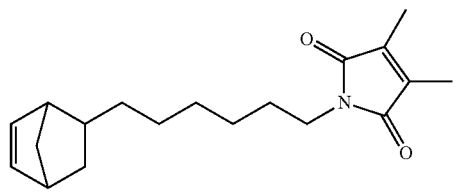 [SMILES: CC1=C(C)C(=O)N(CCCCCCC2CC3C=CC2C3)C1=O] | DMMIHxNB | 38 |
| 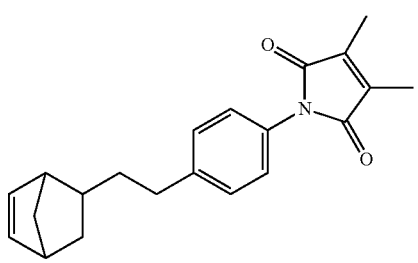 [SMILES: CC1=C(C)C(=O)N(c2ccc(CCC3CC4C=CC3C4)cc2)C1=O] | EtPhDMMINB | 39 |
| 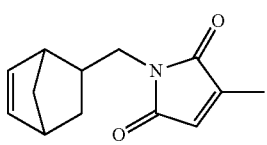 [SMILES: CC1=CC(=O)N(CC2CC3C=CC2C3)C1=O] | MMIMeNB | 40 |
| 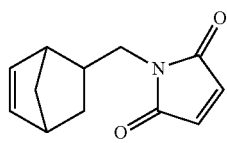 [SMILES: O=C1C=CC(=O)N1CC1CC2C=CC1C2] | MINB | 41 |
| 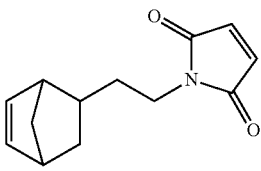 [SMILES: O=C1C=CC(=O)N1CCC1CC2C=CC1C2] | MIENB | 42 |
| 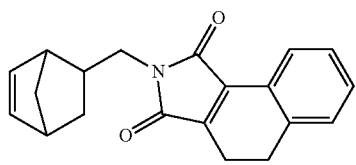 [SMILES: O=C1C2=C(C(=O)N1CC1CC3C=CC1C3)c1ccccc1CC2] | DHNMINB | 43 |
| 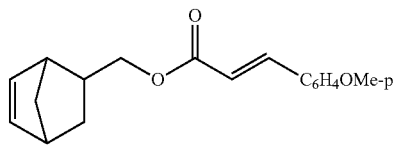 | MeOCinnNB | 44 |
| 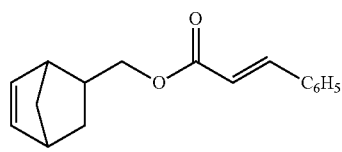 | CinnNB | 45 |

-continued
| | | |
|---|---|---|
| 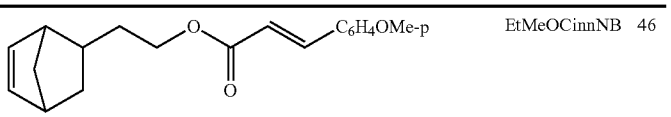 | EtMeOCinnNB | 46 |
| 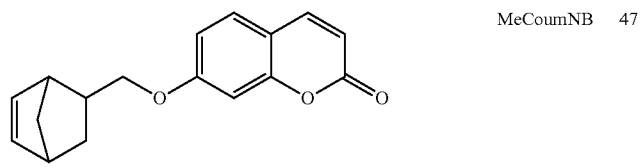 | MeCoumNB | 47 |
| 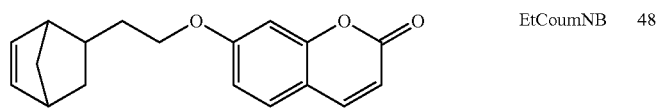 | EtCoumNB | 48 |
| 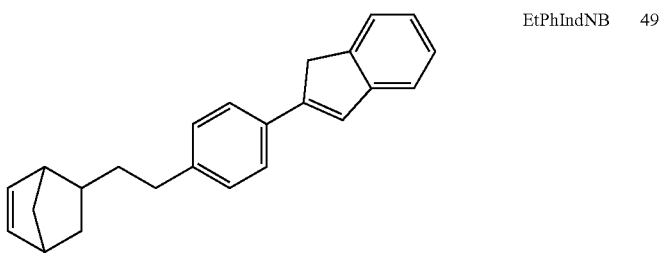 | EtPhIndNB | 49 |
| 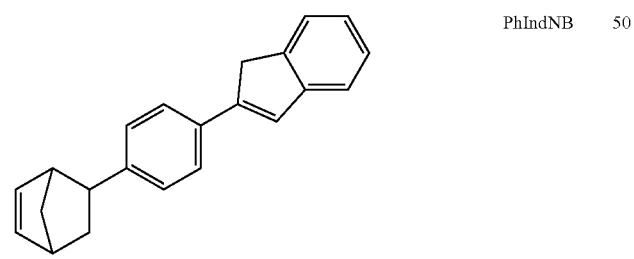 | PhIndNB | 50 |
| 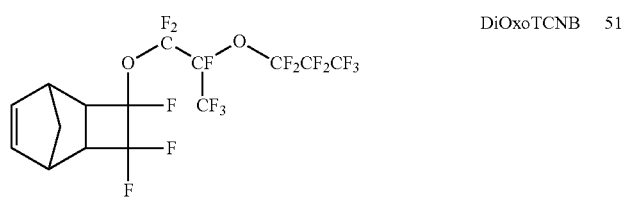 | DiOxoTCNB | 51 |
| 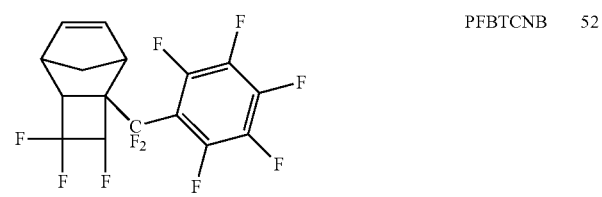 | PFBTCNB | 52 |
|  | TESNB | 53 |
|  | PMNB | 54 |
where "Me" means methyl, "Et" means ethyl, "OMe-p" means para-methoxy, "Ph" and "$C_6H_5$" mean phenyl, "$C_6H_4$" means phenylene, "$C_6F_5$" means pentafluorophenyl, in subformulae 9 and 11 "OAc" means acetate, in subformula 25 "PFAc" means —OC(O)—C$_7$F$_{15}$, and for each of the above subformulae having a methylene bridging group (a CH$_2$ covalently bonded to both the norbornene ring and a functional group), including but not limited to 11-14, 16, 18, 19 and 54, it will be understood that the methylene bridging group can be replaced by a covalent bond or —(CH$_2$)$_p$— where p can be an integer from 1 to 6.

It will be further noted that while 54 specific examples are provided above, other monomers in accordance with embodiments of the present invention are inclusive of monomers represented by formulae Ia and IIa where at least one of R$^1$, R$^2$, R$^3$ and R$^4$ or R$^5$, R$^6$, R$^7$ and R$^8$ are hydrocarbyls, halohydrocarbyls, and perhalocarbyls, inclusive of heteroatoms, that include, —(CH$_2$)$_n$—C(CF$_3$)$_2$—OH, —(CH$_2$)$_n$—C(CF$_3$)(CH$_3$)—OH, (CH$_2$)$_n$—C(O)NHR*, (CH$_2$)$_n$—C(O)Cl, —(CH$_2$)$_n$—C(O)OR*, (CH$_2$)$_n$—OR*, —(CH$_2$)$_n$—OC(O)R* and —(CH$_2$)$_n$—C(O)R*, where n independently represents an integer from 0 to 10 and R* independently represents hydrogen, a C$_1$-C$_{11}$ alkyl, a C$_1$-C$_{11}$ halogenated or perhalogenated alkyl, a C$_2$-C$_{10}$ alkenyl, a C$_2$-C$_{10}$ alkynyl, a C$_5$-C$_{12}$ cycloalkyl, a C$_6$-C$_{14}$ aryl, a C$_6$-C$_{14}$ halogenated or perhalogenated aryl, a C$_7$-C$_{14}$ aralkyl or a halogenated or perhalogenated C$_7$-C$_{14}$ aralkyl. Exemplary perhalogenated alkyl groups include, but are not limited to, trifluoromethyl, trichloromethyl, —C$_2$F$_5$, —C$_3$F$_7$, —C$_4$F$_9$, —C$_7$F$_{15}$, and —C$_{11}$F$_{23}$. Exemplary halogenated or perhalogenated aryl and aralkyl groups include, but are not limited groups having the formula —(CH$_2$)$_x$—C$_6$F$_y$H$_{5-y}$, and —(CH$_2$)$_x$—C$_6$F$_y$H$_{4-y}$-pC$_z$F$_q$H$_{2z+1-q}$, where x, y, q, and z are independently selected integers from 0 to 5, 0 to 5, 0 to 9, and 1 to 4, respectively. Specifically, such exemplary perhalogenated aryl groups include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

While each Formula I, Ia, II and IIa, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that some embodiments in accordance with the present invention are made to take advantage of such differences by using monomers that are either a mixture of isomers that is rich in the advantageous isomer or are essentially the pure advantageous isomer. For example, see Example A7 and A16, below.

Some embodiments of the present invention encompass polymers in accordance with Formula I that have repeating units where one of R$^{1-4}$, for example R$^1$, is a fluorinated or perfluorinated alkyl, aryl or aralkyl group as described above and the others of R$^{1-4}$ are H. Specifically R$^1$ is one of the above subformulae 15-26 and more specifically subformulae 16, 17, 18, 19 or 20.

Some embodiments of the present invention encompass polymers in accordance with Formula I that have repeating units where one of R$^{1-4}$, for example R$^1$, is a photoreactive or crosslinkable group as described above and the others of R$^{1-4}$ are H. Specifically R$^1$ is a group as shown in one of the above subformulae 27-50 and more specifically in subformulae 34, 35, 36, 37 and 38.

Some embodiments of the present invention encompass polymers in accordance with Formula I that have repeating units where one of R$^{1-4}$, for example R$^1$, is a polar group having a hydroxy, carboxy, acetoxy or oligoethyleneoxy moiety as described above and the others of R$^{1-4}$ denote H. Specifically R$^1$ is a group as shown in one of the above subformulae 9-14, and generally of subformula 9.

Some embodiments in accordance with the present invention encompass a polymer having a first type of repeating unit selected from fluorinated repeating units described above and a second type of repeating unit selected from crosslinkable repeating units, also described above. Specific examples of such embodiments include polymers having repeating units in accordance with subformulae 16 and one of 34, 35, 36, 37 or 38.

Some embodiments in accordance with the present invention encompass a polymer having a first type of repeating unit selected from fluorinated repeating units described above, a second type of repeating unit selected from crosslinkable repeating units, also described above and a third type of repeating unit selected from polar repeating units, again as described above. Specific examples of such embodiments include polymers having repeating units in accordance with subformulae 9 and 16, and one of 34, 35, 36, 37 or 38.

Other exemplary embodiments of the present invention encompass polymers having more than three different types of repeating units in accordance with Formula I or Formula II, a polymer blend of a first polymer having a first type of repeating unit in accordance with Formula I, and a second polymer having, at least, a first type of repeating unit and a second type of repeating unit in accordance with Formula II. Alternately such polymer blends can encompass the aforementioned second polymer mixed with an alternative first polymer having two or more types of repeat units in accordance with Formula I. Further, such polymer blends can encompass the aforementioned alternative first polymer mixed with an alternative second polymer having three types of repeat units in accordance with Formula II.

Still other embodiments in accordance with the present invention encompass a polymer having at least one repeat unit in accordance with Formula I and at least one repeat unit in accordance with Formula II where the ratio of such Formula I to Formula II repeat units is from 95:5 to 5:95. In other such embodiments the ratio of repeat units is from 80:20 to 20:80 and in still other embodiments from 60:40 to 40:60 and in yet other embodiments from 55:45 to 45:55.

Another embodiment in accordance with the present invention encompasses a polymer blend of one or more polymers each having at least one type of repeat unit in accordance with Formula I and one or more polymers having repeat units that are different from norbornene-type repeat units. These other polymers are selected from polymers including, but not limited to, poly(methyl methacrylate) (PMMA), polystyrene (PS), poly-4-vinylphenol, polyvinylpyrrolidone, or combinations thereof, like PMMA-PS and -polyacrylonitrile (PAN).

Examples of suitable norbornene monomers, polymers and methods for their synthesis are provided herein and can also be found in U.S. Pat. No. 5,468,819, U.S. Pat. No. 6,538,087, US 2006/0020068 A1, US 2007/0066775 A1 and US 2008/0194740 A1, which are incorporated into this application by reference. For example, exemplary polymerizations processes employing Group VIII transition metal catalysts are described in the aforementioned US 2006/0020068 A1 at paragraphs [0053] and [0057].

The polymer embodiments of the present invention are formed having a weight average molecular weight (M$_w$) that is appropriate to their use. Generally, a M$_w$ from 5,000 to 500,000 is found appropriate for some embodiments, while for other embodiments other Mw ranges can be advantageous. For example, for some embodiments, $M_w$ is from at least 30,000, while in others from at least 60,000. In some embodiments, the upper range of the polymer's $M_w$ is up to 400,000, while in others is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

Some embodiments in accordance with the present invention encompass the use of one of the aforementioned polymer compositions for forming an interlayer provided contacting an insulating layer in electronic devices. In some embodiments in accordance with the present invention, the insulating layer is a gate insulator layer or part of a gate insulator layer. In other embodiments the insulating layer is a passivation layer or part of a passivation layer.

Such composition embodiments generally encompass, in addition to one or more polymer components, a casting solvent optionally having orthogonal solubility properties with respect to the insulating layer material, an optional cross-linking agent, an optional reactive solvent, an optional UV sensitizer, and an optional thermal sensitizer. Therefore, embodiments in accordance with the present invention encompass electronic devices having or being obtained through the use of such polymer compositions. Such electronic devices including, among others, field effect transistors (FETs) and organic field effect transistors (OFETs), thin film transistors (TFT) and organic thin film transistors (OTFTs), integrated circuits (IC) and Radio Frequency Identification (RFID) tags. Where such electronic device embodiments include transistors made through the use of such polymer compositions, and where such transistors include both top gate and bottom gate transistors such as those depicted schematically in FIGS. 3, 4, 5 and 6.

Figure 2:
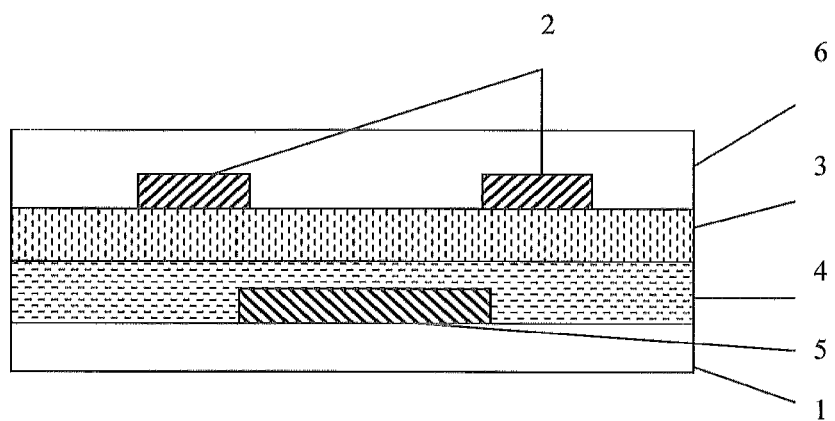
FIG. 2 is a schematic representation of a typical bottom gate FET device according to prior art.

Turning now to the accompanying figures, FIG. 1 and FIG. 2 depict schematic representations of top and bottom gate organic field effect transistors, respectively, as are currently known. Thus the OFET device of FIGS. 1 and 2 include substrate (1), source and drain electrodes (2), semiconductor layer (3), gate dielectric layer (4), gate electrode (5), and second insulator or protection layer (6) to shield the gate electrode from further layers or devices that may be later provided.

Figure 3:
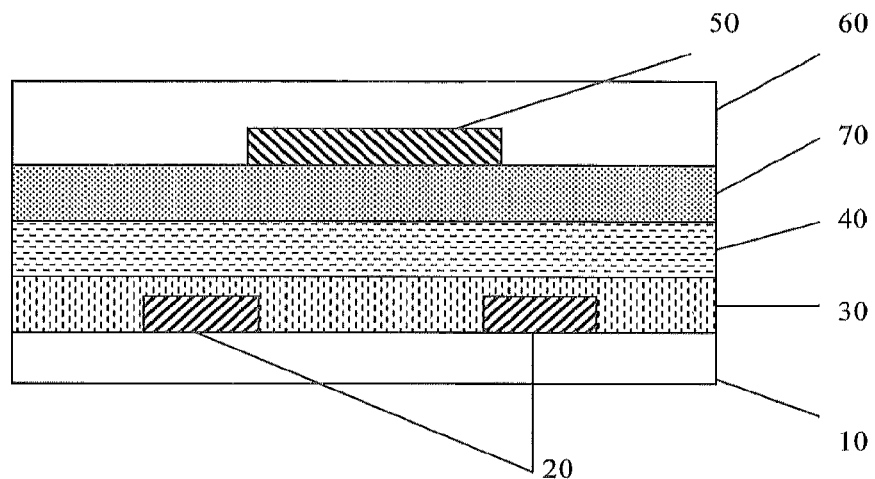
FIGS. 3, 4 and 5 are schematic representations of top gate FET devices in accordance with embodiments of the present invention.

Turning now to FIG. 3, a schematic representation of a top gate FET device in accordance with embodiments of the present invention is provided. Such FET device includes substrate (10), source and drain electrodes (20), semiconductor layer (30), gate electrode (50), gate dielectric layer (40), interlayer (70), which is derived from a polymer composition encompassing a polycycloolefin polymer or blend of polycycloolefin polymers as described above and below and optional layer (60), which is for example a layer having one or more of insulating, protecting, stabilizing and adhesive function, and which is disposed overlying gate electrode (50) and interlayer (70). The interlayer (70) can provide improved adhesion to gate electrode (50) and/or to further layers coated thereon, like for example optional layer (60).

The device illustrated schematically in FIG. 3 can be prepared by, a) forming source and drain electrodes (20) on substrate (10) as depicted, b) depositing a layer of semiconductor material (30) over substrate (10) and source and drain electrodes (20), c) depositing a layer of dielectric material (40) on semiconductor layer (30), d) depositing a layer of interlayer material (70), which uses a polymer composition embodiment to provide a polycycloolefin polymer or a polymer blend, to a dielectric layer (40), e) forming gate electrode (50) on at least a portion of the interlayer (70) as depicted, and f) optionally depositing layer (60), which is for example an insulating and/or protection and/or stabilizing and/or adhesive layer, on the gate electrode (50) and portions of interlayer (70).

Figure 4:
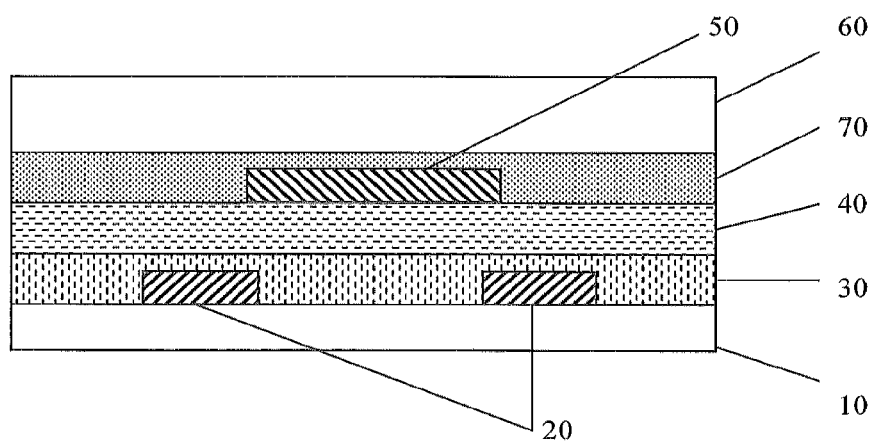

Turning now to FIG. 4, another top gate FET embodiment in accordance with the present invention is schematically depicted where gate electrode (50) is deposited onto gate dielectric layer (40) before interlayer (70), and where the other components of the device are as referred to in FIG. 3. Further, it will be understood that the device of FIG. 4 can be formed in the same manner as described for the device of FIG. 3 but where gate electrode (50) is formed prior to depositing interlayer material (70).

Figure 5:
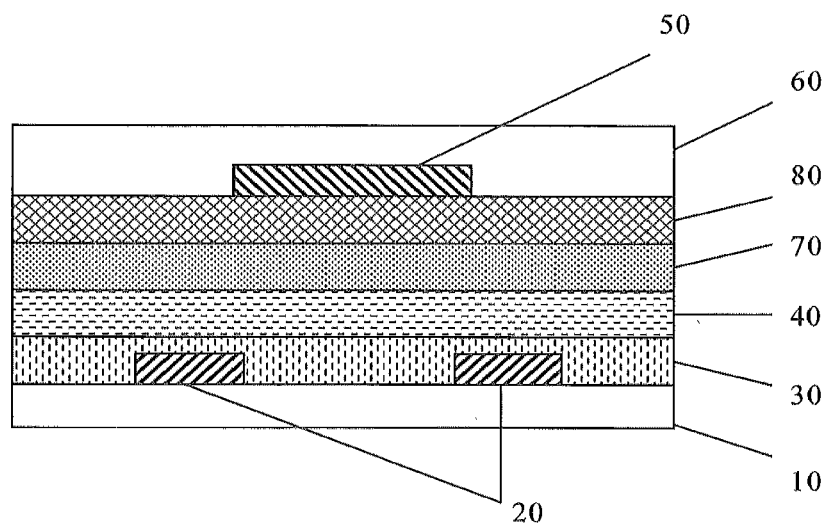

Referring now to FIG. 5, another top gate FET embodiment in accordance with the present invention is schematically represented. Specifically, the FET in FIG. 5 is analogous to the FET embodiment of FIG. 3 but for stabilizing layer (80), not shown in FIG. 3. As depicted, stabilizing layer (80) overlies interlayer (70) and is positioned between interlayer (70) and gate electrode (50). Advantageously, stabilizing layer (80) can serve to improve the structural integrity and durability of interlayer (70) by reducing cracking or wrinkling problems that may occur when heating the electronic device to or above $T_g$ of the fluoropolymer, e.g., when providing the gate electrode on top of it. Stabilizing layer (80) can encompass a curable (i.e., polymerizable or crosslinkable) or cured (i.e. polymerized or crosslinked) organic material. As depicted, stabilizing layer (80) can be overlaid or coated with optional layer (60), which, as described above has one or more of insulating, protecting, stabilizing and adhesive functions.

Suitable materials for stabilizing layer (80) are silicone resins such as silanol-functional polymers. Exemplary materials include, but are not limited to, polysilsesquioxanes as described for example in U.S. Pat. No. 5,861,235, commercially available polysilsesquioxanes or their precursors, like the materials of the HardSil™ series (from Gelest Inc., Morrisville, Pa., USA) such as HardSil™ AM, a formulation of a polysilsesquioxane resin 19-21% in a mixture of alcohols, the materials of the AS Hardcoat™ or SHC™ series (from Momentive Performance Materials Inc., Wilton, Conn., USA) such as AS4000 Hardcoat™, AS4700 Hardcoat™ or SHC™ 5020, or materials such as GR650F™ (from Techneglas Inc., Perrysburg, Ohio, USA).

The curable or cured material of stabilizing layer (80) is typically dissolved in a solvent, for example a solvent orthogonal to the solvent used for the material of interlayer (70). Examples of such orthogonal solvents include, but are not limited to, butanol and isopropanol. The solution is then deposited onto the device as described above and below and optionally cured to form stabilizing layer (80).

Figure 6:
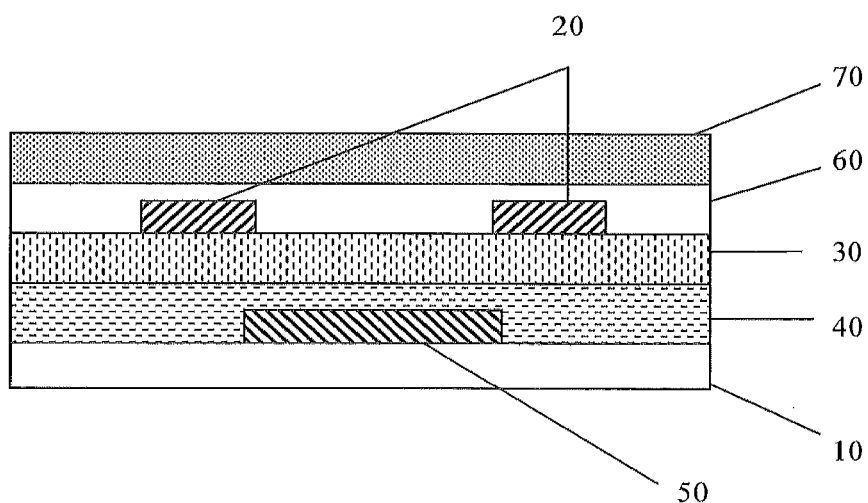
FIG. 6 is a schematic representation of a bottom gate FET device in accordance with embodiments of the present invention.

Turning now to FIG. 6, a bottom gate FET in accordance with embodiments of the present invention is depicted. Such FET includes substrate (10), source and drain electrodes (20), semiconductor layer (30), gate electrode (50), gate dielectric layer (40), second insulator layer (60), which is a passivation or protection layer to shield the source and drain electrodes (20) from further layers or devices provided on top of the device, and interlayer (70), which is as described above, derived from a polymer composition encompassing a polycycloolefin polymer or blend of a polycyclolefinic polymer as described above and below. As previously mentioned, interlayer (70) can provide improved adhesion to further layers deposited thereon.

Deposition and/or forming of the layers and structures of the FET and OFET embodiments in accordance with the present invention are typically performed using solution processing techniques where such techniques are possible. For example a formulation or composition of a material, typically a solution encompassing one or more organic solvents, can be deposited or formed using techniques that include, but are not limited to, dip coating, spin coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an organic semiconductor material, an interlayer material and an organic dielectric material can each be deposited or formed by spin coating, flexographic printing, and inkjet printing techniques in an order appropriate to the device being formed.

Specifically, where interlayer (70) is deposited by solution processing and employing a solution of one or more of the polymer or polymer blends as described above and below in one or more organic solvents, such solvents are selected from, but not limited to, organic ketones such as methyl ethyl ketone (MEK), methyl n-amyl ketone (MAK or 2-heptanone), cyclohexanone and, ethers such as butyl-phenyl ether and 4-methylanisole; and aromatic hydrocarbons such as cyclohexylbenzene, or mixtures thereof. Typically, the total concentration of the polymer material in the formulation is from 0.1 to 5 wt. % although other concentrations can also be appropriate. Organic ketone solvents with a high boiling point have been found to be appropriate solvents where inkjet and flexographic printing techniques are employed.

The interlayer (70) should be applied with an appropriate thickness to provide sufficient wetting and adhesion for any additional layers coated thereon while not negatively affecting device performance. While the appropriate thickness of interlayer (70) used in fabricating a device is a function of the specific device being made and the ultimate use of such a device, among other things, as general guidelines it has been found that a thickness in the range of from 1 to 1000 nm is appropriate for some device embodiments of the present invention while for other embodiments a thickness in the range of from 5 to 500 nm is appropriate. It will be understood, however, that other thickness ranges may be appropriate and thus are within the scope of the present invention.

FET and OFET embodiments in accordance with the present invention employ a gate dielectric layer (40) that consists of a dielectric material ("gate dielectric") having a permittivity (∈) of 3.0 or less ("low k dielectric"), as disclosed in WO 03/052841. In some embodiments ∈ in the range of from 1.1 to 3.0 has been found to be appropriate while in other embodiments a range from 2.0 to 3.0 is appropriate. In still other FET and OFET embodiments in accordance with the present invention a permittivity range of from 2.5 to 3.0 or from 2.0 to 2.6 has been found to be appropriate.

In FET and OFET embodiments in accordance with the present invention that employ a low k gate dielectric material, as described above, for the gate dielectric layer such material is typically an organic fluoropolymer. Suitable fluoropolymers include, for example, highly soluble perfluoropolymers like those from the commercially available CYTOP™ series (Asahi Glass), Teflon AF® series (DuPont) or Hyflon AD® series (from Solvay). CYTOP polymers are described in "Modern Fluoroplastics", edited by John Scheris, John Wiley&Sons Ltd., 1997, Chapter: "Perfluoropolymers obtained by cyclopolymerisation" by N. Sugiyama, pages 541ff. Teflon AF is described in "Modern Fluoroplastics", edited by John Scheris, John Wiley&Sons Ltd., 1997, Chapter: "Teflon AF amorphous fluoropolymers" by P. R. Resnick, pages 397ff. Hyflon AD is described in "High Performance Perfluoropolymer Films and Membranes" V. Arcella et. al., Ann. N.Y. Acad. Sci. 984, pages 226-244 (2003).

Typically, the interlayer material encompasses a polymer, or a polymer blend as described above and below, has a higher permittivity than the gate dielectric material and can range, in some embodiments of the present invention from 2.0 to 40, while in other embodiments a range of from 2.5 to 20 has been found to be appropriate.

In some embodiments of the present invention, a crosslinkable or crosslinked polymer is used as the interlayer material or as a component thereof. It has been found that such a crosslinkable or crosslinked polymer can serve to improve one or more properties selected from structural integrity, durability, mechanical resistivity and solvent resistivity of the gate dielectric layer and the electronic device. Suitable crosslinkable polymers are for example those having one or more repeating units of Formula I wherein one or more of $R^{1-4}$ denotes a crosslinkable group, for example units of subformulae 27-50.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15,000 mJ/cm$^2$. Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendant groups that crosslink can be provided, generally such crosslinking is provided by repeating units that encompass a maleimide-type pendent group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

If desired, the interlayer can be optionally post exposure baked at a temperature from 70° C. to 130° C., for example for a period of from 1 to 10 minutes. Post exposure bake can be used to further promote crosslinking of crosslinkable moieties within exposed portions of the polymer.

In some embodiments in accordance with the present invention, the crosslinkable polymer composition encompasses a stabilizer to prevent spontaneous crosslinking and improve shelf life of the polymer composition. Suitable stabilizers are antioxidants such as catechol or hindered phenol derivatives that generally encompass one or more bulky alkyl groups, e.g. t-butyl groups, in an ortho-position to the phenolic OH group.

The physical integrity of the electronic device is a key element for the manufacturing of more complex structures, like for example active-matrix backplanes of flat panel electro-optical displays. Adhesion between the substrate and the stack of the built-above layers should be strong enough to withstand further processing, like for example air-curtain drying or wet-processing with the use of organic solvents. If the adhesion is not strong enough it is possible that the built-above layer will peel-off, for example in case of air-curtain drying, or will be moved over the substrate, for example when in case of wet processing the solvent gets between substrate and layer by capillary forces. This is even more important when plastic substrates are used, because the surface energy of untreated plastic is usually low so that adhesion forces are not high. Possible solutions suggested in prior art to overcome these problems include methods which chemically modify the surface of the substrate, like for example oxygen plasma treatment, or use substrates pre-coated with additional layers like for example metal oxide layers for plastic substrates. However, methods of chemical modification of e.g. dielectric polymers are limited as these may negatively influence their properties, like for example their solubility, or may negatively influence device performance.

Therefore, in some embodiments of the present invention, reactive adhesion promoters are used in addition to the crosslinkable polymer composition for forming the interlayer. The reactive adhesion promoters encompass a first, crosslinkable functional group that is capable of reacting with the pendent crosslinkable group of the crosslinkable polycycloolefinic polymer, and a second functional group which is a surface-active group that is capable of interactions, for example chemical bonding, with adjacent device layers. Such adjacent device layers being, for example, a substrate, an underlying functional device layer onto which the interlayer is deposited, or a functional layer that is deposited onto the interlayer.

In a first type of these embodiments, the adhesion promoter is deposited on the substrate or layer, on which the interlayer is later formed, before deposition of the crosslinkable polycycloolefinic polymer composition that will form the interlayer. The adhesion promoter is deposited on the substrate for example by soaking the substrate with a solution of the adhesion promoter in a suitable solvent and then removing the solvent. The adhesion promoter forms a layer on the surface of the substrate, optionally under formation of chemical bondings with the substrate. Afterwards the crosslinkable polymer composition is deposited on the surface of the substrate covered with the layer of the adhesion promoter. After removal of any solvents, the crosslinkable groups of the adhesion promoter and of the crosslinkable polycycloolefinic polymer are crosslinked, for example by UV exposure.

The interlayer according to this first type of embodiments can be prepared by a process comprising the steps of a) depositing on a substrate, or onto a device layer, which is for example a gate insulator layer, a semiconductor layer or an electrode, an adhesion promoter which is optionally dissolved or dispersed in one or more organic solvents, b) if solvents are present, removing said solvents, thereby forming a layer of the adhesion promoter on the surface of the substrate c) depositing a layer of a crosslinkable polycycloolefinic polymer composition, which comprises a crosslinkable polycycloolefinic polymer and optionally a solvent, on the surface of the substrate containing the adhesion promoter layer, d) if solvents are present, removing said solvents, and e) exposing the layer of the polycycloolefinic polymer to heat or actinic radiation that causes crosslinking of the crosslinkable groups of the adhesion promoter and the crosslinkable groups of the polycycloolefinic polymer, thereby forming the interlayer.

In a second type of these embodiments the interlayer is formed from a crosslinkable polymer composition which comprises a crosslinkable polycycloolefinic polymer and an adhesion promoter additive comprising a surface-active functional group and a crosslinkable functional group capable of crosslinking with the said crosslinkable groups of the crosslinkable polycycloolefinic polymer.

The interlayer according to the second type of these embodiments can be prepared by a process comprising the steps of a) depositing onto a substrate, or onto a device layer, which is for example a gate insulator layer, a semiconductor layer or an electrode, a layer of a crosslinkable polymer composition comprising an adhesion promoter, a crosslinkable polycycloolefinic polymer and a solvent, b) removing the solvent, and c) exposing the layer of the polymer composition to heat or actinic radiation that causes crosslinking of the crosslinkable groups of the adhesion promoter and the crosslinkable groups of the polycycloolefinic polymer, thereby forming an interlayer.

The use of such reactive adhesion promoters in an interlayer of the present invention improves its adhesion to an underlying layer or substrate in the transistor. Thereby, the adhesion of the interlayer can be improved without negatively affecting its performance.

The use of such reactive adhesion promoters in an inter layer polymer composition embodiment of the present invention advantageously can improve the adhesion of a subsequently formed layer to an underlying layer. Thereby, the adhesion of the layers adjacent to the interlayer to one another can be improved through the presence of such an intervening layer without changing the polymer used either adjacent layer and potentially negatively affecting the performance of such layers.

The surface active group of the reactive adhesion promoter can be, for example, a silane group of the formula —SiR$^{12}$R$^{13}$R$^{14}$ or a silazane group of the formula —NH—SiR$^{12}$R$^{13}$R$^{14}$, wherein R$^{12}$, R$^{13}$ and R$^{14}$ are independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of R$^{12}$, R$^{13}$ and R$^{14}$ may also denote $C_1$-$C_{12}$-alkyl, optionally substituted $C_5$-$C_{20}$-aryl or optionally substituted $C_2$-$C_{20}$-heteroaryl.

The crosslinkable group of the reactive adhesion promoter can be, for example, a maleimide, a 3-monoalkyl-maleimide, a 3,4-dialkylmaleimide, an epoxy, a vinyl, an acetyl, an indenyl, a cinnamate or a coumarin group. Further, the crosslinkable group can encompass a substituted or unsubstituted maleimide portion, an epoxide portion, a vinyl portion, a cinnamate portion or a coumarin portion.

In some embodiments in accordance with the present invention, the reactive adhesion promoter is represented by formula III

   III wherein G is a surface-active group, as defined above and below, A' is a single covalent bond or a connecting, spacer or bridging group, which is, for example, selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_4$-$(CH_2)_n$, $(CH_2)_n$—$C_6Q_{10}$-$(CH_2)_n$, and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$ and P is a crosslinkable group, as defined above and below.

Suitable compounds can be selected, for example, from those in accordance with formula A1, including, among others, DMMI-propyl-Si(OEt)$_3$, DMMI-butyl-Si(OEt)$_3$, DMMI-butyl-Si(OMe)$_3$ or DMMI-hexyl-Si(OMe)$_3$:

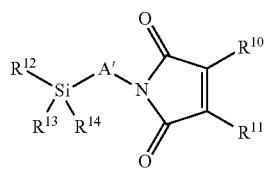

A1 where SiR$^{12}$R$^{13}$R$^{14}$ is a silane as defined above and A' is as defined above and below and R$^{10}$ and R$^{11}$ are each independently H or a C$_1$-C$_6$ alkyl group.

As used herein, the terms "spacer group" "connecting group" and "bridging group" are known to the skilled person (see e.g. Pure Appl. Chem. 73(5), 888 (2001).

Other useful spacer groups A' can include linear C$_1$ to C$_{30}$ alkylenes or branched C$_3$ to C$_{30}$ alkylenes or cyclic C$_5$ to C$_{30}$ alkylenes, each being unsubstituted or mono- or poly-substituted by F, Cl, Br, I or CN. Further, A', as defined above, can have one or more non-adjacent CH$_2$ groups replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, or —C≡C— in such a manner that O and/or S atoms are not linked directly to one another, and R$^{18}$ and R$^{19}$ are independently of each other H, methyl, ethyl or a C$_3$ to C$_{12}$ linear or branched alkyl.

Additionally, typical groups A' can encompass, for example, —CH$_2$CH$_2$—S—CH$_2$CH$_2$— or —CH$_2$CH$_2$—NH—CH$_2$CH$_2$— or —(SiR$^{18}$R$^{19}$—O)$_p$—, with p being an integer from 2 to 12 and R$^{18}$ and R$^{19}$ having the meanings given above.

The synthesis of adhesion promoters like those of formula A1 is disclosed in U.S. Pat. No. 4,565,873.

In order to improve the processing of the functional layers and the integrity of the electronic device, it is desirable to decrease the time needed for the process while keeping or improving the physical properties of the layers. For organic transistors it is required that subsequent layers are orthogonal and do not dissolve each other. In many cases this requires crosslinking, typically UV crosslinking, of a first functional layer which induces insolubility, so that coating a second functional layer on top of the first functional layer will not influence the properties of both layers.

Shortening the time needed for the processing can be done for example by tuning the coating process, while decreasing the time needed for UV crosslinking can be achieved both by chemical adjustment of the dielectric polymer or by changes in the process.

However, chemical modifications of dielectric polymers are limited, because the UV sensitivity is related to certain properties of the polymer dielectric, and for example changes towards increased UV sensitivity may decrease the solubility. Changing the process, for example by. using higher power UV, could increase the possibility of creating an ozone atmosphere and thus cause undesired changes in the surface of the polymer dielectric.

Therefore, some polymer composition embodiments in accordance with the present invention encompass crosslinker additives. Such additives having two or more functional groups that are capable of reacting with the pendent crosslinkable groups of the polycycloolefinic polymer used to form the gate insulator layer. It will also be understood that the use of such a crosslinker additive can also enhance the crosslinking of the aforementioned polymer, thus enhancing the ability to pattern the gate insulator layer through the use of an imagewise exposure to an appropriate wavelength and dose of UV radiation. However, it should be realized that such patterning can generally be accomplished without such crosslinking additives.

The crosslinkable group of the crosslinker or crosslinking agent is, for example, selected from a maleimide, a 3-monoalkyl-maleimide, a 3,4-dialkylmaleimide, an epoxy, a vinyl, an acetyl, an indenyl, a cinnamate or a coumarin group. Further, the crosslinkable group can encompass a substituted or unsubstituted maleimide portion, an epoxide portion, a vinyl portion, a cinnamate portion or a coumarin portion.

In some embodiments the crosslinker is selected of formula IV1 or IV2

$$P—X—P \qquad \text{IV1}$$

$$H_{4-m}C(A''\text{-}P)_m \qquad \text{IV2}$$

where X is A"-X'-A", X' is O, S, NH or a single covalent bond, A" is a single covalent bond or a connecting, spacer or bridging group, which is, for example, selected from (CZ$_2$)$_n$, (CH$_2$)$_n$—(CH=CH)$_p$—(CH$_2$)$_n$, (CH$_2$)$_n$—O, (CH$_2$)$_n$—O—(CH$_2$)$_n$, (CH$_2$)$_n$—C$_6$Q$_{10}$-(CH$_2$)$_n$, and C(O)—O, where each n is independently an integer from 0 to 12, p is an integer from 1-6, Z is independently H or F, C$_6$Q$_{10}$ is cyclohexyl that is substituted with Q, Q is independently H, F, CH$_3$, CF$_3$ or OCH$_3$, P is as defined for formula III or as defined above and below, and m is 2, 3 or 4.

Suitable compounds can be, for example, selected from those in accordance with formula C1 including, among others, DMMI-butyl-DMMI, DMMI-pentyl-DMMI or DMMI-hexyl-DMMI:

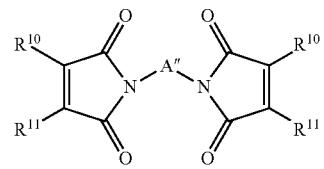

C1 where R$^{10}$ and R$^{11}$ are independently of each other H or a C$_1$-C$_6$ alkyl group, and A" is as defined in formula IV2.

Other useful spacer groups A" can include linear C$_1$ to C$_{30}$ alkylenes or branched C$_3$ to C$_{30}$ alkylenes or cyclic C$_5$ to C$_{30}$ alkylenes, each being unsubstituted or mono- or poly-substituted by F, Cl, Br, I or CN. Further, A', as defined above, can have one or more non-adjacent CH$_2$ groups replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, and R$^{18}$ and R$^{19}$ are independently of each other H, methyl, ethyl or a C$_3$ to C$_{12}$ linear or branched alkyl.

Additionally, typical groups A" can encompass, for example, —CH$_2$CH$_2$—S—CH$_2$CH$_2$— or —CH$_2$CH$_2$—NH—CH$_2$CH$_2$— or —(SiR$^{18}$R$^{19}$—O)$_p$—, with p being an integer from 2 to 12 and R$^{18}$ and R$^{19}$ having the meanings given above.

The synthesis of crosslinkers like those of formula C1 is disclosed for example in U.S. Pat. No. 3,622,321.

The other components or functional layers of the electronic device, like the substrate, the gate and source and drain electrodes, and an inorganic semiconductor layer (if used), can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally the thickness of a functional layer, for example a gate dielectric or semiconductor layer, in some electronic device embodiments according to the present invention is from 1 nm (in case of a monolayer) to 10 µm; In other embodiments such thickness ranges from 1 nm to 1 µm, and in still other embodiments from 5 nm to 500 nm, although other thicknesses or ranges of thickness are contemplated and thus are within the scope of the present invention.

Various substrates may be used for the fabrication of the electronic device embodiments of the present invention. For example glass or plastic materials are most often used. Exemplary plastic materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, and silicones, where polyethyleneterephthalate, polyimide, and polyethylenenaphthalate materials have been found most appropriate. Additionally, for some embodiments of the present invention the substrate can be any plastic, metal or glass material coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

The gate, source and drain electrodes of the FET and OFET device embodiments in accordance with the present invention can be deposited or formed by liquid coating, such as spray-, dip-, web- or spin-coating, or by physical vapour deposition (PVD) or chemical vapour deposition (CVD) methods. Suitable electrode materials and deposition methods are known to the person skilled in the art. Suitable electrode materials include, without limitation, inorganic or organic materials, or composites of the two. Exemplary electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used and deposited from a liquid phase.

The semiconductor materials and methods for applying the semiconductor layer for FET embodiments in accordance with the present invention can be selected from standard materials and methods known to the person skilled in the art, and are described in the literature. Typically such materials are selected from uniformly doped amorphous silicon, microcrystalline silicon and polysilicon although materials such as cadmium selenide and metal oxides such as zinc oxide can also be employed. Exemplary methods of depositing and/or forming semiconductor layers include CVD and PVD technologies.

In case of OFET device embodiments of the present invention, the semiconductor layer is an organic semiconductor (OSC) layer and can be an n- or p-type OSC, which can be deposited by PVD, CVD or solution deposition methods. Effective OSCs exhibit a FET mobility of greater than $1 \times 10^{-5}$ cm$^2$V$^{-1}$s$^{-1}$.

OSC embodiments in accordance with the present invention can be either OFETs where the OSC is used as the active channel material or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating are typically employed to allow for ambient temperature processing. However, OSCs can be deposited by any liquid coating technique, for example ink-jet deposition or via PVD or CVD techniques.

For some OFET embodiments, the semiconducting layer that is formed can be a composite of two or more of the same or different types of semiconductors. For example, a p-type OSC material may, for example be mixed with an n-type material to achieve a doping effect of the layer. In some embodiments of the invention, multilayer semiconductor layers are used. For example an intrinsic semiconductor layer can be deposited near the gate dielectric interface and a highly doped region can additionally be coated adjacent such an intrinsic layer.

The OSC material employed for electronic device embodiments in accordance with the present invention can be any conjugated molecule, for example an aromatic molecule containing at least three aromatic rings. In some embodiments of the present invention, the OSC contains aromatic rings selected from 5-, 6- or 7-membered aromatic rings, while in other embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with alkyl, alkoxy, polyalkoxy, thioalkyl, acyl, aryl or substituted aryl groups, halogen, where fluorine, cyano, nitro or an optionally substituted secondary or tertiary alkylamine or arylamine represented by —N(R$^{15}$)(R$^{16}$), where R$^{15}$ and R$^{16}$ are each independently H, an optionally substituted alkyl or an optionally substituted aryl, alkoxy or polyalkoxy groups are typically employed. Further, where R$^{15}$ and R$^{16}$ is alkyl or aryl these may be optionally fluorinated.

The aforementioned aromatic rings can be fused rings or linked with a conjugated linking group such as —C(T$_1$)=C (T$_2$)-, —C≡C—, —N(R')—, —N=N—, (R')=N—, —N=C(R')—, where T$_1$ and T$_2$ each independently represent H, Cl, F, —C≡N or lower alkyl groups such as C$_{1-4}$ alkyl groups; R' represents H, optionally substituted alkyl or optionally substituted aryl. Further, where R' is alkyl or aryl can be fluorinated.

In some electronic device embodiments of the present invention, OSC materials that can be used include compounds, oligomers and derivatives of compounds selected from conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly (-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b'] dithiophene. Where a liquid deposition technique of the OSC is desired, compounds from the above list and derivatives thereof are limited to those that are soluble in an appropriate solvent or mixture of appropriate solvents.

Further, in some embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

In other embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Where appropriate and needed to adjust the rheological properties as described for example in WO 2005/055248 A1, some embodiments of the present invention employ OSC compositions that include one or more organic binders.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

It will be appreciated that many of the features described above, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Above and below, unless stated otherwise percentages are percent by weight and temperatures are given in degrees Celsius. The values of the dielectric constant c ("permittivity") refer values taken at 20° C.

Unless stated otherwise, the values of the surface energy refer to those calculated from contact angle measurement of the polymers according to the method described in D. K. Owens, R. C. Wendt, "Estimation of the surface free energy of polymers", Journal of Applied Polymer Science, Vol. 13, 1741-1747, 1969 or "Surface and Interfacial Tension Measurement, Theory, and Applications (Surfactant Science Series Volume 119)" by Stanley Hartland (Editor), Taylor & Francis Ltd; 2004 (ISBN: 0-8247-5034-9), chapter 7, p.: 375: "Contact Angle and Surface Tension Measurement" by Kenji Katoh).

In the examples that follow, synthetic routes to some exemplary monomers and methods for the polymerization of such monomers are demonstrated. These examples are in no way limiting to the scope or spirit of embodiments in accordance with the present invention. Additionally, it will be noted that for each of the synthetic routes and polymerizations, generally anhydrous conditions are employed unless otherwise noted. That is to say that where an example instructs that a reaction vessel is charged with a solvent, the solvent is anhydrous and/or is sparged with an inert gas such as nitrogen to remove any dissolved oxygen.

A. Monomer Synthesis.

Example A1

Synthesis of PhIndNB

Mg turnings (4.0 g, 0.16 mol) and 4-bromophenyl norbornene (5 g, 0.02 mol) were placed in a 1 liter 3-neck round bottomed flask (RB flask or RBF) equipped with an addition funnel and a cooling water condenser under nitrogen atmosphere. A solution of 4-bromophenyl norbornene (35 g, 0.14 mol) in anhydrous tetrahydrofuran (100 mL) was added slowly using the addition funnel while gently heating the contents of the RB flask to maintain the solution at boiling during the addition. After the addition is complete, the reaction mixture was refluxed for 1 hour. Freshly recrystallized 2-indanone (21.3 g, 0.16 mol) was dissolved in anhydrous diethyl ether (100 g) and added to the above Grignard solution drop wise. After the addition was complete, the reaction mixture was refluxed for 3-4 hours followed by stirring overnight at ambient temperature. Hydrochloric acid was diluted with distilled water (1:1, 300 mL) then added to the reaction mixture and stirred for 1 hour. The red-orange organic layer was separated from the aqueous phase and concentrated at reduced pressure to yield crude product (36 g, 74% yield). The crude product was characterized by $^1$H NMR. The crude product was dissolved in toluene (400 g) and potassium hydrogen sulfate (30 g, 0.2 mol) was added to the mixture. The reaction mixture was refluxed overnight in a nitrogen atmosphere overnight. The solvent was stripped off at reduced pressure and the yellow-orange solid obtained was recrystallized from ethyl acetate (150 mL) to obtain a yellow solid product. The yellow solid was washed with ethyl acetate until the filtrate is colorless to obtain a pale yellow solid (15 g, 31% overall yield). This final product (PhIndNB) was characterized by $^1$H NMR.

Example A2

Synthesis of $NBCH_2C_6F_5$

Dicyclopentadiene (23.8 g, 0.18 mol) and allylpentafluorobenzene (150 g, 0.72 mol) were premixed and transferred to a stainless-steel autoclave. The reactor was closed and three nitrogen/vent cycles were performed by pressurizing the reactor to about 20 psig with nitrogen and releasing the nitrogen to a vent line. The reaction mixture was then heated under a 10 psig nitrogen blanket and kept at 200° C. for 20 hours after which the reaction mixture was allowed to cool to room temperate and the percent conversion determined by gas chromatography analysis. The reaction mixture included 48% of the desired product, $NBCH_2C_6F_5$. Distillation at reduced pressure was used to obtain the final product in about 25% overall yield and at more than 98% purity.

Example A3

Synthesis of $NBC_4F_9$

Dicyclopentadiene (66.1 g, 0.50 mol) and 3,3,4,4,5,5,6,6-nonafluoro-1-hexene (246 g, 1.0 mol) were premixed and transferred to a stainless-steel Parr reactor. The reactor was closed and three nitrogen/vent cycles were performed by pressurizing the reactor to about 20 psig with nitrogen and releasing the nitrogen to a vent line. The reaction mixture was heated under a 10 psig nitrogen blanket and kept at 200° C. for 8 hours. The reaction mixture was allowed to cool to room temperature and the conversion was determined by gas chromatography analysis. The reaction mixture included 75% of the desired product, $NBC_4F_9$. The reaction mixture was then distilled at reduced pressure to obtain the final product in about 36% overall yield in more than 98% purity.

Example A4

Synthesis of $NBCH_2$-2,3-dimethylmaleimide (DMMIMeNB)

Dimethyl maleic anhydride (679 g, 5.39 mol) and 6 L toluene were charged to a 12 L flask fitted with a mechanical stirrer, Dean-Stark trap, condenser, and thermocouple. The mixture cooled to 16° C. as the dimethylmaleic anhydride dissolved in the toluene. To the mechanically stirred mixture 663 g of 99% aminomethylnorbornene (5.39 mol) was added with a 600 ml toluene rinse. An exotherm to 34° C. was immediately observed and the mixture was slowly heated (to avoid excessive foaming) until reflux was observed. At 109° C., approximately 1.5 h from the start of heat-up, the solution cleared. 98 ml of water (>100% of theoretical) was collected in the Dean Stark trap indicating that the reaction was complete, which was confirmed by GC analysis. The mixture was then allowed to cool to room temperature, filtered, and the filtrate rotary evaporated to yield 1656 g (>100%) of a light brown liquid, 98.9% pure (GC). To this was added 128.2 g remaining from a previous batch of crude material and vacuum distilled. A forerun of 132.1 g was collected and found to contain 96.8% purity product and unreacted dimethylmaleic anhydride. In addition, a first fraction of 281.3 g, 99.4% purity product was collected at 146-149° C. (0.78-1.15 Torr) and a second fraction of 920 g, 99.8% purity product was collected at 149° C. (1.15-1.55 Torr). The combined first and second fraction of >99% purity product was 1201 g for a 87% yield.

Example A5

Synthesis $NBCH_2CH_2$maleimide (MIEtNB)

Maleic anhydride (388.6 g, 3.96 mol), ground in a mortar, and 6300 ml xylenes were charged to a reaction vessel equipped with mechanical stirring, a condenser, a Dean Stark trap and a thermocouple. The temperature was observed to drop to 19° C., while yielding a hazy solution. Amino-ethylnorbornene (90.1% purity, 600 g, 3.94 mol) was added dropwise over a 20 minute period to the stirred mixture, causing the temperature to rise to 49.3° C. and giving a deep amber solution. The solution was heated to reflux and after 5 hours 40 minutes the water take-off into the Dean-Stark trap was seen to essentially stop; 48.2 ml (68% of theoretical) of water was collected. A proton NMR analysis of the reaction mixture showed a very weak amido-acid signal at 6.3-6.45 ppm and GC analysis showed 86.8% of the desired product. The reaction was allowed to cool to room temperature and filtered to remove 71.8 g of a white solid. One-half of the reaction mixture, 3500 ml, was loaded directly onto a column of silica gel (1280 g) and the reaction solution was eluted from the silica column. The initial 1000 ml of eluent showed no product (by TLC with 2.5% methanol/dichloromethane), but the second 1000 ml, mainly xylenes, showed one spot on TLC and was rotary evaporated to give 60.7 g of product (A2). The silica gel was flushed with dichloromethane, giving three successive 1000 ml fractions (A3, A4, and A5 respectively) containing 150.2 g impure product. The remaining reactant solution, 3500 ml in xylenes, was loaded onto 1273 g silica and flushed with recycled xylenes. The first three 1000 ml xylenes fractions (B1-B3) each showed one spot on TLC. The next 1000 ml fraction, B4, obtained with toluene as the eluent, gave one spot on TLC, but the next two 1000 ml toluene fractions (B5 and B6) showed weak levels of product in presence of other by-products. Fractions A2, B1, B2, B3, and B4 were combined and rotary evaporated to give 223.6 g of an oil which crystallized on standing. This was 97.4% pure by GC. This was recrystallized from 150 ml hot heptane to yield 124.4 g at 99.9% purity. A second crop yielded 22.24 g at 99.7% purity.

Example A6

Synthesis of $NBCH_2$maleimide (MIMeNB)

Maleic anhydride (117.0 g, 1.19 mol), charged to a reaction vessel equipped with mechanical stirring, a Dean Stark trap, a condenser and a thermocouple, was mixed with 860 ml o-xylene, causing the temperature to drop to 16.5° C., while yielding a hazy solution. Aminomethyl-norbornene (98% purity, 1.17 mol) was dissolved in 144 ml o-xylene and added dropwise over a 15-minute period to the stirred mixture, causing the temperature to rise to 64.6° C.

and resulting in a white slurry. The mixture was mechanically stirred while heating to reflux for 5 hours. Water take-off in the Dean Stark trap stopped at 13.5 ml (64% of theoretical) after 4.5 h. TLC (2.5% methanol/dichloromethane) and NMR confirmed the presence of product and the absence of non-cyclized amido acid. The reaction was allowed to cool to room temperature, filtered to remove precipitated white solids, and split into two 600 ml portions. Each portion was independently loaded onto 1000-1100 g of silica and flushed with 6000 ml of dichloromethane. Rotary evaporation of the combined elutants gave 89.1 g crystalline product which was recrystallized from 40 ml hot heptane to give 80.49 g product at 99.4% purity. NMR analysis showed the product contained as much as 5.7 mol % o-xylene. The crystals were rotary evaporated under high vacuum at 45° C. to remove the o-xylene, but subsequent NMR analysis revealed the presence of 1.8% maleic anhydride (believed to be masked by o-xylene in earlier analyses). The crystals were rotary evaporated again under high vacuum at 65-75° C. to give product showing <0.6 wt % maleic anhydride by NMR. GC analysis showed 99.4% purity and no detectable maleic anhydride. Yield was 77.2 g (32.5% yield), mp 69.1-71.3° C. (glasses at 66.1-68.6° C.).

Example A7

Synthesis of exo-N—NBCH$_2$CH$_2$-2,3-dimethylmaleimide (exo-DMMIEtNB)

Dimethylmaleic anhydride (18.75 g, 0.149 mol), was charged to a reaction vessel equipped with mechanical stirring, a Dean-Stark trap, a condenser and a thermocouple, was dissolved in 120 ml toluene, causing the solution to cool to 18° C. A toluene slurry of solid exo-(aminoethyl)norbornene (20.4 g, 0.149 mol) was added to dimethylmaleic anhydride solution and precipitation of white solids immediately occurred. The reaction mixture was mechanically stirred as the reaction was heated to reflux. At 102° C., reflux began and the solution cleared. After 17 minutes at reflux, the theoretical amount of water had been collected in the Dean-Stark trap. The reaction was heated an additional two hours at reflux and then cooled to 9° C. The mixture was then filtered to remove solids and the filtrate rotary evaporated to yield 43.7 g. This was distilled in the Kugelrohr oven to collect 17.9 g (46% yield) at 175-185° C. (<1 mbar). GC analysis showed 99.0% purity.

Example A8

Synthesis of NBCH$_2$-3-methylmaleimide (MMIMeNB)

Citraconic anhydride (352 g, 3.15 mol) and 1500 ml of toluene were charged to a 5 L flask fitted with a mechanical stirrer, Dean-Stark trap, condenser, and thermocouple. The mixture was observed to cool to 16° C. as the citraconic anhydride dissolved in the toluene. To the mechanically stirred mixture, 99% aminomethylnorbornene (387 g, 3.15 mol) and a 600 ml toluene rinse were added. The mixture immediately became a solid mass and exhibited an exotherm to 39° C. The mixture was heated carefully (to avoid excessive foaming) to reflux. At 110° C., approximately 1.5 h from the start of heat-up, the solution cleared and 56 ml water (>100% of theoretical) was collected in the Dean-Stark trap. GC analysis revealed the reaction was complete. The mixture was allowed to cool to room temperature and filtered. The filtrate was then rotary evaporated to yield 672 g (98.2%) of a light brown liquid, (97.9% pure by GC). The crude material was vacuum distilled to give 624 g, 99.1% purity, at 125-128° C. (1.15-1.2 Torr).

Example A9 endo-/exo-NBCH$_2$CH$_2$CH$_2$CH$_2$DMMI (DMMI-BuNB)

A 1 L, 4 neck RBF equipped with a thermowell, condenser with a nitrogen inlet, addition funnel and mechanical stirrer was charged with 200 mL of toluene followed by potassium DMMI (35 g, 0.21 mol) and 18-crown-6 (1,4,7,10,13,16 hexaoxacyclooctadiene, 5.7 g, 0.021 mol, 10 mol %) with stirring. The addition funnel was charged with endo-/exo-NBBuBr (45 g, 0.20 mol) in 200 mL toluene and added over 5 minutes. The mixture was heated to 100° C. and an off white slurry was observed. The mixture was continued to be stirred at for an additional 6.5 hours at 100° C. and the color changed from the first observed off-white to dark green and then reddish brown. The reaction was monitored by GC which revealed the reaction was complete with 73.6% product and 15.6% unreacted exo-/endo-NB-BuBr. The reaction mixture was then cooled to room temperature and then quenched with the addition of 250 mL water and then diluted with 150 mL toluene. The aqueous layer was extracted with (2×200 mL) CH$_2$Cl$_2$ and organic layers washed with brine, dried over Na2SO4, filtered and evaporated to give 55.3 g of crude product as a brown oil. The crude product was adsorbed onto 55 g SiO$_2$ and chromatographed over 330 g of SiO2 eluting with pentane (3 L), 2% EtOAc in pentane (5 L), 3% EtOAc in heptane (3 L) and 4% EtOAc in heptane (2 L). The concentrated purified fractions yielded 31 g of product as a colorless viscous oil (57.8% yield) with 99.3% purity by HPLC and another fraction of 7.0 g product (13.1% yield) with 99.09% purity by HPLC. The combined yield for the reaction was 70.9%. $^1$H NMR and MS were consistent with the structure of DMMIBuNB.

Example A10

Synthesis of NBCH$_2$O$_2$CCH=CHC$_6$H$_4$OMe (MeO-CinnNB)

4-Methoxycinnamoyl chloride:
A first 3 L, 4 necked round bottomed flask (RBF) was equipped with a mechanical stirrer, thermowell, and a condenser with nitrogen adapter. The RBF was charged with 4-methoxycinnamic acid (175 g, 982 mmol) and 0.1 mL dry pyridine in 2 L dry toluene. The addition funnel was charged with 107.2 mL (1.473 mol) SOCl$_2$ which was then added slowly to the reaction mixture at room temperature. The reaction mixture was heated to reflux and monitored by GC analysis (aliquots were withdrawn periodically, quenched with MeOH, and analyzed). After 5 hours, the GC analysis indicated that the reaction was complete and the reaction mixture was allowed to cool to room temperature. Excess SOCl$_2$ and toluene were removed by rotary evaporation and the crude product was purified by distillation to give 182 g of 4-methoxycinnamoyl chloride (94% yield) with 98.9% purity by GC.

NBCH$_2$O$_2$CCH=CHC$_6$H$_4$OMe (MeOCinnNB):
A second 3 L, 4 necked RBF was equipped with a thermowell, a condenser with nitrogen adapter, addition funnel, and mechanical stirrer was charged with NBCH$_2$OH (100 g, 805 mmol), dimethylaminopyridine (DMAP) (4.92 g, 40.2 mmol, 5 mol %), 563 mL triethylamine (4.03 mol) and 1.2 L dichloromethane. The mixture was stirred at room temperature for 45 minutes during which time the addition funnel was charged with 4-methoxycinnamoyl chloride (174 g, 0.885 mol), obtained as above, dissolved in 400 mL dichloromethane. After addition of the 4-methoxycinnamoyl chloride at room temperature, the mixture was stirred at 25° C. overnight. After confirmation of complete reaction by GC the reaction mixture was diluted with 1 L dichloromethane, and the resultant solution washed with (2×2 L) NaHCO$_3$ solution, (2×µL) NH$_4$Cl solution, (2×2 L) brine, then dried over Na$_2$SO$_4$, filtered, and the filtrate evaporated resulting in the collection of 208 g of crude product. This was then adsorbed onto 200 g silica and chromatographed over 600 g of silica gel eluting with 0% to 30% EtOAc in cyclohexane. The concentrated purified fractions yielded 133 g of product as colorless, viscous oil (58.3% yield) with 98.1% purity by GC. Additional fractions were combined to give another 71.5 g product with purity>96% by GC, bringing the total yield 88% (205 g).

Example A11

Synthesis of MeCoumNB

NBCH$_2$OTs:
A first 3 L, 4 necked RBF equipped with a mechanical stirrer, thermowell, addition funnel, and condenser with nitrogen adapter was charged with tosyl chloride (376.5 g, 1.93 mol) and NBCH$_2$OH (200 g, 1.61 mol) in 800 mL dry dichloromethane. The addition funnel was charged with 270 mL (1.93 mol) triethylamine and the charge added slowly to the reaction mixture at 0° C. The reaction mixture was stirred at room temperature while the reaction was monitored by TLC/GC. TLC monitoring indicated that the reaction was complete after 48 h. The reaction mixture was then diluted with 1 L dichloromethane, followed by washes with 1 L water, (2×1 L) NaHCO$_3$ solution, (2×1 L) brine, drying over Na$_2$SO$_4$ and filtration. The filtrate was then evaporated giving 463 g of crude product which was then adsorbed onto 450 g silica and chromatographed over 1600 g of silica gel eluting with 0% to 10% EtOAc in cyclohexane. The concentrated purified fractions of the chromatography yielded 427 g of product as colorless viscous oil (95% yield) with 95.3% purity by GC; Proton NMR was consistent with the structure.

MeCoumNB:
A second 3 L, 4 necked RBF equipped with a thermowell, condenser with nitrogen adapter, and mechanical stirrer was charged with 7-hydroxycoumarin (168 g, 1.04 mol), potassium carbonate (179 g, 1.29 mol), NBCH$_2$OTs (300 g, 1.08 mol) and rinsed with 1.5 L dry NMP. The mixture was heated to 100° C. and stirred while the reaction was monitored by TLC/$^1$H NMR. Proton NMR indicated the reaction was completed after 54 h and the reaction mixture was then allowed to cool to room temperature. The reaction mixture was then quenched with 24 L 1N HCl, the resultant off-white solid that precipitated was filtered, washed with 4 L water and dried to give 268 g of crude product. This product was charged to a 5 L RBF, dissolved in 2 L (3:1 ratio) heptane:toluene and refluxed with 26.8 g of charcoal and filtered through a pad of silica. The filtrate was concentrated and added to an excess of heptane:toluene (3:1 ratio) to give 158 g (57% yield) of pure white crystalline product with 98.2% purity by HPLC.

Example A12

Synthesis of NBCH$_2$CH$_2$O$_2$CCH=CHC$_6$H$_4$OMe (EtMeOCinnNB)

5-Norbornene-2-ethanol (NBCH$_2$CH$_2$OH):
A 19-liter Parr Reactor was charged with 611 g (4.6 mol) dicyclopentadiene and 2000 g (27.7 mol) 3-buten-1-ol. While stirring, the reactor was flushed three times with nitrogen and then sealed under 10 psi nitrogen pressure. The reaction was brought to 220° C. over a period of 2 hr 17 min, the pressure was observed to reach a maximum of 185 psi. The reaction was stirred for 4 hours at 220° C., the pressure dropping to 130 psi. The reaction mixture was then allowed to cool to room temperature and drained, 2603 g of reaction mixture was collected. GC analysis indicated the product mixture to contain 65.6% NBEtOH isomers by GC (3-buten-1-ol is also present, but not calculated because it is in the solvent front). Excess 3-buten-1-ol, 1260 g, was removed by rotary evaporation at 50° C. The resultant concentrate was purified by distillation under high vacuum through a 14" column with glass helices packing. Fractions 4 and 5 were found to be 96.1% and 95.6% pure and were collected. In each fraction, the trimer of DCPD, F4-3.4% and F5 3.5% was also found to be present. Total yield, with purity>95% (F4+F5)=721.8 g. % Yield=56.5%.

NBCH$_2$CH$_2$O$_2$CCH=CHC$_6$H$_4$OMe (EtMeOCinnNB):
A 100 mL, 3 neck RBF equipped with a thermowell, addition funnel, and mechanical stirrer was charged with NBCH$_2$OH (2 g, 14.47 mmol), DMAP (88.4 mg, 0.72 mmol, 5 mol %), 10.1 mL triethylamine (72.35 mmol) and 25 mL dichloromethane. The mixture was stirred at room temperature for 45 minutes before the addition of 4-methoxycinnamoyl chloride (3.13 g, 15.92 mmol) in 5 mL dichloromethane from the addition funnel was started. After this addition was completed, the mixture was stirred at 25° C. overnight. After confirmation of complete reaction by GC the reaction mixture was diluted with 20 mL dichloromethane, followed by washes with (2×25 mL) NaHCO$_3$ solution, (2×15 mL) NH$_4$Cl solution, (2×25 mL) brine, dried over Na$_2$SO$_4$ and filtered. Concentration of the filtrate gave 3.9 g of crude product as a colorless viscous oil (93% crude yield) with 96% crude purity by GC.

Example A13

Synthesis of Norbornenylethoxycoumarin (EtCoumNB)

NBCH$_2$CH$_2$OTs:
A 5 L, 4 neck RBF equipped with a mechanical stirrer, thermowell, addition funnel, and condenser with nitrogen adapter was charged with tosyl chloride (CH$_3$C$_6$H$_4$SO$_2$Cl=TsCl) (745 g, 3.9 mol) and NBCH$_2$CH$_2$OH (450 g, 3.26 mol) and 2 liters dry dichloromethane. The addition funnel was charged with 547 mL (3.9 mol) triethylamine and added slowly to the reaction mixture previously chilled to 0° C. Stirring at room temperature was continued while the reaction was monitored by TLC/$^1$H NMR. After 24 hours, a proton NMR analysis indicated that the reaction was complete. The reaction mixture was then diluted with 4 L dichloromethane, followed by washes with 2 L water, (2×1 L) NaHCO$_3$ solution, (2×1 L) brine, dried over Na$_2$SO$_4$, filtered, and the filtrate rotovapped to give 1064 g of crude product as a colorless viscous oil (110% crude yield) with >95% purity by $^1$H NMR (consistent with the structure). The crude product was used for next reaction without further purification.

EtCoumNB:

A 12 L, 4 neck RBF equipped with a thermowell, condenser with nitrogen adapter, and mechanical stirrer was charged with 7-hydroxycoumarin (450 g, 2.77 mol), 3.5 L dry NMP, potassium carbonate (498.6 g, 3.6 mol), NBCH$_2$CH$_2$OTs (932.6 g, 3.19 mol) and 1 L dry NMP. The mixture was heated with stirring to 100° C. and monitored by TLC/NMR. The TLC/$^1$H NMR monitoring indicated that the reaction was completed after 24 h and the reaction mixture was allowed to cool to room temperature. Then the reaction was quenched with 50 L 1N HCl, causing the product to precipitate as an off-white solid that was filtered, washed with (5×4 L) water and dried to give 1394 g of crude product. The 1394 g crude product was dissolved in 4 L dichloromethane. About 500 mL of water separated and was removed; the remaining dichloromethane solution was then dried over Na$_2$SO$_4$, filtered, and evaporated to give 864 g of crude product. The 864 g crude product was combined with 60 g of a pilot reaction's crude product and dissolved in dichloromethane and adsorbed onto 1000 g silica and chromatographed over 4 kg silica gel eluting with 0% to 25% EtOAc in cyclohexane. The concentrated purified fractions yielded 508 g of product as a fluffy light yellow solid with >97% purity by HPLC. The product was then recrystallized from 1.6 L refluxed heptane:toluene (4:1 ratio) to give 480 g (57% yield) of pure white crystalline powder product with 99.3% purity by HPLC; $^1$H NMR was consistent with the structure.

Example A14

Synthesis of 4-norbornenyl-1-butynyltriethylsilane (NBCH$_2$CH$_2$C≡CSiEt$_3$ (AkSiNB))

NBCH$_2$CH$_2$O Ms:

A 12 L, 4 necked RBF equipped with a thermowell, nitrogen adapter, addition funnel and mechanical stirrer was charged with 5-(2-hydroxyethyl)norbornene (420 g, 3.03 mol), 4 L dichloromethane, and methanesulfonyl chloride (CH$_3$SO$_2$C$_1$ or MsCl) (369 g, 3.22 mol). An extra 500 ml dichloromethane was added to rinse in the CH$_3$SO$_2$C$_1$. The stirred mixture was chilled to −16° C. and triethylamine (371 g, 3.64 mol) was added dropwise over a 1.5 hr period, the temperature was observed to increase to 0° C. during the addition. The resulting slurry was allowed to continue to warm to 189° C. over a 4 hr period and then 2 L water was added with continued stirring. After the water addition was completed, the phases were allowed to separate and the aqueous phase extracted with 2 L dichloromethane. The combined dichloromethane extracts were washed with (2×2 L) NaHCO$_3$ solution followed by 1600 mL of 1 N HCl and then washed with brine in 2000 mL portions until a wash pH=6 was observed. The dichloromethane solution was then dried over sodium sulfate, filtered, and rotary evaporated to give 612.5 g of a red liquid. NMR was consistent with structure. GC analysis gave mesylate content at 93.2%. No further purification was attempted since the material demonstrated instability during distillation.

NBCH$_2$CH$_2$Br:

A 22 L reactor equipped with a thermowell, nitrogen adapter, addition funnel and mechanical stirrer was charged with lithium bromide (369 g, 4.25 mol) and 4 L of 2-pentanone and stirred until the LiBr was dissolved, after which the solution warmed to 30° C. Norborneneethylmethanesulfonate (612.5 g, 2.83 mol) dissolved in 2 L of 2-pentanone was then added to the LiBr solution with stirring and then diluted further with an additional 2 L of 2-pentanone (total volume of 2-pentanone=8 L). The solution was then heated to reflux, and was observed to become a white slurry. Upon reaching 92° C., GC analysis indicated <0.8% starting material remained and after 1 h at reflux, GC analysis showed no remaining starting material. The mixture was cooled to 27° C. and 4 L distilled water was added to clear the mixture. The phases were separated and the aqueous phase extracted with (2×2 L) ethyl acetate. The organic portions were combined and rotary evaporated at <30° C. The residue was transferred to a separatory funnel using 4 L of dichloromethane as a rinse solvent. The product was washed with (2×1 L) saturated sodium bicarbonate followed by 1 L brine washes until a final wash pH=7 was obtained. The product was dried over sodium sulfate, filtered, and the filtrate rotary evaporated to give 440 g of crude product (93.6% purity by GC). The crude product was then vacuum distilled using a 14-inch Vigreux column where the following fractions were collected: 1. 16.9° C. (10 Torr)-42.8° C. (1.15 Torr), 20.6 g, 97.5% by GC, no 2-pentanone by NMR; 2. 42° C. (0.83 Torr)-44.4° C. (0.33 Torr), 334.2 g, 98.0% by GC; 3. 32° C. (0.3 Torr)-44.3° C. (0.32 Torr), 53 g, 93.5% by GC, 3.5% CPD trimer. Total yield of >93% purity product was 407.8 g (71.6% yield);

NBCH$_2$CH$_2$C≡CSiEt$_3$ (AkSiNB):

A 3 L, 4 necked RBF was equipped with a thermowell, nitrogen adapter, addition funnel and mechanical stirrer. The RBF was charged with triethylethynylsilane (128.4 g, 915 mmol) in 800 mL dry THF. The reaction mixture was cooled to −78° C. and 359 mL n-BuLi (2.5M in hexane, 899 mmol) was added slowly and stirred for 1 h at −78° C. The reaction mixture was then warmed to 0° C. and addition funnel was charged with NBCH$_2$CH$_2$Br (160 g, 795.6 mmol) in 640 mL dry DMSO. After slow addition of NBCH$_2$CH$_2$Br solution the reaction mixture was allowed to warm to room temperature and stirred for 2 h. By GC analysis the reaction was completed after 2 h stirring at room temperature. The reaction mixture was quenched with 4 L water and diluted with 8 L heptane, followed by washes with (3×8 L) water, (2×4 L) brine, dried over Na$_2$SO$_4$, filtered, and evaporated. The GC analysis indicated that the crude product contained 62% product and 27% by-product (Et$_3$SiCCSiEt$_3$). The 178 g of crude product was distilled under high vacuum through a 14" column with glass helices packing to separate the triethylsilylacetylene and Et$_3$SiCCSiEt$_3$ byproduct. The product was obtained in >99% purity (88.8 g, 43% yield) boiling point=93-97.5° C. at 0.20-0.21 mmHg.

Example A15

Preparation of NBCH$_2$CH$_2$C$_6$H$_4$DMMI (EtPhDM-MINB)

Bromophenyl-2,3-dimethylmaleimide (BrC$_6$H$_4$DMMI):

A 1 L RBF was equipped with a magnetic stir bar, condenser with nitrogen adapter. The RBF was charged with 4-bromoaniline (150.1 g, 872 mmol) and dimethyl maleic anhydride (DMMA) (100 g, 792 mmol) in 600 mL glacial acetic acid. The reaction mixture was refluxed for 6 h and TLC was checked in 30% EtOAc in heptane. By TLC the reaction was complete, and the reaction mixture was allowed to cool overnight. The product solidified as an off-white crystal, which was filtered and washed with MeOH. Crystals were dissolved in EtOAc and washed with NaHCO$_3$ solution. The organic layer was dried over Na$_2$SO$_4$ and after concentration gave bromophenyl-2,3-dimethylmaleimide (BrC$_6$H$_4$DMMI, 169.8 g, 76.5% yield) with a purity of 99.7% by GC.

NBCH$_2$CH$_2$C$_6$H$_4$DMMI (EtPhDMMINB):

A 3 L, 4 necked RBF was equipped with a thermowell, condenser with nitrogen adapter, addition funnel and mechanical stirrer. The RBF was charged with Zn (82.0 g, 1.26 mol), iodine (10.6 g, 0.04 mol) and 800 mL degassed N-methylpyrrolidone (NMP). The mixture was stirred at room temperature until the red color of iodine disappeared (ca. 2 minutes). Addition funnel was charged with NBCH$_2$CH$_2$Br (169 g, 0.84 mol) in 100 mL degassed NMP. The NBCH$_2$CH$_2$Br solution was added dropwise and the mixture was stirred at 80° C. for 3 h. Completion of zinc insertion was indicated by GC analysis of hydrolyzed reaction mixture. The mixture was cooled to 60° C. and BrC$_6$H$_4$DMMI (157 g, 0.56 mol) and Pd(PPh$_3$)$_4$ (51.8 g, 0.045 mol) were added successively at 60° C. Then the reaction mixture was heated at 80° C. for 2 h 30 min. The reaction was monitored by quenching an aliquot with 1N HCl and extracting with EtOAc and followed by GC. After 2 h 30 min there was only 38.8% product by GC, so, another 2 mol % Pd(PPh$_3$)$_4$ was added and stirred at 80° C. for another 1 h, but no significant change in product was observed. The reaction mixture was allowed to cool to room temperature and quenched with 2 L 1N HCl and extracted with (2×4 L) 50% EtOAc in cyclohexane. The combined organic phases were washed with NaHCO$_3$, brine, dried over Na$_2$SO$_4$, filtered, and evaporated. The 200 g of crude product was adsorbed onto 200 g silica and chromatographed over 800 g of silica gel eluting with 0% to 20% EtOAc in cyclohexane. The concentrated purified fractions yielded 30.4 g of an off-white solid product (17% yield) with >94% purity by GC.

Example A16

Preparation of exo-Norbornenylphenylethynyl-triethylsilane (exo-NBCH$_2$CH$_2$C$_6$H$_4$C≡CSiEt$_3$(ArSiNB))

exo-norbornenylphenylbromide:

To 1-bromo-4-iodobenzene (250 grams, 884 mmol) and PdCl$_2$(PPh$_3$)$_2$ (6.20 grams, 8.84 mmol) in 400 mL of anhydrous DMF, was added norbornadiene (360 mL, 3.54 mmol), triethylamine (Et$_3$N) (398 mL, 2.85 mol), in a five-necked, three liter glass jacketed reactor purged with nitrogen. The reactor was heated via a hot water bath with a 50° C. set point. At an internal reactor temperature of 50° C., formic acid (88%, 80 mL, 1.86 mmol) was added drop wise through an addition funnel to prevent an exothermic reaction from occurring. The solution was heated and stirred at 50° C. for 1.25 hours and sampled every 15 minutes with GC monitoring to ensure all the 1-bromo-4-iodobenzene was reacted. The reaction mixture was cooled, transferred to a separatory funnel, and extracted with 500 mL of 10% HCl and 470 mL of heptane. The combined aqueous layers were discarded. The combined organic layers were dried with 5 grams of MgSO$_4$ and stirred for 30 minutes. The mixture was filtered through silica gel (200-425 Mesh) via a chromatography column, which was eluted with heptane. The crude material of exo-norbornenylphenylbromide (169 grams, 77% yield) was purified through a short path distillation setup at 90° C. and 0.2 Torr. The distillation cuts contained 62 grams (>80%), 80 grams (>99%), and were colorless liquids. The main impurity in the sample was a reaction by-product, which was identified by GCMS as a norbornadiene dimer (NB-NB). A sample of the pure (>99%) exo-norbornenylphenylbromide was analyzed via $^1$H NMR and was in agreement with the proposed structure and literature values.

exo-NBCH$_2$CH$_2$C$_6$H$_4$C≡CSiEt$_3$ (exo-ArSiNB):

To exo-norbornenylphenylbromide (103.8 grams, 0.417 mol) and triethylsilylacetylene (70.2 grams, 0.5 moles) in 750 mL of anhydrous DMF, was added dibutylamine (Bu2NH) (77.5 grams, 0.6 mol), PdCl$_2$(PPh$_3$)$_2$ (10.53 grams, 0.015 mol), and copper(I) iodide (2.86 grams, 0.015 mol), in a three-neck, one liter glass jacketed reactor purged with nitrogen. The reactor was heated via a hot water bath with a set point of 65° C. The solution was kept heated and stirred at 65° C. for 27 hours with GC monitoring every 3 hours to ensure that all the exo-norbornenylphenylbromide was reacted. The reaction mixture was cooled, and extracted with 200 mL of 10% HCl and 410 grams of heptane. The combined aqueous layers were discarded. The combined organic layers were filtered through a silica bed (200-425 Mesh) via a chromatography column and eluted with heptane. The crude material contained 122 grams of exo-norbornenylphenylethynyltriethylsilane. The main impurity in the sample was a reaction by-product, which was identified by GCMS as an acetylene dimer, Et$_3$SiC≡C—C≡CSiEt$_3$. Since the crude material could not be purified by distillation, it was retreated with silica gel via a chromatography column and eluted with heptane once more. The final material (43 grams, 35% yield) was a pale yellow oil (>98% purity). $^1$H NMR confirmed the identity of the final product as exo-norbornenylphenylethynyltriethylsilane.

Example A17

Preparation of epoxyoctylnorbornene (EONB)

1,2-Epoxy-9-decene (EPD) (≥96% (31.5 Kg)) was charged to a jacketed reactor equipped with a dedicated hot oil unit, an apparatus to provide a split-range pressure control scheme and a feed weigh tank equipped with a metering pump. 4.32 Kg of a premix of dicyclopentadiene (DCPD) (≥98%) and EPD (9:1 molar ratio) was prepared and charged to the feed weigh tank. Oxygen was removed from the reactor headspace using (3) pressure/vacuum swings with nitrogen and then pressurized with nitrogen to 5 prig. The reactor content was heated to 210° C. and when at temperature the premix was metered into the reactor at a constant rate over a 6 hour period. After completion of the metered addition, the reactor content was rapidly cooled to 25° C.

Referring to Table A, below: A known weight of the crude reaction mixture of epoxyoctyl norbornene (EONB) was then charged to a vacuum distillation setup consisting a still pot with heating mantle, a packed distillation column (3 theoretical plates), a reflux splitter, a water cooled condenser, a condensate receiver and a vacuum pump. The distillation system vacuum was adjusted to the desired set point, and the oil bath used to heat the still pot to establish reflux conditions in the distillation column. Once these conditions were established, the reflux splitter was then started at the desired reflux ratio and fractional distillation proceeded by periodically removing liquid fractions from the overhead receiver. GC analysis was used to determine composition of the overhead liquid fractions. Distillation reflux ratio was adjusted as needed to affect composition of the overhead stream. The initial overhead fractions are enriched in the "light" components, which are primarily cyclopentadiene (CPD), dicyclopentadiene (DCPD) and epoxy decene (EPD). After removal of the "light" components, medium purity EONB (≥92%) is then separated from the remaining cyclopentadiene trimers (CPDT) and epoxyoctyl tetracyclododecene (EOTD). The EOTD and other heavies are left in the still pot. The distillation process was terminated once the majority of EONB had been removed from the still pot residual.

Referring to Table B, below: A second-pass distillation of the medium purity EONB obtained from the first distillation was used to obtain high purity EONB (≥98%) product.

TABLE A

| Distillation 1st Pass | | |
| --- | --- | --- |
| Crude EONB Charge | 36.82 kg | |
| Still Pot Temperature: | EPD 95-100° C. | EONB 130-140° C. |
| Overhead Temperature: | EPD 65-70° C. | EONB 90-100° C. |
| System Vacuum: | EPD 2-3 mmHg | EONB 0.15-0.20 mmHg |
| Reflux Ratio: | EPD 2:1 | EONB 1:1 |

TABLE B

| Distillation 2nd Pass | |
| --- | --- |
| Medium Purity EONB Charge | 6.66 kg |
| Still Pot Temperature: | EONB 120-130° C. |
| Overhead Temperature: | EONB 89-92° C. |
| System Vacuum: | EONB 0.10-0.20 mmHg |
| Reflux Ratio: | EONB 3:1 |

Example A18

Preparation of 3,4-dihydronaphthalic methylmaleimide norbornene (DHNMINB)

Norbornene methylamine (60.0 mL, 0.49 mol) in 57.5 g of toluene was added drop wise to a 3,4-dihydronaphthalic anhydride (80.1 g, 0.40 mol) dissolved in approximately 290 g to toluene with vigorous stirring. A light tan solid formed. The mixture was heated. Between 65-95° C. the solid dissolved to give a clear, dark brown solution. The solution was heated to reflux and water was removed using a Dean-Stark trap (8.6 g) over the course of 6 hours. The reaction mixture was cooled and then concentrated using a rotary evaporator to a very viscous brown oil (170 g). A portion of the oil (80 g) was purified by silica gel column chromatography using 5:1 mixture of hexanes and ethyl acetate as eluent. Twenty five, 125 mL fractions were collected. Fractions 4-12 were combined and concentrated to dryness using a rotary evaporator to give a viscous yellow oil (19.7 g). $^1$H NMR confirmed the identity of the product as a mixture of DHNMINB.

Example A19

Preparation of Norbornene methoxyethyl acetate (NBCH$_2$GlyOAc)

An initial charge of 5.51 kg allyloxyethyl acetate was weighed into a reactor and heated to 210° C. 0.07 kg of allyloxyethyl acetate and 0.32 kg of dicyclopentadiene were premixed and charged to a metering vessel and then metered into the reactor at a constant flow rate over a 5 hour period once the reaction temperature was reached. At the end of the metering period the charge was allowed to cool to room temperature and analyzed by GC showing 29% norbornene methoxyethyl acetate with approximately 0.6% cyclopentadiene trimers and 0.9% tetracyclododecene methoxyethyl acetate; the remainder is mostly allyloxyethyl acetate (all results are GC area %). Purification of norbornene methoxyethyl acetate is accomplished by fractional vacuum distillation on a packed column. High purity distillation was conducted under vacuum in the range of 150 to 200 mTorr with an overhead temperature of 65 to 67° C. Approximately 80% of the contained norbornene was recovered at greater than 99% purity (based upon GC area %).

Example A20

2-propen-1-one, 1-(4-bicyclo[2.2.1]hept-5-ene-2-methoxyphenyl)-3-(4-methoxyphenyl)-(MCHMNB)

4'-Hydroxy-4-methoxychalcone: To a solution of sodium hydroxide (100 g, 2.50 mol) in 1.8 L of a 10:8 mixture of water and methanol was added 4-hydroxyacetophenone (136 g, 1.00 mol). After stirring at room temperature for 30 minutes, 4-Methoxybenzaldehyde (136 g, 1.00 mol) was added to this mixture. The reaction mixture was stirred at 50° C. oil bath for 16 hours. A clear yellow solution resulted which was allowed to stir at room temperature for 30 minutes. 1N HCl aq (500 mL) and 600 mL of a 1:1 mixture of dichloromethane and THF were added to result two layers. The organic layer was washed by saturated NaHCO$_3$ aq (300 mL×2) and water (300 mL×3) and evaporated to yield orange solid. This solid was washed by 300 mL of EtOAc two times. The resulted yellow solid was dried in vacuo. Yield 133 g (52%). $^1$H NMR (CDCl$_3$): δ3.85 (s, 3H), 6.93 (m, 4H), 7.47 (d, 1H), 7.50 (d, 2H), 7.75 (d, 1H), 7.96 (d, 2H).

2-propen-1-one, 1-(4-bicyclo[2.2.1]hept-5-ene-2-methoxyphenyl)-3-(4-methoxyphenyl)-(MCHMNB): To a solution of K$_2$CO$_3$ (18.0 g, 0.130 mol) in 200 mL of DMF were added 4'-hydroxy-4-methoxychalcone (25.4 g, 0.100 mol) and bicycle[2.2.1]hept-5-ene-2-methyl trifluoromethanesulfonate (23.3 g, 0.115 mol). This reaction mixture was stirred at 100° C. oil bath for 24 hours. An orange suspension resulted which allowed to stir at room temperature for 1 hour. 300 mL of dichloromethane and 300 mL of 1N HCl aq were added to result two layers. The organic layer was washed by sat. NaHCO$_3$ aq (200 mL) and water (200 mL×5), then evaporated to yield orange solid. This solid was washed by 300 mL of EtOAc two times. The resulted pale yellow solid was dried in vacuo. Yield 16.0 g (44%). The structure was determined by $^1$H NMR (CDCl$_3$).

Example A21

Preparation of Norbornenylethyl-3,4-dimethyl-1H-pyrrole-2,5-dione (DMMIEtNB)

Cyanomethylnorbornene: A 1 L, 4 neck RBF was equipped with a thermowell, condenser with a nitrogen inlet, stopper and mechanical stirrer. The RBF was charged with chloromethylnorbornene (120 g, 0.84 mol, 95.6% pure), 400 mL DMSO and solid NaCN (74.2 g, 1.51 mol). An extra 20 mL DMSO was added to rinse in the NaCN. The reaction mixture was stirred @ ~90° C. for 72 hours. GC analysis of an aliquot indicated all starting material had been consumed and the reaction was completed. The reaction mixture was cooled to room temperature. Approximately 200 mL water was poured into the flask and diluted with 200 mL MTBE. The organic phase was separated and the aqueous layer was re-extracted with (3×300 mL) MTBE. The organic phases were combined and washed with (3×500 mL) tap water until the aqueous wash reached pH=6. The MTBE solution was dried over anhydrous sodium sulfate overnight, filtered, and rotary evaporated, and dried under high vacuum (0.94 torr) for 3 h at bath temp 50° C. to give 112 g (100% yield) with 95.8% purity by GC. Proton NMR analysis indicated the material contained ~1% MTBE. The crude dark brown product was used for the next reaction without further purification. Data: GC analysis on a DB5 Column, 30 meters, 0.32 mm ID, 0.25 µm film, 75° C. to 300° C. at 25° C./min., hold for 2 min at 300° C., Injector temperature: 275° C., Detector temperature: 350° C.

Aminopropylnorbornene: A 3 L, 4 neck RBF was equipped with a thermowell, condenser with a nitrogen inlet, addition funnel and mechanical stirrer. The RBF was charged with lithium aluminum hydride (LAH) pellets (67 g, 1.77 mol) and mechanically stirred overnight with 840 mL methyl-tert-butyl ether (MTBE). A thick paste resulted and additional 200 mL of MTBE were added to the LAH solution. The resulting dispersion was chilled to −5.5° C. with a methanol-ice bath. The addition funnel was charged with cyanomethylnorbornene (112 g, 0.84 mol) in 500 mL MTBE and added dropwise at a rate to maintain the reaction temperature below −2° C. (Note: the reaction temperature should not be allowed to go below −5° C. to avoid accumulation of unreacted starting material and causing a potentially hazardous induction period.) Addition time was 1 h. The cooling bath was removed and the mixture was then heated to 35° C. over a 1.5 h period and stirred at 35° C. for an additional 30 minutes when GC analysis indicated no starting material remained. The mixture was cooled to −15° C. (methanol/ice bath) and 125 ml of distilled water was added very slowly over 3 hours 30 min, keeping the temperature below 0° C. This mixture was then diluted with 500 mL MTBE and a second 125 ml portion of water was added to precipitate the lithium and aluminum by-products as a free flowing white solid. After stirring 10 minutes, the lithium and aluminum by-products were allowed to settle and the MTBE phase was decanted. The lithium and aluminum residues were covered with additional (2×500 mL) MTBE, then mixed, settled, and the MTBE decanted. The MTBE decants were combined, dried over sodium sulfate, then filtered, and rotary evaporated, and dried under high vacuum (0.94 torr) for 3 h at bath temp 50° C. to give 104 g (90% yield) of a light yellow viscous oil. GC analysis indicated 96.4% purity with 2.9% DCPD. $^1$H NMR analysis indicated the material contained ~1% MTBE. The crude product was used for the next reaction without further purification. Data: GC analysis on a DB5 Column, 30 meters, 0.32 mm ID, 0.25 µm film, 75° C. to 300° C. at 15° C./min., Injector temperature: 275° C., Detector temperature: 350° C., Retention time: 5.280 minute.

DMMIEtNB: A 3 L, 4 neck RBF was equipped with a thermowell, Dean Stark trap connected to condenser with a nitrogen inlet, addition funnel and mechanical stirrer. The RBF was charged with 600 mL toluene followed by dimethylmaleic anhydride (DMMA, 92 g, 0.73 mol) with stirring. The mixture cooled to 14° C. as the dimethylmaleic anhydride dissolved in the toluene. The mixture was warmed to 25° C. to clear the solution. The addition funnel was charged with aminoethylnorbornene (104 g, 0.73 mol, 96.4% pure) in 100 mL toluene and added drop wise over 15 minutes. An additional 130 mL toluene was added to rinse in the aminoethylnorbornene and the addition funnel was replaced by a stopper. The mixture immediately exothermed to 50° C. and a white thick precipitate was observed. The mixture was heated carefully (to avoid excessive foaming) to reflux over 30 minutes and refluxed for 2 hours. A clear solution was observed and 13.1 mL water (99.5% of theoretical) was collected in the Dean Stark trap. GC analysis revealed the reaction was complete (94.9% product with 1.8% DCPD and 1.7% unknown impurity at 7.8 minute). The reaction mixture was cooled to room temperature and transferred to 5 L flask and concentrated on the rotary evaporator. The crude product was further dried under high vacuum (0.94 torr) at 75° C. bath temperature on the rotary evaporator for 5 h and gave 179 g of crude product as dark orange color viscous oil. GC analysis indicated the purity of crude product after drying under high vacuum was 97.4% with 0.3% DCPD and 1.8% unknown impurity. The 179 g of crude product was adsorbed in 179 g of silica gel and chromatographed over 500 g of silica gel eluting with heptane (8 L), 2% EtOAc in heptane (2 L), 2.5% EtOAc in heptane (2 L), 3% EtOAc in heptane (4 L) and 5% EtOAc in heptane (1 L). The concentrated purified fractions yielded 163.5 g of product as colorless viscous oil (91% yield) with 99.8% purity by GC. $^1$H NMR and mass spectrum were consistent with the structure. Data: GC analysis done on a DB5 Column, 30 meters, 0.32 mm ID, 0.25 µm film, 75° C. to 300° C. at 15° C./min, 2 min hold at 300° C., Injector temperature: 275° C., Detector temperature: 350° C., Retention time: 11.893 minute.

Example A22

Norbornenylpropyl-3,4-dimethyl-1H-pyrrole-2,5-dione, (DMMIPrNB)

Cyanoethylnorbornene: A 1 L, 4 neck RBF was equipped with a thermowell, condenser with a nitrogen inlet, stopper and mechanical stirrer. The RBF was charged with chloroethylnorbornene (100 g, 0.64 mol), 300 mL DMSO and solid NaCN (43.8 g, 0.89 mol). An extra 20 mL DMSO was added to rinse in the NaCN. The reaction mixture was stirred at ~80° C. for 2 hours. GC analysis of an aliquot indicated all starting material had been consumed and the reaction was completed. The reaction mixture was cooled to room temperature. Approximately 200 mL water was poured into the flask and diluted with 100 mL MTBE. The organic phase was separated and the aqueous layer was re-extracted with (3×200 mL) MTBE. The organic phases were combined and washed with (3×500 mL) tap water until the aqueous wash reached pH=6. The MTBE solution was dried over anhydrous sodium sulfate overnight, filtered, and rotary evaporated to give 93.5 g (99.5% yield) with 99.3% purity by GC. NMR analysis indicated the material contained ~1% MTBE. The crude product was used for the next reaction without further purification. Data: GC analysis done on a DB5 Column, 30 meters, 0.32 mm ID, 0.25 µm film, 75° C. to 300° C. at 25° C./min., hold for 2 min at 300° C., Injector temperature: 275° C., Detector temperature: 350° C.

Aminopropylnorbornene: A 3 L, 4 neck RBF was equipped with a thermowell, condenser with a nitrogen inlet, addition funnel and mechanical stirrer. The RBF was charged with LAH pellets (50.6 g, 1.33 mol) and mechanically stirred overnight with 800 mL MTBE. A thick paste resulted due to some loss of solvent. An additional 200 mL of MTBE were added and the resulting dispersion was chilled to −6° C. with a methanol-ice bath. The addition funnel was charged with cyanoethylnorbornene (93.5 g, 0.635 mol) in 500 mL MTBE and added dropwise at a rate to maintain the reaction temperature below −2° C., but warmer than −5° C. The addition of cyanoethylnorbornene occurred over a 1 h period. The cooling bath was removed and the mixture was then heated to 35° C. over a 1.5 h period and stirred at 35° C. for additional 30 minutes when GC analysis indicated no starting material remained. The mixture was cooled to −15° C. (methanol/ice bath) and 150 ml of distilled water was added very slowly over 3 hours 30 min, keeping the temperature below 0° C. This mixture was then diluted with 250 mL MTBE and a second 250 ml portion of water was added to precipitate the lithium and aluminum by-products as free flowing white solid. After stirring 10 minutes, the lithium and aluminum by-products were allowed to settle and the MTBE phase was decanted. The lithium and aluminum residues were covered with additional 500 mL MTBE, then mixed, settled, and the MTBE decanted. The MTBE decants were combined, dried over sodium sulfate, then filtered, and rotary evaporated to give 92 g (95.8% yield) of colorless viscous oil. GC analysis indicated 99.7% purity. $^1$H NMR analysis indicated the material contained ~1% MTBE. The crude $NB(CH_2)_3NH_2$ product was used for the next reaction without further purification. Data: GC analysis done on a DB5 Column, 30 meters, 0.32 mm ID, 0.25 μm film, 75° C. to 300° C. at 15° C./min., Injector temperature: 275° C., Detector temperature: 350° C., Retention time: 6.225 minute.

DMMIPrNB: A 3 L, 4 neck RBF was equipped with a thermowell, Dean Stark trap connected to condenser with a nitrogen inlet, addition funnel and mechanical stirrer. The RBF was charged with 500 mL toluene followed by dimethylmaleic anhydride (DMMA, 76.7 g, 0.60 mol) with stirring. The mixture self-cooled to about 14° C. as the dimethylmaleic anhydride dissolved in the toluene. The mixture was warmed to 25° C. to clear the solution. The addition funnel was charged with aminopropylnorbornene (92 g, 0.60 mol) in 100 mL toluene and added dropwise over 15 minutes. An additional 100 mL toluene was added to rinse in the aminopropylnorbornene and the addition funnel was replaced by a stopper. The mixture immediately exothermed to 53° C. and a white precipitate was observed. The mixture was heated carefully (to avoid excessive foaming) to reflux over 20 minutes and refluxed for 3 hours. A clear solution was observed and 10.7 mL water (98.2% of theoretical) was collected in the Dean Stark trap. GC analysis revealed the reaction was complete (98.2% product and 0.95% DMMA). The reaction mixture was cooled to room temperature and transferred to 5 L flask and concentrated on the rotary evaporator. The crude product was further dried under high vacuum (0.94 torr) at 50° C. bath temperature on the rotary evaporator through overnight and gave 122 g of crude product as light yellow viscous oil. GC analysis indicates the purity of crude product was 98.8% and 0.68% DMMA as major impurity. The 122 g of crude product was adsorbed in 122 g of silica gel and chromatographed over 360 g of silica gel eluting with heptane (4 L), 2% EtOAc in heptane (4 L), 2.5% EtOAc in heptane (4 L) and 3% EtOAc in heptane (4 L). The concentrated purified fractions yielded 115 g of product as colorless viscous oil (73.2% yield) with 100% purity by GC. $^1$H NMR and mass spectrum were consistent with the structure. Data: GC analysis done on a DB5 Column, 30 meters, 0.32 mm ID, 0.25 μm film, 75° C. to 300° C. at 15° C./min, 2 min hold at 300° C., Injector temperature: 275° C., Detector temperature: 325° C., Retention time: 12.634 minute.

Example A23

Tricyclo[4.2.1.0$^{2,5}$]non-7-ene-3,3,4-trifluoro 4-(perfluoro(3-methyl-1,4-dioxanon)) (DiOxoTCN)

Norbornadiene (77 g, 0.84 mol) and perfluoro(5-methyl-3,6-dioxanon-1-ene or 3-(pentafluorophenyl)pentafluoroprop-1-ene (93 g, 0.21 mol) were premixed in a 250 mL glass vial and transferred to a 0.5 L stainless steel reactor. The reactor was sealed and heated to 190° C. for 24 hours while stirring under a nitrogen blanket. The reactor was cooled to ambient temperature and the reaction mixture (169 g) was concentrated by rotovap to obtain 140 g of the crude product. The crude product was fractionally distilled to obtain 65 g (57% yield) of the desired product in more than 87% purity by GC area percentages.

Example A24

Tricyclo[4.2.1.0$^{2,5}$]non-7-ene-3,3,4-trifluoro 4-(perfluorophenylmethyl)) (PFBTCN)

Norbornadiene (1.2 g, 0.013 mol) and 3-(pentafluorophenyl)pentafluoroprop-1-ene (0.99 g, 0.0033 mol) premixed in a glass vial and transferred to a stainless steel reactor equipped with a glass insert. The reactor was sealed and heated to 190° C. for 24 hours. The reactor was cooled to ambient temperature and the reaction mixture analyzed for product identification by gas chromatography (GC) and gas chromatography-mass spectrometry (GC-MS). The desired product in the reaction mixture constituted 45.6% of the reaction mixture by GC area percentages.

Example A25

Synthesis of Tetraoxatetradecyl Norbornene

To an 8-liter stainless steel autoclave reactor was charged 3.75 kg (18.4 mol) allyl triethylene glycol methyl ether. Stirring was started, and the reactor evacuated of air and padded with 5 psig nitrogen. Heating to 200° C. commenced, and upon achieving 200° C., the reactor was held for 3.75 hours at this temperature. During this time, a mixture of 0.06 kg (0.3 mol) allyl triethylene glycol methyl ether and 0.21 kg (1.6 mol) dicyclopentadiene were added to the reactor at a constant rate of 1.19 g/min. At the end of the addition, the reactor was cooled to ambient temperature and discharged. The major identified components of the charge, as measured by GC area, were: 75% allyl triethylene glycol methyl ether, and 23% tetraoxatetradecyl norbornene. The charge was distilled and produced approximately 0.4 kg tetraoxatetradecyl norbornene with assay greater than 98% (GC area).

Example A26

Synthesis of Trioxanonanyl Norbornene

To an 8-liter stainless steel autoclave reactor was charged 3.4 kg (21.2 mol) allyl diethylene glycol methyl ether. Stirring was started, and the reactor evacuated of air and padded with 5 psig nitrogen. Heating to 200° C. commenced, and upon achieving 200° C., the reactor was held for 4.25 hours at this temperature. During this time, a mixture of 0.06 kg (0.4 mol) allyl diethylene glycol methyl ether and 0.24 kg (1.8 mol) dicyclopentadiene were added to the reactor at a constant rate of 1.17 g/min. At the end of the addition, the reactor was cooled to ambient temperature and discharged. The major identified components of the charge, as measured by GC area, were: 72% allyl diethylene glycol methyl ether, and 26% trioxanonanyl norbornene. The charge was distilled and produced approximately 0.5 kg trioxanonanyl norbornene with assay greater than 99% (GC area).

Example A27

Synthesis of Tetraoxatetradecyl Norbornene (NBTODD)

To an 8-liter stainless steel autoclave reactor was charged 3.75 kg (18.4 mol) allyl triethylene glycol methyl ether. Stirring was started, and the reactor evacuated of air and padded with 5 psig nitrogen. Heating to 200° C. commenced, and upon achieving 200° C., the reactor was held for 3.75 hours at this temperature. During this time, a mixture of 0.06 kg (0.3 mol) allyl triethylene glycol methyl ether and 0.21 kg (1.6 mol) dicyclopentadiene were added to the reactor at a constant rate of 1.19 g/min. At the end of the addition, the reactor was cooled to ambient temperature and discharged. The major identified components of the charge, as measured by GC area, were: 75% allyl triethylene glycol methyl ether, and 23% tetraoxatetradecyl norbornene. The charge was distilled and produced approximately 0.4 kg tetraoxatetradecyl norbornene with assay greater than 98% (GC area).

B. Polymer Synthesis

In each of the tables provided below, unless otherwise specifically noted, the amount of catalyst and each monomer reported is presented as grams (g); the yield is reported as a percentage (%), the molecular weight ($M_w$) is reported, PDI (polydispersity index) as the ratio $M_w/M_n$ and the molar composition of the polymer (A/B or A/B/C) determined by $^1$H NMR.

For each of Examples B1-B5, an amount of the specific monomers indicated were dissolved in a mixture of toluene and methyl ethyl ketone (72.9 mL and 12.8 mL, respectively) contained in a vial equipped with a stir bar. For B6, the monomer and catalyst were both dissolved in anhydrous ααα-trifluorotoluene (98.4 mL and 6.3 mL, respectively). The vial was sparged with nitrogen to remove residual oxygen and sealed. The amount of catalyst, (η6-toluene)Ni($C_6F_5$)$_2$, indicated in Table 1 was dissolved in toluene (5 mL) in a nitrogen purged glove box.

Example B1

Co-Polymerization of MeOAcNB and DMMIMeNB

The monomer solution was heated to 45° C. and catalyst mixture described above was injected into the heated vial. The solution was maintained at temperature for 17 hours with stirring after which it was allowed to cool to room temperature. Residual catalyst was removed and the polymer precipitated by pouring the reaction mixture into an excess of ethanol. After isolating the polymer by filtration, it was dried in a vacuum oven at 60° C.

Example B2

Co-Polymerization of BuNB and DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

Example B3

Co-Polymerization of DecNB and DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/\methanol. After isolating the polymer by filtration, it was dried in a vacuum oven at 65° C.

Example B4

Homopolymerization of DMMIMeNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

Example B5

Homopolymerization of FPCNB

The monomer solution was heated to 45° C. and catalyst mixture described above was injected into the heated vial. The solution was maintained at temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

Example B6

Homopolymerization of C8AcNB

The monomer solution was held at room temperature and catalyst mixture described above was injected into the vial. The solution was maintained at room temperature for 1.5 hours with stirring after which it was allowed to cool to room temperature. Residual catalyst was removed and the polymer precipitated by pouring the mixture into an excess of 75/25 acetone/methanol. After isolating the polymer by filtration, it was dried in a vacuum oven at 65° C.

TABLE 1

| Ex | Monomer A | Monomer B | Catalyst | Yield | $M_w * 10^{-3}$ | PDI | A/B |
|---|---|---|---|---|---|---|---|
| B1 | MeOAcNB (10.8) | DMMIMeNB (15.0) | 0.29 | 76 | 84 | 1.77 | 51/49* |

TABLE 1-continued

| Ex | Monomer A | Monomer B | Catalyst | Yield | $M_w * 10^{-3}$ | PDI | A/B |
|---|---|---|---|---|---|---|---|
| B2 | DMMIMeNB (19.43) | BuNB (5.41) | 0.39 | 85 | 76 | 1.34 | 65/35 |
| B3 | DMMIMeNB (17.81) | DecNB (7.74) | 0.36 | 37 | 65 | 1.48 | 67/33 |
| B4 | DMMIMeNB (25.44) | — | 0.36 | 74 | 66 | 2.00 | N/A |
| B5 | FPCNB (21.62) | — | 0.39 | 43 | 53 | 1.37 | N/A |
| B6 | C8AcNB (41.62) | — | 0.39 | 37 | 300 | 1.72 | N/A |

*determined by $^{13}$C NMR.

For each of Examples B7-B19, the amount of NBC$_4$F$_9$ (NBCH$_2$C$_6$F$_5$ in Example B13) indicated in Table 2, below, was dissolved in the indicated amount of anhydrous trifluorotoluene (trifluorotoluene and toluene in Examples B8 and B9) contained in a vial equipped with a stir bar. The vial was sparged with nitrogen to remove residual oxygen and sealed. For Examples B11, B12 and B17-B19 the indicated amount of DANFABA (dimethylanilinium tetrakis(pentafluorophenyl)borate) and (acetonitrile)bis(t-butyldicyclohexylphosphine)palladium (acetate)tetrakis(perfluorophenyl)borate (Pd 1394) were added to the vial after sparging but before the vial was sealed. For Examples B7-B10 and B13-16, the indicated amount of catalyst, ($\eta^6$-toluene)Ni(C$_6$F$_5$)$_2$ was dissolved in the indicated amount of toluene in a nitrogen purged glove box and injected into the sealed vial. For Examples 12 and 17-19, the indicated amount of formic acid was injected rather than catalyst. Table 2 also provides the yield (%) for each polymer as well as M$_w$ and PDI where available.

Example B7

Homopolymerization of NBC$_4$F$_9$

The monomer solution was then stirred at ambient temperature and the catalyst solution injected into the vial. The mixture was maintained at temperature for 2 hours with stirring after which 2 mL of distilled water added to the vial. After residual catalyst removal and precipitation of the polymer into methanol, the polymer was isolated and dried in a vacuum oven at 70-80° C.

Example B8

Homopolymerization of NBC$_4$F$_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

Example B9

Homopolymerization of NBC$_4$F$_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

Example B10

Homopolymerization of NBC$_4$F$_9$

The monomer solution was then stirred at 60° C. and the catalyst solution injected into the vial. The mixture was maintained at temperature for 1.5 hours with stirring after which 2 mL of distilled water added to the vial. After residual catalyst removal and precipitation of the polymer into methanol, the polymer was isolated and dried in a vacuum oven at 70-80° C.

Example B11

Homopolymerization of NBC$_4$F$_9$

The monomer solution was then stirred at 90° C. for 16 hours. After residual catalyst removal and precipitation of the polymer into 90/10 methanol/water, the polymer was isolated and dried in a vacuum oven at 70-80° C.

Example B12

Homopolymerization of NBC$_4$F$_9$

The monomer solution was then stirred at 90° C. for 16 hours. After residual catalyst removal and precipitation of the polymer into 90/10 methanol/water, the polymer was isolated and dried in a vacuum oven at 70-80° C.

Example B13

Homopolymerization of NBCH$_2$C$_6$F$_5$

The monomer solution was then stirred at ambient temperature and the catalyst solution injected into the vial. The mixture was maintained at temperature for 5 minutes with stirring after which 2 mL of distilled water added to the vial. After residual catalyst removal and precipitation of the polymer into methanol, the polymer was isolated and dried in a vacuum oven at 70-80° C.

Example B14-16

Homopolymerization of NBC$_4$F$_9$

The monomer solutions were then stirred at 65° C. and the catalyst solutions injected into the vials. The mixtures were maintained at temperature for 2 hours. After residual catalyst removal and precipitation of the polymer s into methanol, the polymers were isolated and dried in a vacuum oven at 70-80° C.

Example B17-19

Homopolymerization of $NBC_4F_9$

The monomer solutions were then stirred at 90° C. for 16 hours. After residual catalyst removal and precipitation of the polymers into 90/10 methanol/water, the polymers were isolated and dried in a vacuum oven at 70-80° C.

TABLE 2

| Ex. | Monomer | Monomer/ solvent | Catalyst solvent/ Cocatalyst | Catalyst | Yield | $M_w * 10^{-3}$ | PDI |
|---|---|---|---|---|---|---|---|
| B7 | $NBC_4F_9$ (20.0) | 60 | 3.5 | 0.34 | 80 | 276 | 1.68 |
| B8 | $NBC_4F_9$ (10.0) | 30/10 | 6.9 | 0.68 | 71 | 215 | 1.97 |
| B9 | $NBC_4F_9$ (10.0) | 67.5/22.5 | 6.9 | 0.68 | 71 | 176 | 2.00 |
| B10 | $NBC_4F_9$ (10.0) | 40 | 6.9 | 0.68 | 70 | 130 | 1.59 |
| B11 | $NBC_4F_9$ (9.98) | 22.8 | †0.26 | 0.15 | 61 | 468 | 2.81 |
| B12 | $NBC_4F_9$ (20.3) | 46.7 | ††0.39/0.02 | 0.23 | 50 | 162 | 1.81 |
| B13 | $NBCH_2C_6F_5$ (20.0) | 80 | 4.0 | 0.39 | 80 | 306 | 7.15 |
| B14 | $NBC_4F_9$ (25.0) | 100 | 3.9 | 0.39 | 84 | 312 | 1.78 |
| B15 | $NBC_4F_9$ (25.0) | 100 | 7.8 | 0.78 | 84 | 331 | 1.73 |
| B16 | $NBC_4F_9$ (25.0) | 100 | 15.5 | 1.55 | 84 | 292 | 1.85 |
| B17 | $NBC_4F_9$ (31.2) | 72.4 | ††0.24/0.14 | 0.14 | 48 | 241 | 1.97 |
| B18 | $NBC_4F_9$ (31.2) | 72.4 | ††0.24/0.28 | 0.14 | 61 | 116 | 1.63 |
| B19 | $NBC_4F_9$ (31.2) | 72.4 | ††0.24/0.09 | 0.14 | 45 | 77.3 | 1.62 |

†DANFABA Cocatalyst
††DANFABA Cocatalyst/Formic Acid

For each of Examples B20-B41, the amount of monomers indicated in Table 3, below, were dissolved in the amount of solvent shown below and charged to a vial equipped with a stir bar (for B31 a glass reactor was used). The vial/reactor was sparged with nitrogen to remove residual oxygen and sealed. The indicated amount of catalyst, $(\eta^6\text{-toluene})Ni(C_6F_5)_2$ was dissolved in the indicated amount of toluene in a nitrogen purged glove box and injected into the sealed vial/reactor. Table 3 also provides the yields of polymers obtained for each synthesis as well as $M_w$, and PDI.

Examples B20-21

Polymerization of $NBC_4F_9$ and DMMIMeNB

The monomer solutions (60.0 g toluene for B20 and 75.0 g for B21) were stirred at ambient temperature and the catalyst solutions were injected into the vials. The mixture B20 was maintained at temperature for 3 hours with stirring after which 2 mL of distilled water added to the vial. The B21 reaction mixture was maintained at temperature for 16 hours. After residual catalyst removal and precipitation of the polymers into methanol, the polymers were isolated and dried in a vacuum oven at 70-80° C.

Example B22

Polymerization of $NBC_4F_9$ and DMMIMeNB

The monomer solution (toluene (56.3 g) and trifluorotoluene (18.8 g)) was stirred at ambient temperature and the catalyst solution was injected into the vial. The mixture was maintained at temperature for 16 hours with stirring. After residual catalyst removal and precipitation of the polymer into methanol, the polymer was isolated and dried in a vacuum oven at 70-80° C.

Example B23

Polymerization of $NBCH_2C_6F_5$ and DMMIMeNB

The monomer solution (60.0 g of toluene) was stirred at ambient temperature and the catalyst solution was injected into the vial. The mixture was maintained at temperature for 2 hours with stirring after which 2 mL of distilled water added to the vial. After residual catalyst removal and precipitation of the polymer into methanol, the polymer was isolated and dried in a vacuum oven at 70-80° C.

Example B24

Polymerization of $NBC_4F_9$ and PPVENBB

The monomer solution (trifluorotoluene (40.0 g), toluene (32.0 g) and methyl ethyl ketone (8.0 g)) was stirred at 45° C. and the catalyst solution was injected into the vial. The mixture was maintained at temperature for 16 hours. After residual catalyst removal and precipitation of the polymer into methanol, the polymer was isolated and dried in a vacuum oven at 70-80° C.

Example B25

Polymerization of NBC$_4$F$_9$ and MeCoumNB

The monomer solution (trifluorotoluene (75 g)) was stirred at 55° C. and the catalyst solution was injected into the vial. The mixture was maintained at temperature for 16 hours. After residual catalyst removal and precipitation of the polymer into methanol, the polymer was isolated and dried in a vacuum oven at 70-80° C.

Example B26-B29

Polymerization of BuNB or DecNB and MeOCinnNB

The monomer solutions (toluene (103.8 g) and methyl ethyl ketone (18.3 g)) were stirred at ambient temperature and the catalyst solutions were injected into the vials. The mixtures were maintained at temperature for 16 hours with stirring. After residual catalyst removal and precipitation of the polymers into methanol, the polymers were isolated and dried in a vacuum oven at 70-80° C.

Example B30

Polymerization of DecNB and PhIndNB

The monomer solution (toluene (68.0 g) and methyl ethyl ketone (12.0 g)) were stirred at 50° C. and the catalyst solution was injected into the vials. The mixtures were maintained at temperature for 16 hours. After residual catalyst removal and precipitation of the polymers into methanol, the polymers were isolated and dried in a vacuum oven at 70-80° C.

Example B31

Polymerization of BuNB and DMMIMeNB

The monomer solution (toluene (488 g) and methyl ethyl ketone (90.0 g)) was stirred at 45° C. and the catalyst solution was injected into the reactor. The mixture was maintained at temperature for 3 hours. After residual catalyst removal and separation of the polymer into two batches each of a 50/50 ethanol/1-butanol mixture, the two batches were solvent exchanged into 2-heptanone.

Example B32-33

Polymerization of DMMIMeNB and HexNB or OctNB

The monomer solutions ((98.0 g) and methyl ethyl ketone (18.0 g)) were stirred at 45° C. and the catalyst solutions were injected into the vials. The mixtures were maintained at temperature for 3 hours. After residual catalyst removal and precipitation of the polymers into 95/5 methanol/water, the polymers were isolated and dried in a vacuum oven at 60-70° C.

Example B34-37

Polymerization of DMMIMeNB, DecNB and AkSiNB

The monomer solutions (toluene (76.5 g) and methyl ethyl ketone (13.5 g)) were stirred at ambient temperature and the catalyst solutions were injected into the vials. The mixtures were maintained at temperature for 45 hours. After residual catalyst removal and precipitation of the polymers into methanol the polymers were isolated and dried in a vacuum oven at 65-70° C.

Example B38-39

Polymerization of DMMIMeNB, DecNB, and NBTODD

The monomer solutions (toluene (63.8 g) and methyl ethyl ketone (11.3 g)) were stirred at 45° C. and the catalyst solutions injected into the vials. The mixtures were maintained at temperature for 3.5 hours for B38 and 16 hours for B39. After residual catalyst removal and precipitation of the polymers into methanol the polymers were isolated and dried in a vacuum oven at 70° C.

Example B40-41

Polymerization of DMMIMeNB NBCH$_2$C$_6$F$_5$ and MeOAcNB

The monomer solutions (toluene (195 g)) were stirred at 45° C. and the catalyst solutions were injected into the vials. The mixtures were maintained at temperature for 4.75 hours. After residual catalyst removal and precipitation of the polymers into 95/5 methanol/water the polymers were isolated and dried in a vacuum oven at 70° C.

TABLE 3

| Ex. | Monomer A | Monomer B | Mon. C | Catalyst/Solvent | Yield | $M_w * 10^{-3}$ | PDI | A/B/C |
|---|---|---|---|---|---|---|---|---|
| B20 | NBC$_4$F$_9$ (11.5) | DMMIMeNB (8.51) | — | 0.39/4.0 | 65 | 85.0 | 2.21 | 50/50 |
| B21 | NBC$_4$F$_9$ (14.4 g) | DMMIMeNB (10.6 g) | | 0.49/5.0 | 80 | 99.2 | 1.74 | 56/44 |
| B22 | NBC$_4$F$_9$ (20.1 g) | DMMIMeNB (4.95 g) | | 0.61/6.2 | 76 | 81.6 | 1.60 | 62/38 |
| B23 | NBCH$_2$C$_6$F$_5$ (10.8) | DMMIMeNB (9.18) | — | 0.42/4.3 | 80 | 108 | 3.27 | 50/50* |
| B24 | NBC$_4$F$_9$ (11.1 g) | PPVENB (13.9 g) | — | 0.51/6.1 | 88 | 164 | 1.45 | 50/50 |
| B25 | NBC$_4$F$_9$ (10.8 g) | MeCoumNB (9.24 g) | — | 1.47/14.9 | 60 | 787 | 1.43 | 43/57 |
| B26 | BuNB (8.97) | MeOCinnNB (16.0) | — | 0.43/4.3 | 72 | 239 | 3.51 | 55/45 |
| B27 | BuNB (14.2) | MeOCinnNB (10.8) | — | 0.48/4.9 | 76 | 305 | 3.36 | 74/21 |

TABLE 3-continued

| Ex. | Monomer A | Monomer B | Mon. C | Catalyst/Solvent | Yield | $M_w * 10^{-3}$ | PDI | A/B/C |
|---|---|---|---|---|---|---|---|---|
| B28 | DecNB (11.7) | MeOCinnNB (13.3) | — | 0.53/3.6 | 80 | 166 | 2.60 | 57/43 |
| B29 | DecNB (16.8) | MeOCinnNB (8.23) | — | 035/3.7 | 72 | 183 | 2.04 | 77/23* |
| B30 | DecNB (9.04) | PhIndNB (8.23) | — | 0.82/9.3 | 70 | 46.9 | 2.13 | 54/46 |
| B31 | BuNB (78.9) | DMMIMeNB (121.2) | — | 2.50/25.9 | 78 | 82.3 / 76.0 | 1.74 / 1.73 | 48/52 / 49/51 |
| B32 | HexNB (17.4) | DMMIMeNB (22.6) | — | 0.45/4.6 | 75 | 99.4 | 1.85 | 53/47 |
| B33 | OctNB (18.9) | DMMIMeNB (21.2) | — | 0.43/4.3 | 60 | 102 | 1.72 | 53/47 |
| B34 | DecNB (11.6) | DMMIMeNB (16.9) | AkSiNB (1.52) | 0.78/7.9 | 77 | 77.4. | 2.47 | 42/54/4† |
| B35 | DecNB (12.6) | DMMIMeNB (14.8) | AkSiNB (2.66) | 0.68/6.9 | 60 | 78.8 | 2.11 | 50/44/6† |
| B36 | DecNB (11.3) | DMMIMeNB (14.7) | AkSiNB (3.97) | 0.91/9.2 | 63 | 57.9 | 2.15 | 44/46/10† |
| B37 | DecNB (10.1) | DMMIMeNB (14.6) | AkSiNB (5.27) | 0.90/9.1 | 60 | 50.3 | 2.26 | 42/43/15† |
| B38 | DecNB (11.2) | DMMIMeNB (12.3) | NBTODD (1.44) | 0.38/3.8 | 68 | 88.6 | 2.03 | 47/47/6† |
| B39 | DecNB (12.1) | DMMIMeNB (7.32) | NBTODD (5.63) | 0.38/3.8 | 68 | 70.5 | 1.83 | 36/47/17† |
| B40 | NBCH$_2$C$_6$F$_5$ (12.1) | DMMIMeNB (20.5) | MeOAcNB (7.38) | 1.05/10.6 | 85 | 105 | 2.33 | 23/48/29† |
| B41 | NBCH$_2$C$_6$F$_5$ (16.3) | DMMIMeNB (13.8) | MeOAcNB (9.93) | 0.87/8.8 | 93 | 97.4 | 1.89 | 31/33/36† |

*Monomer Feed Ration
†Composition determined by $^{13}$C-NMR

For each of Examples B42-B47, the amount of monomers indicated in Table 4, below, were dissolved in the amount of solvent shown below and charged to a vial equipped with a stir bar. The vial/reactor was sparged with nitrogen to remove residual oxygen and sealed. The indicated amount of catalyst, (η6-toluene) Ni(C6F5)2 was dissolved in the indicated amount of toluene in a nitrogen purged glove box and injected into the sealed vial/reactor. Table 4 also provides the yields of polymers obtained for each synthesis as well as Mw, and PDI.

Example B42

Polymerization of DMMIMeNB, DecNB, and NBXOH

The amount of monomers indicated in Table 4, below, were dissolved in a mixture of toluene and methyl ethyl ketone (65.02 mL and 12.75 mL, respectively) contained in a vial equipped with a stir bar. The vial was sparged with nitrogen to remove residual oxygen and sealed. The amount of catalyst, ($\eta^6$-toluene)Ni(C$_6$F$_5$)$_2$, indicated in Table 4 was dissolved in toluene (2.59 mL) in a nitrogen purged glove box. The monomer solution was then heated to 45° C. and the catalyst solution injected into the heated vial. The mixture was maintained at temperature for 5 hours with stirring after which it was allowed to cool to room temperature. After residual catalyst removal and precipitation of the polymer into Methanol, the polymer was isolated and dried in a vacuum oven at 60° C.

Example B43

Polymerization of DMMIMeNB, DecNB, and NBXOH

The amount of monomers indicated in Table 4, below, were dissolved in a mixture of toluene and methyl ethyl ketone (59.76 mL and 12.03 mL, respectively) contained in a vial equipped with a stir bar. The vial was sparged with nitrogen to remove residual oxygen and sealed. The amount of catalyst, ($\eta^6$-toluene)Ni(C$_6$F$_5$)$_2$, indicated in Table 4 was dissolved in toluene (4.07 mL) in a nitrogen purged glove box. The monomer solution was then heated to 45° C. and the catalyst solution injected into the heated vial. The mixture was maintained at temperature for 16 hours with stirring after which it was allowed to cool to room temperature. After residual catalyst removal and precipitation of the polymer into Methanol, the polymer was isolated and dried in a vacuum oven at 60° C.

Example B44

Polymerization of PPVENB and DMMIMeNB

The amount of monomer indicated in Table 4, below, were dissolved in anhydrous trifluorotoluene (49.13 mL) contained in a vial equipped with a stir bar. The vial was sparged with nitrogen to remove residual oxygen and sealed. The amount of catalyst, ($\eta^6$-toluene)Ni(C$_6$F$_5$)$_2$, indicated in Table 4 was dissolved in anhydrous trifluorotoluene (7.50 mL) in a nitrogen purged glove box. The monomer solution was kept at room temperature and the catalyst solution injected into the vial. The mixture was stirred for 1 hour. After residual catalyst removal and precipitation of the polymer into Methanol, the polymer was isolated and dried in a vacuum oven at 60° C.

Example B45

Polymerization of PPVENB and DMMIMeNB

The amount of monomer indicated in Table 4, below, were dissolved in anhydrous trifluorotoluene (56.15 mL) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 4 was dissolved in anhydrous trifluorotoluene (7.50 mL) in a nitrogen purged glove box. The monomer solution was kept at room temperature and the catalyst solution injected into the vial. The mixture was stirred for 1 hour. After residual catalyst removal and precipitation of the polymer into Methanol, the polymer was isolated and dried in a vacuum oven at 60° C.

Example B46

Polymerization of BuNB and MeOCinnNB

The amounts of monomer indicated in Table 4, below, were dissolved in a mixture of toluene (140.7 mL) and ethyl acetate (25.3 mL) contained in a vial equipped with a stir bar. The vial was sparged with nitrogen to remove residual oxygen and sealed. The amount of catalyst, ($\eta^6$-toluene)Ni ($C_6F_5$)$_2$, indicated in Table 4 was dissolved in toluene (9.69 mL) in a nitrogen purged glove box. The monomer solution was heated to 45° C. The catalyst solution was then injected into the reaction vessel and the mixture was stirred (45° C., 3 hours). After residual catalyst removal and precipitation of the polymer into a mixture of acetone and methanol (75:25), the polymer was isolated and dried in a vacuum oven at 60° C.

Example B47

Homopolymerization of EtCoumNB

In a nitrogen purged glove box, the amount of monomer indicated in Table 4, below, was dissolved in anhydrous dichloroethane (21.9 mL) contained in a vial equipped with a stir bar. The amount of catalyst, ($\eta^6$-toluene)Ni($C_6F_5$)$_2$, indicated in Table 4 was dissolved in toluene (1.61 mL) in a nitrogen purged glove box. The monomer solution was heated to 45° C. The catalyst solution was then injected into the reaction vessel and the mixture was stirred (45° C., 3 hours).

stir bar. The vial/reactor was sparged with nitrogen to remove residual oxygen and sealed. The indicated amount of catalyst, ($\eta^6$-toluene) Ni($C_6F_5$)$_2$ was dissolved in the indicated amount of toluene in a nitrogen purged glove box and injected into the sealed vial/reactor. Table 5 also provides the yields of polymers obtained for each synthesis as well as $M_w$, and PDI.

Example B48-B53

Polymerization of DMMIMeNB with Either BuNB or DecNB

The amounts of monomers indicated in Table 5, below, were dissolved in toluene (170 g) and methyl ethyl ketone (31 g) contained in vials equipped with a stir bar. The vials were sparged with nitrogen to remove residual oxygen and sealed. The amounts of catalyst, ($\eta^6$-toluene)Ni($C_6F_5$)$_2$, indicated in Table 5 were dissolved in toluene (7-9 g) in a nitrogen purged glove box. The monomer solutions were then stirred at 45° C. and the catalyst solutions injected into the vials. The mixtures were maintained at temperature for 1-2 hours. After residual catalyst removal and precipitation of the polymers into methanol the polymers were isolated and dried in a vacuum oven at 70° C.

Example B54-B55

Polymerization of BuNB and DCPD

The amounts of monomer s indicated in Table 5, below, were dissolved in toluene (30 g) contained in vials equipped with a stir bar. The vials were sparged with nitrogen to remove residual oxygen and sealed. In a glove box, [Li (OEt2)2.5][B($C_6F_5$)$_4$] (LiFABA) (Boulder Scientific Company, Mead, Colo.) (0.009 g) was added to the vials. Next hexene-1 (1.85 g) was added to the vials. The vials were heated to 80° C. To the vials was added (allyl)palladium (trinaphthylphosphine)(trifluoroacetate) in the amounts indicated in Table 5 in 2 g of toluene. The mixtures were maintained at temperature for 17 hours. After cooling the

TABLE 4

| Ex. | Monomer A | Monomer B | Monomer C | Catalyst | Yld | $M_w * 10^{-3}$ | PDI | A/B/C |
|---|---|---|---|---|---|---|---|---|
| B42 | DMMIMeNB (11.56) | DecNB (10.55) | NBXOH (0.76) | 0.22 | 63 | 69.0 | 1.60 | 46/43/11 |
| B43 | DMMIMeNB (11.56) | DecNB (7.03) | NBXOH (3.04) | 0.35 | 63 | 33.6 | 1.65 | 51/39/10 |
| B44 | PPVENB (13.66) | DMMIMeNB (8.10) | — | 0.34 | 78 | 183 | 1.86 | 56/44 |
| B45 | PPVENB (20.49) | DMMIMeNB (4.05) | — | 0.34 | 94 | 143 | 1.62 | 92/8 |
| B46 | BuNB (3.83) | MeOCinnNB (17.04) | — | 0.82 | 74 | 78.0 | 2.04 | 30/70 |
| B47 | EtCoumNB (4.00) | — | — | 0.14 | | 10.2 | | |

For each of Examples B48-B53, the amount of monomers indicated in Table 5, below, were dissolved in the amount of solvent shown below and charged to a vial equipped with a reaction mixture, they were diluted with THF (150 mL). Polymer that precipitated with methanol was isolated and dried in a vacuum oven at 70° C.

TABLE 5

| Ex. | Monomer A | Monomer B | Catalyst | Yield | $M_w * 10^{-3}$ | PDI | A/B |
|---|---|---|---|---|---|---|---|
| B48 | BuNB (60.86) | DMMINB (10.40) | 0.95 | 94 | 76.9 | 2.06 | 89/11 |
| B49 | BuNB (42.07) | DMMINB (27.74) | 0.84 | 90 | 87.3 | 1.93 | 72/28 |
| B50 | BuNB (27.80) | DMMINB (42.76) | 0.78 | 83 | 90.2 | 1.98 | 55/45** |
| B51 | DecNB (60.24) | DMMINB (6.93) | 0.66 | 95 | 110 | 1.84 | 87/13 |
| B52 | DecNB (49.19) | DMMINB (20.80) | 0.66 | 91 | 99.9 | 1.84 | 70/30 |
| B53 | DecNB (35.13) | DMMINB (34.67) | 0.66 | 84 | 100 | 1.78 | 52/48* |
| B544 | BuNB (13.52) | DCPD (1.32) | 0.004 | 90 | 77.0 | 4.54 | 89/11 |
| B55 | BuNB (13.52) | DCPD (1.32) | 0.004 | 89 | 64 | 5.79 | 80/20 |

*Ratio of monomers in polymer determined by $^{13}$C NMR

For each of Examples B56-B63, the amounts of the monomers indicated in Table 6, below, were charged to a reaction vial and dissolved in 166 g of toluene and 29 g of methyl ethyl ketone. The vials were then sparged with nitrogen to remove residual oxygen and sealed. The amount of catalyst, $(\eta^6\text{-toluene})\text{Ni}(C_6F_5)_2$, indicated in Table 6 for each experiment were dissolved in the amount of toluene indicated. Table 6 below provides the yields of polymers obtained for each synthesis as well as $M_w$, PDI and repeat unit ratios.

Example B56-B57

Polymerization of DecNB and MGENB

The monomer solutions were then stirred at 40° C. and the catalyst solutions injected into the vials. The mixtures were maintained at temperature for 3 hours. After residual catalyst removal and precipitation of the polymers into methanol the polymers were isolated and dried in a vacuum oven at 80° C. T Example B58-B59

Polymerization of BuNB and MGENB

The monomer solutions were then stirred at 40° C. and the catalyst solutions injected into the vials. The mixtures were maintained at temperature for 3 hours. After residual catalyst removal and precipitation of the polymers into methanol the polymers were isolated and dried in a vacuum oven at 80° C. Table 6 below provides the yields of polymers obtained for each synthesis as well as $M_w$ and $M_w/M_n$.

Example B60-B61

Polymerization of DecNB and EONB

The monomer solutions were then stirred at 40° C. and the catalyst solutions injected into the vials. The mixtures were maintained at temperature for 3 hours. After residual catalyst removal and precipitation of the polymers into methanol the polymers were isolated and dried in a vacuum oven at 80° C.

Example B62-B63

Polymerization of BuNB and EONB

The monomer solutions were then stirred at 40° C. and the catalyst solutions injected into the vials. The mixtures were maintained at temperature for 3 hours. After residual catalyst removal and precipitation of the polymers into methanol the polymers were isolated and dried in a vacuum oven at 80° C.

TABLE 6

| Ex. | Monomer A | Monomer B | Catalyst/ solvent | Yield | $M_w * 10^{-3}$ | PDI | A/B* |
|---|---|---|---|---|---|---|---|
| B56 | DecNB (59.88) | MGENB (5.12) | 2.45/25 | 94% | 76.8 | 2.47 | 88/12 |
| B57 | DecNB (48.88) | MGENB (16.12) | 2.45/35 | 95% | 69.3 | 2.52 | 69/31 |
| B58 | BuNB (57.35) | MGENB (7.65) | 3.5/35 | 95% | 61.4 | 3.27 | 88/12 |
| B59 | BuNB (42.92) | MGENB (22.08) | 3.5/35 | 96% | 63.3 | 3.35 | 69/31 |
| B60 | DecNB (58.84) | EONB (6.16) | 2.36/35 | 95% | 77.1 | 1.92 | |
| B61 | DecNB (46.31) | EONB (18.69) | 2.36/35 | 96% | 75.6 | 2.15 | |
| B62 | BuNB (55.88) | MGENB (9.12) | 3.33/35 | 96% | 68.1 | 2.70 | |
| B63 | BuNB (39.89) | MGENB (25.11) | 3.33/35 | 97% | 70.2 | 2.19 | |

For each of Experiments B64-B78, the amounts of monomers indicated in Table 7, below, were charged to a reaction vial, equipped with a stir bar. The monomer(s) were dissolved in the amount of the indicated solvents for each Experiment and then sparged with nitrogen to remove residual oxygen and sealed. The amounts of catalyst, $(\eta^6\text{-toluene})\text{Ni}(C_6F_5)_2$, indicated in Table 7 were dissolved in the amount of toluene (or other indicated solvent) while in a nitrogen purged glove box. Table 7 below provides the yields of polymers obtained for each synthesis as well as $M_w$ and PDI.

Example B64-B67

Homopolymerization of FHCNB, FPCNB, FOCHNB and PPVENB

Each of the monomers was dissolved in trifluorotoluene in the amount indicated. The solutions were then stirred at room temperature and the trifluorotoluene catalyst solutions injected into the vials. The mixtures were maintained at room temperature overnight. After residual catalyst removal and precipitation of the polymers into methanol the polymers were isolated and dried in a vacuum oven at 80° C. T

Example B68-B69

Polymerization of DecNB and MeCoumNB

For each experiment the monomers were dissolved in toluene/ethyl acetate, while the catalyst was dissolved in toluene. The monomer solutions were then stirred, heated to 45° C. and the catalyst solutions injected into the vials. The mixtures were stirred at 45° C. overnight. After residual catalyst removal and precipitation of the polymers into acetone, the polymers were isolated and dried in a vacuum oven at 90° C.

Example B70-B73

Polymerization of BuNB or DecNB with EtCoumNB

For each experiment the monomers were dissolved in toluene/methyl ethyl ketone and the catalyst in toluene. The monomer solutions were then stirred at room temperature and the catalyst solutions injected into the vials. The mixtures were stirred at room temperature overnight. After residual catalyst removal and precipitation of the polymers into acetone, the polymers were isolated and dried in a vacuum oven at 50° C.

Example B74-B75

Polymerization of DecNB and EtCoumNB

For each experiment the monomers were dissolved in toluene/ethyl acetate and the catalyst in toluene. The monomer solutions were then stirred, heated to 45° C. and the catalyst solutions injected into the vials. The mixtures were stirred at 45° C. overnight. After residual catalyst removal and precipitation of the polymers into acetone, the polymers were isolated and dried in a vacuum oven at 90° C.

Example B76

Polymerization of BuNB and EtCoumNB

For each experiment the monomers were dissolved in toluene/ethyl acetate and the catalyst in toluene. The monomer solutions were then stirred, heated to 45° C. and the catalyst solutions injected into the vials. The mixtures were stirred at 45° C. overnight. After residual catalyst removal and precipitation of the polymers into acetone, the polymers were isolated and dried in a vacuum oven at 90° C.

Example B77

Polymerization of PPVENB and MeCoumNB

For each experiment the monomers were dissolved in toluene/trifluorotoluene and the catalyst in trifluorotoluene. The monomer solutions were then stirred, heated to 45° C. and the catalyst solutions injected into the vials. The mixtures were 45° C. overnight. After residual catalyst removal and precipitation of the polymers into heptane, the polymers were isolated and dried in a vacuum oven at 70° C.

Example B78

Polymerization of DecNB and MIENB

The amounts of monomers indicated in Table 7, below, were dissolved in toluene (51 g) and ethanol (0.51 g) contained in a pressure reactor equipped with a stir bar. The reactor was sparged with nitrogen to remove residual oxygen and sealed. In a glove box, DANFABA (0.048 g) was added to the reactor. The reactor was sealed, pressurized with ethylene to 10 psig and was heated to 80° C. To the reactor was added (allyl)palladium(trinaphthylphosphine)(trifluoroacetate) in the amount indicated in Table 7 in 3 g of toluene. The mixtures were maintained at temperature for 17 hours. After cooling and residual catalyst removal, the polymer that precipitated with acetone was isolated and dried in a vacuum oven at 70° C.

TABLE 7

| Ex. | Monomer A | Monomer B | Monomer/Solvent | Cat./Solvent | % Yld | $M_w * 10^{-3}$ | PDI | A/B* |
|---|---|---|---|---|---|---|---|---|
| B64 | FHCNB (21.12) | — | 55 | 0.27 | 57 | 155 | 1.51 | |
| B65 | FPCNB (20.10) | — | 55 | 0.39 | 18 | 48.4 | 1.48 | |
| B66 | FOCHNB (21.13) | — | 55 | 0.29 | 47 | 52.5 | 1.34 | |
| B67 | PPVENB (19.50) | — | 55 | 0.24 | 14 | 319 | 1.63 | |
| B68 | DecNB (40.99) | MeCoumNB (20.12) | 150/27 | 0.67 | 68 | 86.4 | 1.81 | 76/24 |
| B69 | DecNB (29.28) | MeCoumNB (33.54) | 150/27 | 0.55 | 66 | 80.4 | 1.54 | 57/43 |
| B70 | DecNB (11.71) | MeOCinnNB (14.22) | 105/19 | 0.32 | 40 | 184 | 1.72 | 58/42 |
| B71 | BuNB (13.67) | MeOCinnNB (11.09) | 105/19 | 0.42 | 66 | 198 | 2.08 | 72/28 |
| B72 | DecNB (16.40) | MeOCinnNB (8.53) | 105/19 | 0.32 | 83 | 183 | 2.04 | 74/26 |
| B73 | BuNB (9.77) | MeOCinnNB (18.48) | 105/19 | 0.42 | 76% | 208 | 2.77 | 51/49 |
| B74 | DecNB (11.71) | EtCoumNB (14.12) | 150/27 | 0.29 | 83 | 73.4 | 1.58 | 51/49 |

TABLE 7-continued

| Ex. | Monomer A | Monomer B | Monomer/ Solvent | Cat./Solvent | % Yld | $M_w * 10^{-3}$ | PDI | A/B* |
|---|---|---|---|---|---|---|---|---|
| B75 | DecNB (16.40) | EtCoumNB (8.47) | 150/27 | 0.27 | 85 | 86.8 | 1.71 | 70/30 |
| B76 | BuNB (13.65) | EtCoumNB (8.47) | 58/11 | 0.42 | 88 | 70.4 | 2.08 | 70/30 |
| B77 | PPVENB (20.49) | MeCoumNB (4.70) | 24/92 | 0.68 | 83 | 28 | 1.32 | 76/27 |
| B78 | DecNB (21.08) | MIENB (2.17) | | | 43 | 39.8 | 3.16 | 91/9 |

*Ratio of monomers in polymer determined by $^1$H NMR

For each of Experiments B79-B86, the amounts of monomers indicated in Table 8, below, were charged to a reaction vial, equipped with a stir bar. The monomer(s) were dissolved in the amount of the indicated solvents for each Experiment and then sparged with nitrogen to remove residual oxygen and sealed. The amounts of catalyst, ($\eta^6$-toluene)Ni($C_6F_5$)$_2$, indicated in Table 8 were dissolved in the amount of toluene (or other indicated solvent) while in a nitrogen purged glove box. Table 8 below provides the yields of polymers obtained for each synthesis as well as $M_w$, PDI and the ratio of monomer repeat units found.

Example B79-B81

Polymerization of PENB and DMMIMeNB

The amount of monomers indicated in Table 8, below, were dissolved in a mixture of toluene and methyl ethyl ketone (83.4 mL and 15.4 mL, respectively) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 9 was dissolved in toluene (4.5 mL) in a nitrogen purged glove box. The monomer solution was then heated to 45° C. and the catalyst solution injected into the heated vial. The mixture was maintained at temperature for 1.5 hours with stirring after which it was allowed to cool to room temperature. After residual catalyst removal and precipitation of the polymer into 75/25 acetone/methanol, the polymer was isolated and dried in a vacuum oven at 65° C.

Example B82-B83

Polymerization of MeNB and DMMIMeNB

The amount of monomers indicated in Table 8, below, were dissolved in a mixture of toluene and methyl ethyl ketone (81.3 mL and 15.2 mL, respectively) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 8 was dissolved in toluene (5.6 mL) in a nitrogen purged glove box. The monomer solution was then heated to 45° C. and the catalyst solution injected into the heated vial. The mixture was maintained at temperature for 1.5 hours with stirring after which it was allowed to cool to room temperature. After residual catalyst removal and precipitation of the polymer into 75/25 acetone/methanol, the polymer was isolated and dried in a vacuum oven at 65° C.

Example B84

Polymerization of NB and DMMIMeNB

The amount of monomers indicated in Table 8, below, were dissolved in a mixture of toluene and methyl ethyl ketone (79.4 mL and 14.8 mL, respectively) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 8 was dissolved in toluene (4.9 mL) in a nitrogen purged glove box. The monomer solution was then heated to 45° C. and the catalyst solution injected into the heated vial. The mixture was maintained at temperature for 1.5 hours with stirring after which it was allowed to cool to room temperature. After residual catalyst removal and precipitation of the polymer into 75/25 acetone/methanol thanol, the polymer was isolated and dried in a vacuum oven at 65° C.

Example B85-B86

Polymerization of TD and DMMIMeNB

The amount of monomers indicated in Table 8, below, were dissolved in a mixture of toluene and methyl ethyl ketone (88.7 mL and 17.5 mL, respectively) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 8 was dissolved in toluene (3.8 mL) in a nitrogen purged glove box. The monomer solution was then heated to 45° C. and the catalyst solution injected into the heated vial. The mixture was maintained at temperature for 1.5 hours with stirring after which it was allowed to cool to room temperature. After residual catalyst removal and precipitation of the polymer into 75/25 acetone/methanol, the polymer was isolated and dried in a vacuum oven at 65° C.

TABLE 8

| Ex. | Monomer A | Monomer B) | Catalyst | Yield | $M_w * 10^{-3}$ | PDI | A/B |
|---|---|---|---|---|---|---|---|
| B79 | DMMI (8.33) | PENB (16.66) | 0.388 | 80 | 61.3 | 1.76 | 33/67 |
| B80 | DMMI (13.88) | PENB (11.90) | 0.388 | 78 | 52.5 | 1.56 | 51/49 |
| B81 | DMMI (19.43) | PENB (7.14) | 0.388 | 75 | 63.3 | 1.59 | 69/31 |
| B82 | DMMI (17.35) | MeNB (8.11) | 0.485 | 55 | 61.4 | 1.76 | 50/50 |
| B83 | DMMI (21.05) | MeNB (4.22) | 0.420 | 47 | 65.5 | 1.51 | 69/31 |
| B84 | DMMI (21.05) | NB (3.67) | 0.420 | 61 | 79.7 | 1.62 | 63/37 |
| B85 | DMMI (13.88) | TD (9.62) | 0.291 | 91 | 65.9 | 1.53 | 53/47 |
| B86 | DMMI (19.43) | TD (5.77) | 0.291 | 87 | 57.4 | 1.46 | 63/37 |

Example B87

Polymerization of DHNMINB

DHNMINB (5.50 g, 0.0180 mol), toluene (34.1 mL) and ethyl acetate (11.2 mL) were added to a 100 mL glass vial along with a magnetic stir bar. The vial was sealed with a rubber septum. The mixture was sparged with nitrogen for 30 min. The mixture was heated to 45° C. with stirring. To this solution was added ($\eta^6$-toluene)Ni($C_6F_5$)$_2$ (0.087 g, 0.18 mmol) dissolved in 1 mL of toluene. The mixture was stirred at temperature for 3 h. The solution became semi-viscous and solid polymer precipitated from solution. The mixture was cooled and the solid filtered from the reaction mixture. GPC: $M_w$=77600; $M_n$=39200; $M_w/M_n$=1.98.

Example B88

Polymerization 50/10 NBCH$_2$GlyOAc and DMMIMeNB

DMMINB (26.6 g, 0.115 mol), NBCH2GlyOAc (24.18 g, 0.115 mol), toluene (190 mL) and methyl ethyl ketone (38 mL) were added to a 500 mL glass crimp cap bottle along with a magnetic stir bar. The bottle was sealed with a rubber septum. The mixture was sparged with nitrogen for 30 min. The mixture was heated to 45° C. with stirring. To this solution was added ($\eta^6$-toluene)Ni($C_6F_5$)$_2$ (0.744 g, 0.00153 mol) dissolved in 8.7 mL of toluene. The mixture was maintained at temperature for 1.5 hours with stirring after which it was allowed to cool to room temperature. After residual catalyst removal and precipitation of the polymer into methanol, the polymer was isolated and dried in a vacuum oven at 60° C. GPC: $M_w$=47200, $M_n$=27900, $M_w/M_n$=1.69. Composition ($^1$H NMR)=46/54 DMMI-MeNB/NBCH$_2$GlyOAc. Yield=76.8%.

Example B89

Polymerization of 25/75 NBCH$_2$GlyOAc and DMMIMeNB

DMMINB (39.9 g, 0.173 mol), NBCH$_2$GlyOAc (12.1 g, 0.0.0575 mol), toluene (195 mL) and methyl ethyl ketone (39 mL) were added to a 500 mL glass crimp cap bottle along with a magnetic stir bar. The bottle was sealed with a rubber septum. The mixture was sparged with nitrogen for 30 min. The mixture was heated to 45° C. with stirring. To this solution was added ($\eta^6$-toluene)Ni($C_6F_5$)$_2$ (0.744 g, 0.00153 mol) dissolved in 8.7 mL of toluene. The mixture was maintained at temperature for 1.5 hours with stirring after which it was allowed to cool to room temperature. After residual catalyst removal and precipitation of the polymer into methanol, the polymer was isolated and dried in a vacuum oven at 6° C. GPC: $M_w$=53900, Mn=30900, $M_w/M_n$=1.74. Composition ($^1$H NMR)=69/31 DMMI-MeNB/NBCH$_2$GlyOAc. Yield=83%.

Example B90-B91

Polymerization of MCHMNB

The amounts of monomers indicated in Table 9, below, were dissolved in dichloromethane (66.5 mL) contained in a vial equipped with a stir bar. The vials were sparged with nitrogen to remove residual oxygen and sealed. The amounts of catalyst, ($\eta^6$-toluene)Ni($C_6F_5$)$_2$, indicated in Table 9 were dissolved in anhydrous toluene (1.8 mL) in a nitrogen purged glove box. The monomer solutions were then heated to 45° C. and the catalyst solutions injected into the heated vials. The mixtures were maintained at temperature for 16 hours with stirring after which it was allowed to cool to room temperature. Table 9 below provides the conversions of polymer determined by HPLC in DMAc for each synthesis as well as Mw, and PDI.

TABLE 9

| Example | Monomer A | Catalyst | Yield | $M_w * 10^{-3}$ | PDI |
|---|---|---|---|---|---|
| B90 | MCHMNB (3.60) | 0.097 | 44 | 14.5 | 1.54 |
| B91 | MCHMNB (3.60) | 0.194 | 59 | 11.9 | 1.70 |

Example B92-B93

Polymerization of tricyclo[4.2.1.02,5]non-7-ene-3,3,4-trifluoro 4-(perfluoro(3-methyl-1,4-dioxanon)) (DiOxoTCN)

The amount of monomer indicated in Table 10 below was dissolved in anhydrous trifluorotoluene (20.0 g) contained in a vial equipped with a stir bar. The vial was sparged with nitrogen to remove residual oxygen and sealed. The amount of catalyst, ($\eta^6$-toluene)Ni($C_6F_5$)$_2$, indicated in Table 10 was dissolved in anhydrous trifluorotoluene (2.0 g for B92 and 1.0 g for B93) in a nitrogen purged glove box. The monomer solution was then stirred at 45° C. and the catalyst solution injected into the vial. The mixture was maintained at temperature for 18 hours with stirring. After residual catalyst removal and precipitation of the polymer into methanol, the polymer was isolated and dried in a vacuum oven at 70-80° C. Table 10 below provides the yield of polymer obtained for each synthesis.

TABLE 10

| Example | Monomer A | Catalyst | Yield |
|---|---|---|---|
| B92 | DiOxoTCN (5.0) | 0.20 | 72% |
| B93 | DiOxoTCN (5.0) | 0.10 | 60% |

Example B94

Polymerization of DMMIMeNB NBCH$_2$C$_6$F$_5$ and MeOAcNB

NBCH$_2$C$_6$F$_5$ (16.7 g), DMMIMeNB (11.3 g) and MeOAc (2.03 g) were dissolved in toluene (146.5 g) in an appropriately sized reaction vial. A solution of ($\eta^6$-toluene)Ni($C_6F_5$)$_2$ in toluene was added to the monomer solution and was stirred at 25° C. The mixture was maintained at temperature for 3 hours. After residual catalyst removal and precipitation of the polymers into methanol the polymer was isolated and dried in a vacuum oven at 60° C. Table 11 below provides the yields of polymers obtained for this synthesis as well as $M_w$, and $M_w/M_n$ and polymer composition.

TABLE 11

| Ex. | Monomer A | Monomer B | Monomer C | Catalyst/Solvent (g) | Yield | $M_w * 10^{-3}$ | PDI | A/B/C |
|---|---|---|---|---|---|---|---|---|
| B94 | NBCH$_2$C$_6$F$_5$ (16.7) | DMMINB (11.3) | MeOAcNB (2.03) | 0.65/6.6 | 87 | 13.6 | 2.59 | 47/40/13 |

Example B95-B96

Copolymerization of DMMIMeNB and NBTODD

For each of Examples B95 and B96 an amount of the specific monomers indicated in Table 12 were dissolved in a mixture of toluene and methyl ethyl ketone (73.6 mL and 13.5 mL, respectively) contained in a vial equipped with a stir bar. The vial was sparged with nitrogen to remove residual oxygen and sealed. The amount of catalyst, ($\eta^6$-toluene)Ni(C$_6$F$_5$)$_2$, indicated in Table 12 was dissolved in toluene (3.8 mL) in a nitrogen purged glove box. The catalyst solution was added to the monomer solution and the resulting monomer and catalyst mixture was maintained at temperature for 5 hours with stirring after which it was allowed to cool to room temperature. Residual catalyst was removed and the polymer precipitated by pouring the reaction mixture into an excess of n-heptane. After isolating the polymer by filtration, it was dried in a vacuum oven at 55° C. Table 12 below provides the yield of polymer obtained for each synthesis as well as $M_w$, $M_w/M_n$, and the ratio of monomer repeat units found.

TABLE 12

| Ex. | Monomer A | Monomer B | Catalyst | Yield | $M_w * 10^{-3}$ | PDI | A/B* |
|---|---|---|---|---|---|---|---|
| B95 | DMMI (10.41) | NBTODD (12.17) | 0.29 | 55 | 73 | 1.76 | 48/52 |
| B96 | DMMI (17.35) | NBTODD (6.76) | 0.32 | 70 | 55.8 | 1.74 | 74/26 |

*$^1$H NMR

Example. B97

Copolymerization of DMMIMeNB and NBTON 12.72 g (0.055 mol) of DMMIMeNB and 12.45 g (0.055 mol) of NBTON were dissolved in a mixture of toluene and methyl ethyl ketone (94.4 mL and 18.7 mL, respectively) contained in a vial equipped with a stir bar. The vial was sealed and sparged with nitrogen to remove residual oxygen, then heated to 45° C. 0.356 g ($\eta^6$-toluene)Ni(C$_6$F$_5$)$_2$ was dissolved in toluene (4.2 mL) in a nitrogen purged glove box. The catalyst solution was added to the monomer solution and the resulting monomer and catalyst mixture was maintained at temperature for 2 hours with stirring after which it was allowed to cool to room temperature. Residual catalyst was removed and the polymer precipitated by pouring the reaction mixture into an excess of methanol. After isolating the polymer by filtration, it was dried in a vacuum oven at 60° C. % Yield: 57%. Final Analytical: Mw=65461, Mw/Mn=1.57, Composition by 13C NMR=46/54 DMMIMeNB/NBTON.

C. Interlayer Preparation

The following examples describe the preparation of interlayers, in accordance with the present invention, on top of dielectric layers that are typically used as gate insulator layers in OFET devices. The adhesion force of the interlayer towards a subsequent layer to be deposited thereon is determined by contact angle measurements. There is a general correlation between the contact angle (which is correlated to the surface energy), and the adhesion. Thus, adhesion is described in the art as the molecular force of attraction between unlike materials. The strength of attraction is determined by the surface energy of the material, which in turn can be determined by contact angle measurements. Generally the lower the contact angle, the higher the surface energy. The higher the surface energy, the greater the molecular attraction, and the lower the surface energy, the weaker the attractive forces. Therefore, for surfaces exhibiting a lower contact angle (and thus a higher surface energy) a better adhesion of the subsequent layer can be expected.

Unless stated otherwise, in the examples below the contact angle is measured with a Kruss Srop Shape Analysis System DSA 10 equipped with DSA1 software for analysis. A droplet of deionized (DI) water is placed on the samples through the syringe so the volume of water is in the range 5-100 µL. Then the image of that drop is captured to the software and the contact angle is calculated by circle fitting method implemented into DSA1 software.

Example C1

Interlayer of NBCH$_2$C$_6$F$_5$/DMMIMeNB Copolymer

A 2.4% w/w solution of the copolymer NBCH$_2$C$_6$F$_5$/DMMIMeNB (50/50) from Example B23 in 2-heptanone is spin-coated on a glass substrate that was coated previously with CYTOP™ 809M. The contact angle measured with DI water on top of the structure is in the range 83-87 degrees. For reference purposes the contact angle of the plain CYTOP 809M layer is measured with DI water, and is found to be in the range from 112-118 degrees.

Example C2

Interlayer of NBCH$_2$C$_6$F$_5$/DMMINB/MeOAcNB Terpolymer

A 2.4% w/w solution of the terpolymer NBCH$_2$C$_6$F$_5$/DMMIMeNB/MeOAcNB (47/40/13) from Example B94 in 2-heptanone is spin-coated on the glass substrate coated previously with CYTOP 809M. The contact angle measured with DI water on top of the structure is in the range of 80 degrees, while for the plain CYTOP 809M layer the contact angle measured with DI water is in the range from 112-118 degrees.

Example C3

Interlayer of NBCH$_2$C$_6$F$_5$/DMMIMeNB and MeOAcNB/DMMIMeNB Copolymer Mixture (1:1)

A 2.4% w/w solution of a 1:1 mixture of the copolymer NBCH$_2$C$_6$F$_5$/DMMIMeNB (50/50) from Example B23 and the copolymer MeOAcNB/DMMIMeNB (50/50) from Example B1 in MAK is spin-coated on the glass substrate coated previously with CYTOP 809M. The contact angle measured with DI water on top of the structure is in the range of 75-77 degrees, while for the plain CYTOP layer the contact angle measured with DI water is in the range from 112-118 degrees.

Example C4

Interlayer of NBCH$_2$C$_6$F$_5$/DMMIMeNB and MeOAcNB/DMMIMeNB Copolymer Mixture (1:2)

A 2.4% w/w solution of a 1:2 mixture of the copolymer NBCH$_2$C$_6$F$_5$/DMMIMeNB (50/50) from Example B23 and the copolymer MeOAcNB/DMMIMeNB (50/50) from Example B1 in MAK is spin-coated on the glass substrate coated previously with CYTOP™ 809M. The contact angle measured with DI water on top of the structure is in the range of 70 degrees, while for the plain CYTOP layer the contact angle measured with DI water is in the range from 112-118 degrees.

Example C5

Interlayer of NBCH$_2$C$_6$F$_5$/DMMIMeNB and NBCH$_2$GlyOAc/DMMIMeNB Copolymer Mixture (1:1)

A 2.4% w/w solution of a 1:1 mixture of the copolymer NBCH$_2$C$_6$F$_5$/DMMIMeNB (50/50) from Example B23 and the copolymer NBCH$_2$GlyOAc/DMMI (54/46) from Example B88 in MAK is spin-coated on the glass substrate coated previously with CYTOP 809M. The contact angle measured with DI water on top of the structure is in the range of 70 degrees, while for the plain CYTOP layer the contact angle measured with DI water is in the range from 112-118 degrees.

Examples C6-C15

Further Interlayers

Contact angle measurements for interlayers prepared as described in example C1 were carried out with different copolymers and terpolymers. The results are summarized in table 13 below.

TABLE 13

| Ex. | Monomer A | Monomer B | Monomer C | Ratio of A | Ratio of B | Ratio of C | Contact Angle w. H$_2$O (°) |
|---|---|---|---|---|---|---|---|
| C6 | NBCH$_2$C$_6$F$_5$ | | | 100 | | | 86 |
| C7 | FHCNB | | | 100 | | | 107-09 |
| C8 | FOCNB | | | 100 | | | 109 |
| C9 | DecNB | DMMINB | NBXOH | 39 | 51 | 10 | 82-84 |
| C10 | DecNB | DMMINB | NBTODD | 36 | 47 | 17 | 81-82 |
| C11 | PPVENB | DMMINB | | 92 | 8 | | 106-07 |
| C12 | PPVENB | DMMINB | | 56 | 44 | | 103-08 |
| C13 | NBCH$_2$C$_6$F$_5$ | DMMINB | MeOAcNB | 31 | 33 | 36 | 80 |
| C14 | NBCH$_2$C$_6$F$_5$ | DMMINB | MeOAcNB | 23 | 48 | 29 | 80 |

Example C15

Interlayer of NBCH$_2$C$_6$F$_5$ Homopolymer

A 2.4% w/w solution of the homopolymer NBCH$_2$C$_6$F$_5$ in MAK is spin-coated on the glass substrate coated previously with CYTOP™ 809M. The contact angle measured with DI water on top of the structure is 97 degrees, while for the plain CYTOP layer the contact angle measured with DI water is in the range from 112-118 degrees.

Example C16

Interlayer of Mixture of NBCH$_2$C$_6$F$_5$ Homopolymer and NBTODD/DMMIMeNB Copolymer A 2.4% w/w solution of a 1:1 mixture of the homopolymer NBCH$_2$C$_6$F$_5$ and the copolymer NBTODD/DMMINB (50/50) in MAK is spin-coated on the glass substrate coated previously with CYTOP™ 809M. The contact angle measured with DI water on top of the structure is 63 degrees, while for the plain CYTOP layer the contact angle measured with DI water is in the range from 112-118 degrees.

Example C17

Interlayer of Mixture of NBCH$_2$C$_6$F$_5$ Homopolymer and NBCH$_2$OCH$_2$CH$_2$OAc/DMMIMeNB Copolymer A 2.4% w/w solution of a 1:1 mixture of the homopolymer NBCH$_2$C$_6$F$_5$ and the copolymer NBCH$_2$OCH$_2$CH$_2$OAc/DMMINB (56/44) in MAK is spin-coated on the glass substrate coated previously with CYTOP™ 809M. The contact angle measured with DI water on top of the structure is 67 degrees, while for the plain CYTOP layer the contact angle measured with DI water is in the range from 112-118 degrees.

Example C18

Interlayer of Mixture of NBCH$_2$C$_6$F$_5$ Homopolymer and MeOAcNB/DMMI Copolymer A 2.4% w/w solution of a 1:1 mixture of the homopolymer NBCH$_2$C$_6$F$_5$ and the copolymer MeOAcNB/DMMINB (50/50) in MAK is spin-coated on the glass substrate coated previously with CYTOP™ 809M. The contact angle measured with DI water on top of the structure is 71 degrees, while for the plain CYTOP layer the contact angle measured with DI water is in the range from 112-118 degrees.

Examples C19-21

Interlayers of Mixtures of NBCH$_2$C$_6$F$_5$ Homopolymer and PMMA

Mixtures of the homopolymers NBCH$_2$C$_6$F$_5$ and PMMA (with an M$_w$ of 15,000, commercially available from Sigma-Aldrich), in various ratios are dissolved in MAK to give a 2.4% w/w solution. The solution is spin-coated on the glass substrate coated previously with CYTOP™ MAK. The contact angles are measured with DI water on top of the structure. the results are summarized in Table 14 below. For the plain CYTOP layer the contact angle measured with DI water is in the range from 112-118 degrees.

TABLE 14

| Ex. | Ratio NBCH$_2$C$_6$F$_5$/PMMA polymer | Contact Angle w. H$_2$O (°) |
|---|---|---|
| C19 | 1:3 | 70 |
| C20 | 1:1 | 67 |
| C21 | 3:1 | 70 |

Example C22

Interlayer of NBCH$_2$C$_6$F$_5$/DMMIMeNB and DMMIMeNB/NBTON Copolymer Mixture (1:1)

A 2.4% w/w solution of a 1:1 mixture of the copolymer NBCH$_2$C$_6$F$_5$/DMMIMeNB (50/50) from Example B23 and the copolymer DMMIMeNB/NBTON (52/48) from Example B97 in MAK is spin-coated on the glass substrate coated previously with CYTOP 809M. The contact angle measured with DI water on top of the structure is in the range of 58-60 degrees, while for the plain CYTOP layer the contact angle measured with DI water is in the range from 112-118 degrees.

The examples C1-C22 show that, by applying an interlayer in accordance with the invention onto a dielectric layer, the contact angle can be significantly reduced, and thus the surface energy and adhesion force can be increased, compared to the plain dielectric layer without interlayer.

D. Device Preparation

A top gat OFET is prepared as follows. A substrate of Corning 1737 glass is sonicated in 3% Decon90 for 30 min at 70° C., washed 2 times with water and sonicated in MeOH, then dried by spin off on the spin coater. Gold source and drain electrodes with 30 nm thickness are evaporated onto the substrate, creating a channel L=50 µm and W=1000 µm. The substrate is treated with the surface treatment formulation Lisicon™ M001 (available from Merck KGaA, Darmstadt, Germany) for 1 min, washed with isopropyl alcohol and dried by spin off on the spin coater. The OSC Formulation Lisicon™ 51036 (available from Merck KGaA, Darmstadt, Germany) is spun onto the substrate after above treatment and then annealed for 1 min at 100° C. on a hotplate. A dielectric layer of CYTOP™ (9% in FC-43, Asahi) is spun onto the cooled substrate (500 rpm for 10 s and 2000 rpm for 20 s) and heated on a hotplate for 2 min at 100° C. An interlayer from a solution is spun on the cooled substrate from a 2.4% solution in MAK. Then a 30 nm gold layer is evaporated onto the interlayer as the gate electrode. For the electrical characterisation the sample is placed in a probe station and connected via Suess PH100 probe heads to an Agilent 4155C semiconductor analyzer. Linear and saturation mobility is calculated at VD=−5V and VD=−60V respectively using the following equations:

$$\mu_{LIN} = -\frac{L}{W*Cox*VD}*\frac{\partial ID}{\partial VG}$$

$$\mu_{SAT} = \frac{2L}{W*Cox}*\frac{\partial sqrtID}{\partial VG}$$

wherein L and W are length and width of the channel, Cox=dielectric capacitance [F/cm$^2$], ID=drain current, sqrt ID=square root of absolute ID values, VG=gate voltage, VD=drain voltage.

Example D1

OFET with an Interlayer of Example C1

Figure 7:
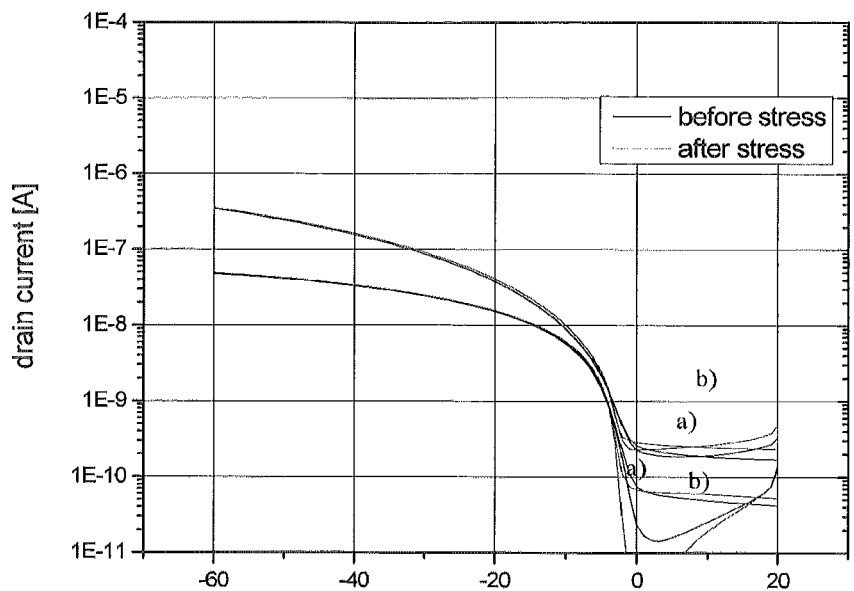
FIGS. 7 and 8 are transfer curves of top gate FET devices fabricated in accordance with embodiments of the present invention as described in examples D1 and D2 (a=before stress, b=after stress).

Typical transfer curves measured for the device made with 51036 and encompassing an interlayer of Example C1, taken as-prepared and after 20 minutes electrical stress at VG=−40V and VD=−40V are depicted in FIG. 7 and show no influence of the interlayer on the electronic characteristics of the device.

Example D2

OFET with an Interlayer of Example C2

Figure 8:
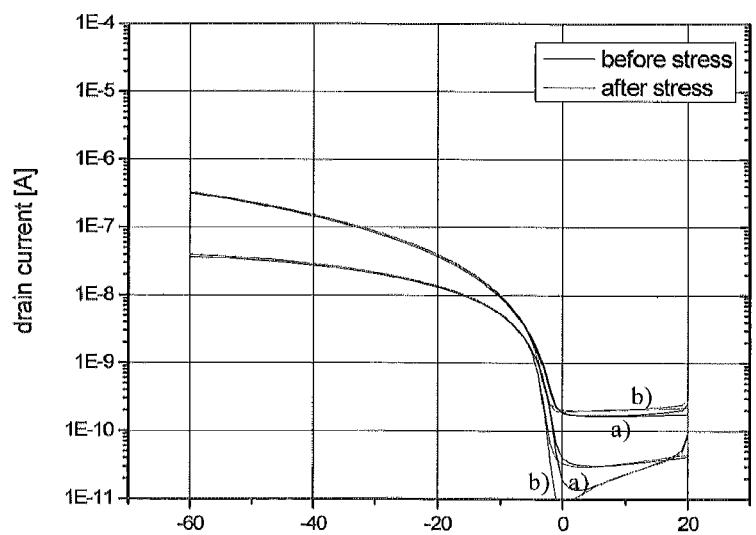

Typical transfer curves measured for device made with S1036 and encompassing an interlayer of Example C1, taken as-prepared and after 20 minutes electrical stress at VG=−40V and VD=−40V are depicted in FIG. 8 and show no influence of the interlayer on the electronic characteristics of the device.

The examples D1 and D2 demonstrate that the transistor devices containing an interlayer in accordance with the invention are stable under electrical stress.

The examples in Section C and D further demonstrate that, by applying an interlayer in accordance with the invention onto a gate insulator layer in an organic field effect transistor, it is possible to increase the surface energy and adhesion force towards further layers applied on the combined insulator/interlayer, while maintaining the orthogonal solubility properties with respect to the organic semiconductor material, and without negatively affecting the transistor performance.

All the references described above are incorporated by reference in their entirety.

We claim:

1. An interlayer that is in direct contact with a dielectric layer in an organic electronic device, said interlayer consisting essentially of a polycycloolefinic polymer, or a polymer composition containing a polycycloolefinic polymer, said polycycloolefinic polymer comprising a first type of repeating unit in accordance with formula I:

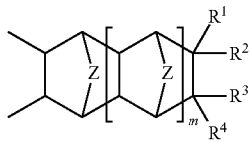

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group or one of R$^1$, R$^2$, R$^3$ and R$^4$ has a pendant crosslinkable group and the other R$^1$, R$^2$, R$^3$ and R$^4$ are defined above, and
the dielectric layer comprises a fluoropolymer.

2. The interlayer of claim 1, wherein m is 0 or 1.

3. The interlayer of claim 1, wherein one of R$^1$, R$^2$, R$^3$ and R$^4$ has a pendant crosslinkable group.

4. The interlayer of claim 3, wherein the pendant crosslinkable group is a latent crosslinkable group.

5. The interlayer of claim 3, wherein the pendant crosslinkable group is a maleimide, a 3-monoalkylmaleimide, a 3,4-dialkylmaleimide, an epoxy, a vinyl, an acetyl, an indenyl, a cinnamate or a coumarin group, or the pendant crosslinkable group comprises a substituted or unsubstituted maleimide portion, an epoxide portion, a vinyl portion, a cinnamate portion or a coumarin portion.

6. The interlayer of claim 3, wherein the first type of repeating unit having a pendant crosslinkable group is derived from any one of the following monomers:

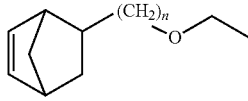

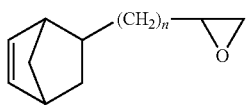

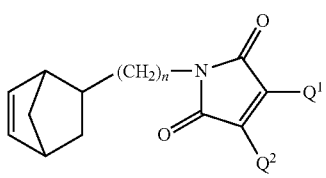

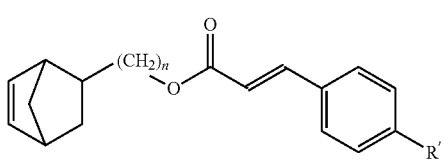

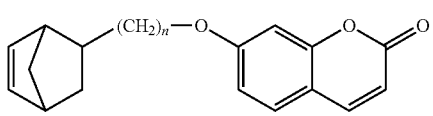

where n is an integer from 1 to 8, Q$^1$ and Q$^2$ are each independently of one another —H or —CH$_3$, and R' is —H or —OCH$_3$.

7. The interlayer of claim 3, wherein the polycycloolefinic polymer comprises a second type of repeating unit, such second type being distinct from the first type.

8. The interlayer of claim 1, wherein the polycycloolefinic polymer further comprises one or more types of repeating units in accordance with formula II

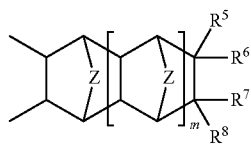

wherein Z is selected from —CH$_2$—, —CH$_2$—CH$_2$— or —O—, m is an integer from 0 to 5, each of R$^5$, R$^6$, R$^7$ and R$^8$ are independently selected from H, a C$_1$ to C$_{25}$ hydrocarbyl, a C$_1$ to C$_{25}$ halohydrocarbyl or a C$_1$ to C$_{25}$ perhalocarbyl group, and wherein the repeating units of formula II are distinct from the repeating units of formula I.

9. The interlayer of claim 1, wherein the polycycloolefinic polymer comprises two, three or more than three different types of repeating units in accordance with formula I or II

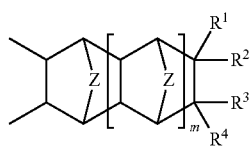

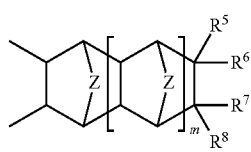

wherein Z is selected from —CH$_2$—, —CH$_2$—CH$_2$— or —O—, in is an integer from 0 to 5, each of R$^1$, R$^2$, R$^3$ and R$^4$ and R$^5$, R$^6$, R$^7$ and R$^5$ are independently selected from H, a C$_1$ to C$_{25}$ hydrocarbyl, a C$_1$ to C$_{25}$ halohydrocarbyl or a C$_1$ to C$_{25}$ perhalocarbyl group, and wherein the repeating units of formula I are distinct from the repeating units of formula II.

10. The interlayer of claim 1, wherein the polymer composition comprises a blend of a first polycycloolefinic polymer and a second polycycloolefinic polymer.

11. The interlayer of claim 10, wherein the polymer composition is a blend of a first polycycloolefinic polymer having one or more types of repeating units of formula I, and a second polycycloolefinic polymer having one or more types of repeating units of formula II

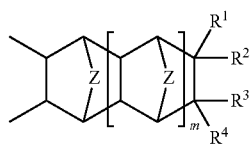

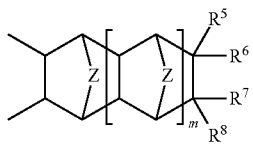

wherein Z is selected from —CH$_2$—, —CH$_2$—CH$_2$— or —O—, m is an integer from 0 to 5, each of R$^1$, R$^2$, R$^3$ and R$^4$ and R$^5$, R$^6$, R$^7$ and R$^8$ are independently selected from H, a C$_1$ to C$_{25}$ hydrocarbyl, a C$_1$ to C$_{25}$ halohydrocarbyl or a C$_1$ to C$_{25}$ perhalocarbyl group, and wherein the repeating units of formula I are distinct from the repeating units of formula II.

12. The interlayer of claim 1, wherein the polymer composition further comprises one or more of a solvent, a crosslinking agent, an optional reactive solvent, stabilizer, a UV sensitizer and a thermal sensitizer.

13. The interlayer of claim 1, wherein the polymer or polymer composition contains one or more repeating units having a crosslinkable group, and the interlayer further comprises an adhesion promoter which is a compound comprising a surface-active functional group and a crosslinkable functional group that is capable of reacting with the said crosslinkable group of the repeating unit of the polymer or polymer composition.

14. The interlayer of claim 13, wherein the adhesion promoter is a compound of formula III

G-A'-P       III wherein G is a surface-active group, A' is a spacer group or a single bond, and P is a crosslinkable group.

15. The interlayer of claim 14, wherein the surface active group of the adhesion promoter is of formula —SiR$^{12}$R$^{13}$R$^{14}$, or of formula —NH—SiR$^{12}$R$^{13}$R$^{14}$, wherein R$^{12}$, R$^{13}$ and R$^{14}$ are selected from halogen, silazane, C$_1$-C$_{12}$-alkoxy, C$_1$-C$_{12}$-alkylamino, optionally substituted C$_5$-C$_{20}$-aryloxy and optionally substituted C$_2$-C$_{20}$-heteroaryloxy, and wherein one or two of R$^{12}$, R$^{13}$ and R$^{14}$ may also denote C$_1$-C$_{12}$-alkyl, optionally substituted C$_5$-C$_{20}$-aryl and optionally substituted C$_2$-C$_{20}$-heteroaryl.

16. The interlayer of claim 14, wherein the crosslinkable group of the adhesion promoter is selected from a maleimide, a 3-monoalkyl-maleimide, a 3,4-dialkylmaleimide, an epoxy, a vinyl, an acetyl, an indenyl a, cinnamate or a coumarin group, or the crosslinkable group comprises a substituted or unsubstituted maleimide portion, an epoxide portion, a vinyl portion, a cinnamate portion or a coumarin portion.

17. The interlayer of claim 13, wherein the adhesion promoter is a compound having the following structure

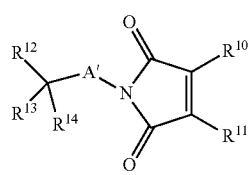

A where SiR$^{12}$R$^{13}$R$^{14}$ is as defined in claim 15, A' is as defined in claim 16, and R$^{10}$ and R$^{11}$ are each independently H or a C$_1$-C$_6$ alkyl group.

18. The interlayer of claim 1, wherein the polymer or polymer composition contains one or more repeating units having a crosslinkable group, and the interlayer further comprises a crosslinker which is a compound comprising two or more crosslinkable functional groups that are capable of reacting with the crosslinkable group of the said repeating unit of the polymer or polymer composition.

19. The interlayer of claim 18, wherein the crosslinker is a compound of formula IV1 or IV2

P—X—P       IV1

H$_{4-m}$C(A''p-P)$_m$       IV2 where X is A''-X'-A'', X' is, O, S, NH, or a single bond, A'' is a single covalent bond or a connecting, spacer or bridging group, P is a crosslinkable group, and m is 2, 3 or 4.

20. The interlayer of claim 19, wherein the crosslinkable group of the crosslinker is selected from a maleimide, a 3-monoalkyl-maleimide, a 3,4-dialkylmaleimide, an epoxy, a vinyl, an acetyl, an indenyl, a cinnamate or a coumarin group, or the crosslinkable group comprises a substituted or unsubstituted maleimide portion, an epoxide portion, a vinyl portion, a cinnamate portion or a coumarin portion.

21. The interlayer of claim 19, wherein the crosslinker is a compound of the following formula

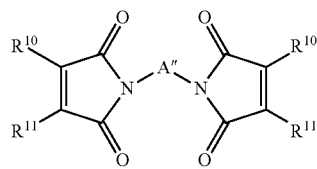

C1 where R$^{10}$ and R$^{11}$ are independently of each other H or a C$_1$-C$_6$ alkyl group, and A'' is a single bond or a connecting, spacer or bridging group as defined in claim 19 and additionally selected from (CZ$_2$)$_n$, (CH$_2$)$_n$—(CH=CH)$_p$—(CH$_2$)$_n$, (CH$_2$)$_n$—O, (CH$_2$)$_n$—O—(CH$_2$)$_n$, (CH$_2$)$_n$—C$_6$Q$_{10}$-(CH$_2$)$_n$, and C(O)—O, where each n is independently an integer from 0 to 12,
p is an integer from 1-6,
Z is independently H or F, C$_6$Q$_{10}$ is cyclohexyl that is substituted with Q, and
Q is independently H, F, CH$_3$, CF$_3$ or OCH$_3$.

22. An electronic device which comprises the interlayer of claim 1 which is in contact with a dielectric layer, wherein the dielectric layer is part of a gate dielectric layer.

23. An electronic device which comprises the interlayer of claim 1 which is in contact with a dielectric layer, wherein the dielectric layer is a passivation layer.

24. The interlayer of claim 1 that is in contact with a dielectric layer in an organic electronic device, wherein the organic electronic device further comprises an organic semiconductor material, and the polymer composition further comprises a solvent having orthogonal solubility properties with respect to the organic semiconductor material.

25. The interlayer of claim 1, wherein the polycycloolefinic polymer comprises one or more repeat units derived from a monomer selected from NBCH$_2$C$_6$F$_5$, NBC$_6$F$_5$, NBCH$_2$C$_6$F$_2$, NBCH$_2$C$_6$H$_4$CF$_3$ MeOAcNB and NBalkylC$_6$F$_5$, wherein Me is methyl and OAc is acetate, and repeating units derived from a norbornene-type monomer selected from the group consisting of

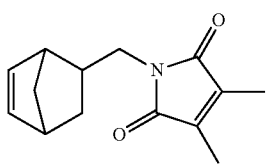

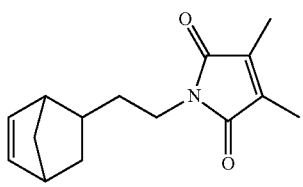

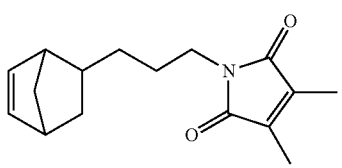

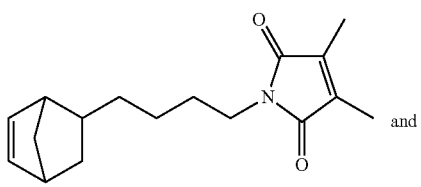 and

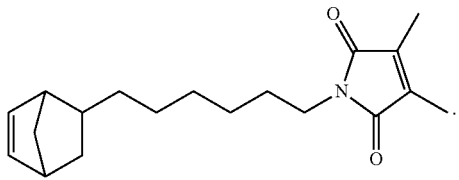

26. The interlayer of claim 1, wherein the polycycloolefinic polymer comprises two or more repeat units derived from a monomer selected from NBCH$_2$C$_6$F$_5$, NBC$_6$F$_5$, NBCH$_2$C$_6$F$_2$, NBCH$_2$C$_6$H$_4$CF$_3$ MeOAcNB and NBalkylC$_6$F$_5$, wherein Me is methyl and OAc is acetate, and repeating units derived from a norbornene-type monomer selected from the group consisting of

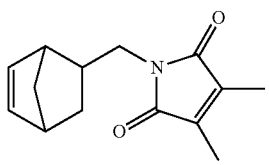

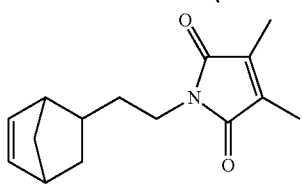

-continued

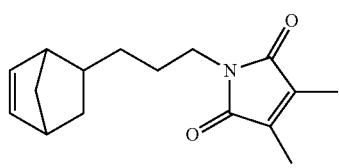

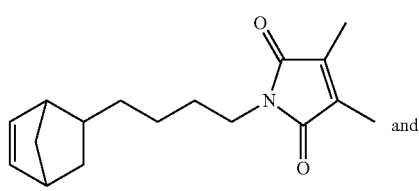 and

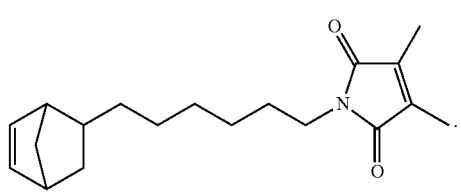

27. The interlayer of claim 1, wherein the polycycloolefinic polymer comprises one or more repeat units derived from a monomer selected from NBCH$_2$C$_6$F$_5$, NBC$_6$F$_5$, NBCH$_2$C$_6$F$_2$ and MeOAcNB, wherein Me is methyl and OAc is acetate, and repeating units derived from a norbornene-type monomer selected from the group consisting of

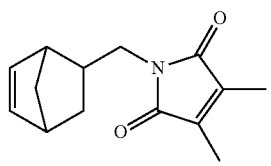

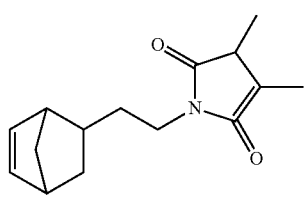 and

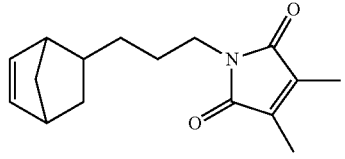

28. The interlayer of claim 1, wherein the polycycloolefinic polymer comprises two or more repeat units derived from a monomer selected from NBCH$_2$C$_6$F$_5$, NBC$_6$F$_5$ and MeOAcNB, wherein Me is methyl and OAc is acetate, and repeating units derived from a norbornene-type monomer selected from the group consisting of

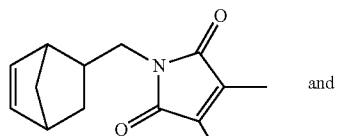 and 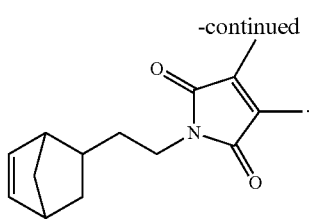

29. An interlayer that is in direct contact with a dielectric layer in an organic electronic device, said interlayer consisting essentially of a norbornene-type polymer formed by one or more norbornene-type monomers selected from sub-formulae 1-54:

| Structure | Name | # |
|---|---|---|
|  | NB | 1 |
| 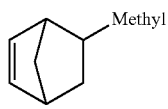 Methyl | MeNB | 2 |
| 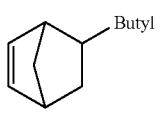 Butyl | BuNB | 3 |
| 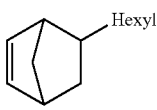 Hexyl | HexNB | 4 |
| 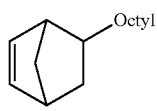 Octyl | OctNB | 5 |
| 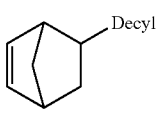 Decyl | DecNB | 6 |
| 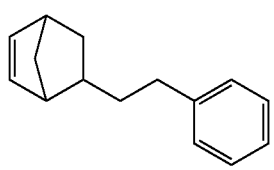 [SMILES: C1=CC2CC1CC2CCc1ccccc1] | PENB | 7 |
| 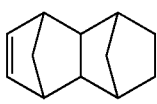 [SMILES: C1=CC2CC1C1C3CCC(C3)C21] | TD | 8 |
| 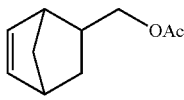 [SMILES: CC(=O)OCC1CC2C=CC1C2] OAc | MeOAcNB | 9 |
| 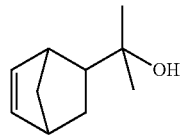 OH | NBXOH | 10 |

-continued
| | | |
|---|---|---|
|  O-CH₂CH₂OAc | NBCH2GlyOAc | 11 |
|  O-CH₂CH₂OH | NBCH2GlyOH | 12 |
|  O-(CH₂CH₂O)₂Me | NBTON | 13 |
|  O-(CH₂CH₂O)₃Me | NBTODD | 14 |
| 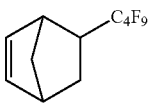 C₄F₉ | NBC4F9 | 15 |
| 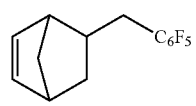 C₆F₅ | NBCH2C6F5 | 16 |
| 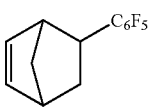 C₆F₅ | NBC6F5 | 17 |
| 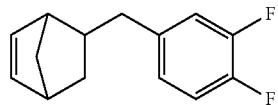 [SMILES: Fc1ccc(CC2CC3C=CC2C3)cc1F] | NBCH2C6F2 | 18 |
| 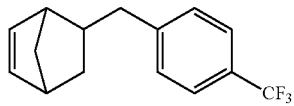 [SMILES: FC(F)(F)c1ccc(CC2CC3C=CC2C3)cc1] | NBCH2C6H4CF3 | 19 |
| 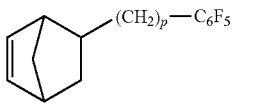 (CH₂)$_p$—C₆F₅ | NBalkylC6F5 | 20 |

-continued
| | | |
|---|---|---|
| 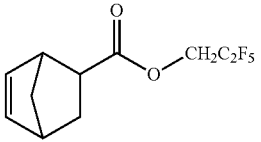 | FPCNB | 21 |
| 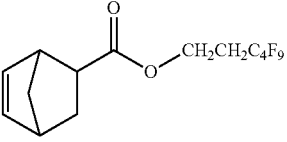 | FHCNB | 22 |
| 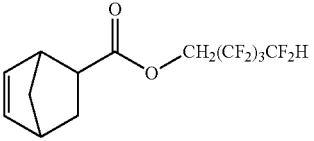 | FOCHNB | 23 |
| 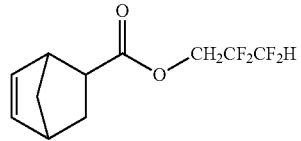 | FPCHNB | 24 |
| 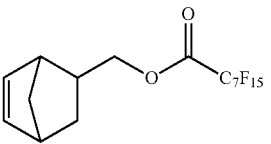 | C8PFAcNB | 25 |
| 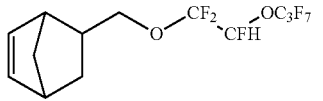 | PPVENB | 26 |
| 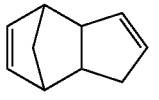 | DCPD | 27 |
| 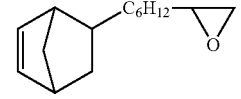 | EONB | 28 |
| 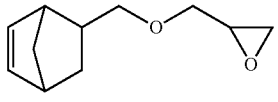 [SMILES: C1=CC2CC1CC2COCC1CO1] | MGENB | 29 |
| 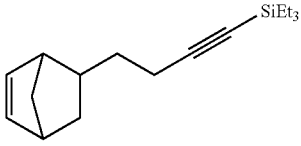 | AkSiNB | 30 |
| 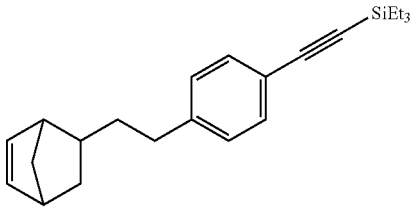 | ArSiNB | 31 |

-continued
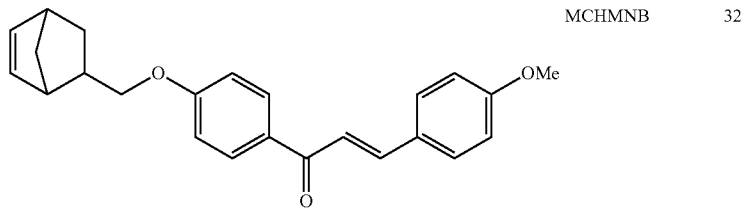 MCHMNB 32
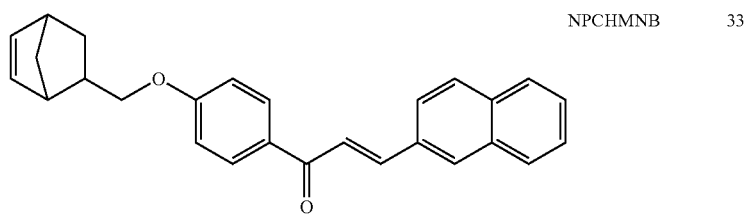 NPCHMNB 33
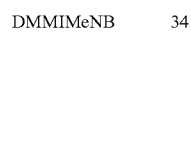 DMMIMeNB 34
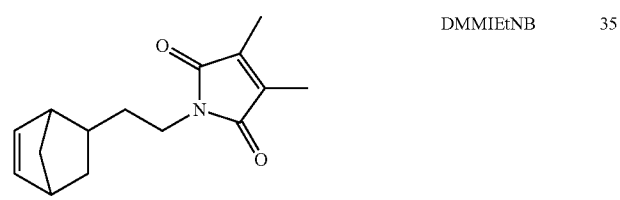 DMMIEtNB 35
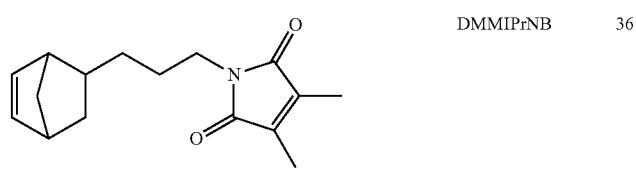 DMMIPrNB 36
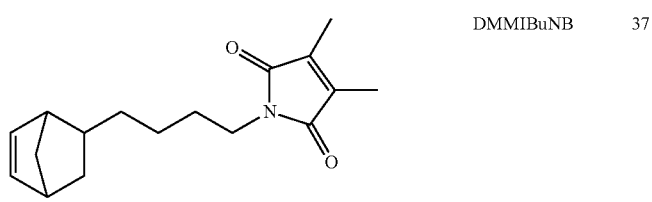 DMMIBuNB 37
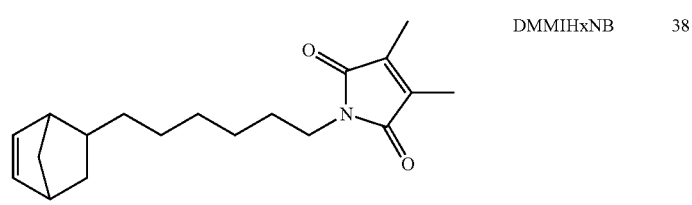 DMMIHxNB 38

-continued
| | | |
|---|---|---|
| 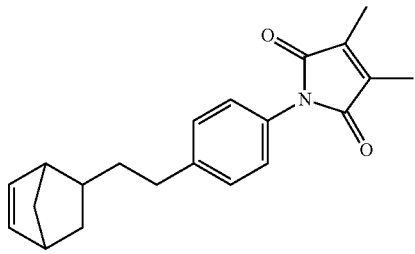 [SMILES: CC1=C(C)C(=O)N(c2ccc(CCC3CC4C=CC3C4)cc2)C1=O] | EtPhDMMINB | 39 |
| 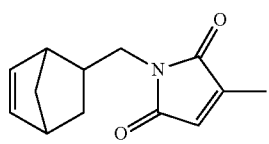 [SMILES: CC1=CC(=O)N(CC2CC3C=CC2C3)C1=O] | MMIMeNB | 40 |
| 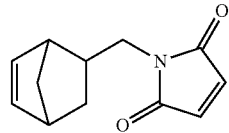 [SMILES: O=C1C=CC(=O)N1CC1CC2C=CC1C2] | MINB | 41 |
| 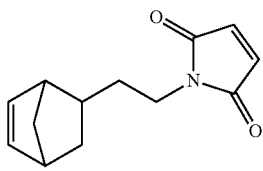 [SMILES: O=C1C=CC(=O)N1CCC1CC2C=CC1C2] | MIENB | 42 |
| 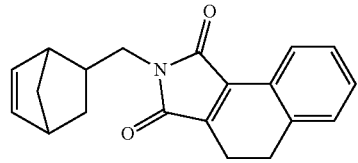 [SMILES: O=C1C2=C(C(=O)N1CC1CC3C=CC1C3)c1ccccc1CC2] | DHNMINB | 43 |
| 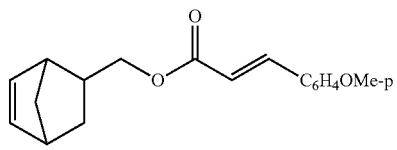 | MeOCinnNB | 44 |
| 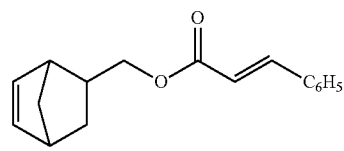 | CinnNB | 45 |
| 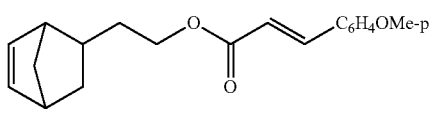 | EtMeOCinnNB | 46 |
| 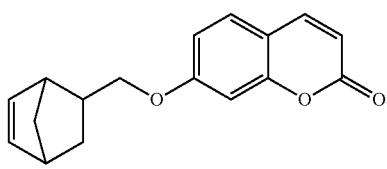 [SMILES: O=c1ccc2ccc(OCC3CC4C=CC3C4)cc2o1] | MeCoumNB | 47 |
| 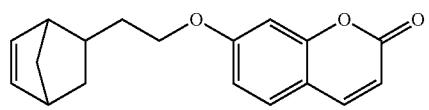 [SMILES: O=c1ccc2ccc(OCCC3CC4C=CC3C4)cc2o1] | EtCoumNB | 48 |

-continued

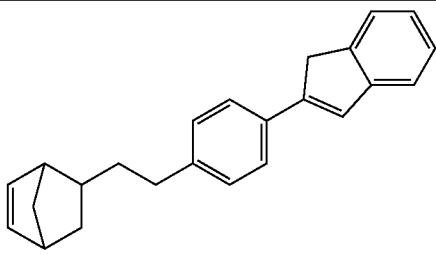

EtPhIndNB 49

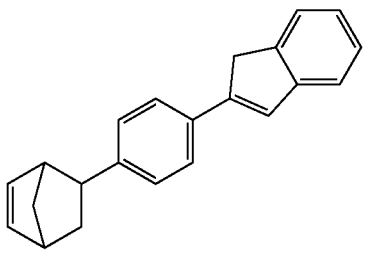 [SMILES: C1=CC2CC1CC2c1ccc(C2=Cc3ccccc3C2)cc1]

PhIndNB 50

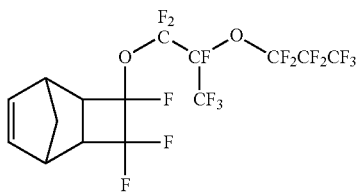

DiOxoTCNB 51

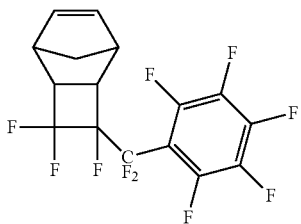 [SMILES: Fc1c(F)c(F)c(C(F)(F)C2(F)C3C4C=CC(C4)C3C2(F)F)c(F)c1F]

PFBTCNB 52

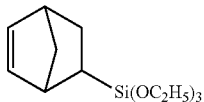

TESNB 53

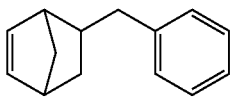 [SMILES: C1=CC2CC1CC2Cc1ccccc1]

PMNB 54 where "Me" means methyl, "Et" means ethyl, "OMe-p" means para-methoxy, "Ph" and "$C_6H_5$" mean phenyl, "$C_6H_4$" means phenylene, "$C_6F_5$" means pentafluorophenyl, "OAc" means acetate, "PFAc" means —OC(O)—$C_7F_{15}$, and for each of the above subformulae having a methylene bridging group, such methylene bridging group is inclusive of a covalent bond or —$(CH_2)_p$— where p is an integer from 1 to 6 wherein the dielectric layer comprises a fluoropolymer.

30. An organic electronic device comprising an interlayer that is in direct contact with a dielectric layer, said interlayer consisting essentially of a polycycloolefinic polymer or a polymer composition consisting essentially of a polycycloolefinic polymer, said polymer having a first type of repeating unit in accordance with formula I:

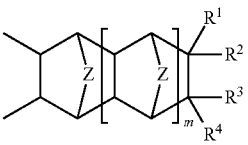

I wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group and wherein the dielectric layer comprises a fluoropolymer.

31. The electronic device of claim 30, which is a field effect transistor (FET), thin film transistor (TFT), integrated circuit (IC) or Radio Frequency Identification (RFID) tag.

32. The electronic device of claim 30, which is a top gate or bottom gate field effect transistor (FET).

* * * * *